US012581777B2

(12) United States Patent
Kang et al.

(10) Patent No.: US 12,581,777 B2
(45) Date of Patent: Mar. 17, 2026

(54) DISPLAY DEVICE

(71) Applicant: Samsung Display Co., LTD., Yongin-si (KR)

(72) Inventors: Hye Lim Kang, Hwaseong-si (KR); Dong Gyun Kim, Seoul (KR); Hoo Keun Park, Yongin-si (KR); Moon Jung An, Hwaseong-si (KR); Chul Jong Yoo, Seongnam-si (KR); Dong Eon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 489 days.

(21) Appl. No.: 17/786,260

(22) PCT Filed: Dec. 15, 2020

(86) PCT No.: PCT/KR2020/018384
§ 371 (c)(1),
(2) Date: Jun. 16, 2022

(87) PCT Pub. No.: WO2021/125757
PCT Pub. Date: Jun. 24, 2021

(65) Prior Publication Data
US 2023/0027490 A1    Jan. 26, 2023

(30) Foreign Application Priority Data

Dec. 19, 2019    (KR) ........................ 10-2019-0170377

(51) Int. Cl.
*H10H 20/831*    (2025.01)
*H10H 20/857*    (2025.01)
*H10H 29/14*    (2025.01)

(52) U.S. Cl.
CPC ...... *H10H 20/8312* (2025.01); *H10H 20/857* (2025.01); *H10H 29/142* (2025.01)

(58) Field of Classification Search
CPC ... H01L 27/156; H01L 25/0753; H01L 25/16; H01L 25/157; H01L 25/167; H01L 24/95;
(Continued)

(56) References Cited

U.S. PATENT DOCUMENTS

| | | | |
|---|---|---|---|
| 5,102,824 A | 4/1992 | Neugebauer et al. | |
| 8,044,415 B2 * | 10/2011 | Messere ............ | B32B 17/10036 |
| | | | 362/249.02 |

(Continued)

FOREIGN PATENT DOCUMENTS

| | | |
|---|---|---|
| KR | 10-2012-0057298 | 6/2012 |
| KR | 10-2012-0122160 | 11/2012 |

(Continued)

OTHER PUBLICATIONS

International Search Report, with English translation, corresponding to International Application No. PCT/KR2020/018384 dated Mar. 22, 2021.

(Continued)

*Primary Examiner* — Natalia A Gondarenko
(74) *Attorney, Agent, or Firm* — Womble Bond Dickinson (US) LLP

(57) ABSTRACT

A display device includes a first electrode, a second electrode disposed spaced apart from the first electrode in a first direction, and an element part disposed between the first electrode and the second electrode. The element part includes light-emitting elements that have a shape extending in one direction and are arranged spaced apart from each other in a second direction perpendicular to the first direction; and a binder surrounding each of the light-emitting elements and fixing the light-emitting elements. The one direction in which the light-emitting elements extend is parallel to the first direction.

19 Claims, 42 Drawing Sheets

110: 111, 112
120: 121, 122
140: 141, 142, 143, 144
150: 151, 152

(58) Field of Classification Search

CPC ............. H01L 21/768; H01L 21/76895; H01L 21/6835; H01L 33/005; H01L 33/02; H01L 33/20; H01L 33/52; H01L 33/62; H01L 33/382; H01L 33/08; H01L 33/0045; H01L 33/0079; H01L 33/0093; H01L 33/0095; H01L 33/14; H01L 33/387; H01L 33/32; H01L 33/36; H01L 33/42; H01L 33/44; H01L 2221/68354; H01L 2221/68363; H01L 2933/0025; H01L 2933/0066; H01L 2933/0016; H01L 2224/0344; H01L 2224/16225; H01L 2224/81001; H01L 2224/95; H01L 27/1214; H01L 27/1218; H10H 29/032; H10H 29/034; H10H 29/0362; H10H 29/0363; H10H 29/142; H10H 29/8511; H10H 29/852; H10H 29/8582; H10H 29/8583; H10H 29/24; H10H 29/832; H10H 29/8321; H10H 20/01; H10H 20/011; H10H 20/032; H10H 20/034; H10H 20/0362; H10H 20/0363; H10H 20/819; H10H 20/852; H10H 20/81; H10H 20/813; H10H 20/8132; H10H 20/8133; H10H 20/83; H10H 20/831; H10H 20/8312; H10H 20/8511; H10H 20/857; H10H 20/8582; H10H 20/8583

USPC ............................................. 257/79, 89, 99

See application file for complete search history.

(56) References Cited

U.S. PATENT DOCUMENTS

| | | | | |
|---|---|---|---|---|
| 9,865,572 | B2 * | 1/2018 | Wi | ........................... H01L 24/81 |
| 10,516,081 | B1 * | 12/2019 | Xin | ........................ H01L 33/24 |
| 11,367,823 | B2 | 6/2022 | Kim et al. | |
| 11,811,012 | B2 | 11/2023 | Kim et al. | |
| 2009/0114928 | A1 | 5/2009 | Messere et al. | |
| 2014/0367705 | A1 * | 12/2014 | Bibl | ........................ H01L 24/95 |
| | | | | 438/27 |
| 2015/0115293 | A1 * | 4/2015 | Wu | ........................ H01L 27/156 |
| | | | | 438/28 |
| 2015/0249069 | A1 * | 9/2015 | Yoshida | .............. H01L 25/0753 |
| | | | | 257/89 |
| 2018/0012876 | A1 * | 1/2018 | Kim | ........................ H01L 27/124 |
| 2018/0019369 | A1 * | 1/2018 | Cho | ........................ H05K 1/181 |
| 2018/0158987 | A1 | 6/2018 | Lee et al. | |
| 2019/0115513 | A1 | 4/2019 | Im et al. | |
| 2019/0319168 | A1 | 10/2019 | Kim | |
| 2024/0063359 | A1 | 2/2024 | Kim et al. | |

FOREIGN PATENT DOCUMENTS

| | | |
|---|---|---|
| KR | 10-2012-0122645 | 11/2012 |
| KR | 10-1672781 | 11/2016 |
| KR | 10-2017-0102129 | 9/2017 |
| KR | 10-2017-0106566 | 9/2017 |
| KR | 10-1806339 | 12/2017 |
| KR | 10-2018-0071465 | 6/2018 |
| KR | 10-2018-0131329 | 12/2018 |
| KR | 10-2019-0124359 | 11/2019 |

OTHER PUBLICATIONS

Written Opinion, with English translation, corresponding to International Application No. PCT/KR2020/018384, dated Mar. 22, 2021.

* cited by examiner

10

NDA

PX PX PX
PX PX PX
PX PX PX

DA

DR2

DR1

EMA: EMA1, EMA2, EMA3

110: 111, 112
120: 121, 122
140: 141, 142, 143, 144
150: 151, 152

DISPLAY DEVICE

CROSS-REFERENCE TO RELATED APPLICATION

This application is a national entry of International Application No. PCT/KR2020/018384, filed on Dec. 15, 2020, which claims under 35 U.S.C. §§ 119(a) and 365(b) priority to and benefits of Korean Patent Application No. 10-2019-0170377, filed on Dec. 19, 2019, in the Korean Intellectual Property Office (KIPO), the entire contents of which are incorporated herein by reference.

BACKGROUND

1. Technical Field

The disclosure relates to a display device.

2. Description of Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

SUMMARY

Aspects of the disclosure provide a display device including light-emitting elements and a binder configured to fix the light-emitting elements.

It should be noted that aspects of the disclosure are not limited thereto and other aspects, which are not mentioned herein, will be apparent to those of ordinary skill in the art from the following description.

According to an embodiment of the disclosure, a display device comprises a first electrode, a second electrode spaced apart from the first electrode in a first direction, and an element part disposed between the first electrode and the second electrode. The element part includes light-emitting elements each having a shape extending in one direction and spaced apart from each other in a second direction perpendicular to the first direction, and a binder surrounding each of the light-emitting elements and fixing the light-emitting elements. The one direction in which each of the light-emitting elements extends is parallel to the first direction.

The binder may expose at least one end portion of end portions of each of the light-emitting elements.

A first end portion of each of the light-emitting elements may be electrically connected to the first electrode, and a second end portion of each of the light-emitting elements opposite to the first end portion may be electrically connected to the second electrode.

Each of the light-emitting elements may include a first semiconductor layer, a second semiconductor layer, and an active layer disposed between the first semiconductor layer and the second semiconductor layer, and in each of the light-emitting elements, the first semiconductor layer, the active layer, and the second semiconductor layer may be sequentially disposed in the first direction In each of the light-emitting elements, light generated in the active layer may be emitted from the first end portion and the second end portion.

The binder partially may surround an outer surface of each of the light-emitting elements, and entirely surrounds an outer surface of the active layer.

Separation distances between the light-emitting elements in the second direction may be equal to each other.

The first electrode may be formed to extend in the second direction.

According to an embodiment of the disclosure, a display device comprises a first electrode extending in a first direction, an element part disposed on the first electrode and extending in the first direction, a first insulating layer disposed on the first electrode and the element part, and a second electrode disposed on the first insulating layer and facing the first electrode in a second direction perpendicular to the first direction, wherein the element part may include light-emitting elements each having a shape extending in the second direction and disposed on the first electrode and a binder fixing the light-emitting elements.

The light-emitting elements may be spaced apart from each other in the first direction, and separation distances between the light-emitting elements in the first direction may be equal to each other.

The binder may expose at least one end portion of end portions of each of the light-emitting elements.

The binder may be spaced apart from the first electrode in the second direction.

The first insulating layer may contact the binder and a partial area of each of the light-emitting elements exposed by the binder.

The binder further may include a wavelength conversion material.

A first end portion of each of the light-emitting elements may directly contact the first electrode, and a second end portion of the light-emitting elements opposite to the first end portion may directly contact the second electrode.

The first electrode may include a first electrode base layer, and a first electrode upper layer disposed on the first electrode base layer, and the first electrode base layer may reflect light emitted from each of the light-emitting elements.

According to an embodiment of the disclosure, a display device comprises a first electrode disposed on a substrate, a second electrode disposed on the substrate and spaced apart from the first electrode in a direction, and an element part disposed on the substrate between the first electrode and the second electrode. The element part includes light-emitting elements each having a shape extending in the direction and disposed on the substrate, and a binder surrounding each of the light-emitting elements and fixing the light-emitting elements. The binder includes a first area disposed on a first side in which the substrate is disposed, and a second area disposed on a second side opposite the first side.

The light-emitting elements may protrude to the first area of the binder.

A first end portion of each of the light-emitting elements may be electrically connected to the first electrode, and a second end portion opposite to the first end portion may be electrically connected to the second electrode.

The display device may further comprise a first contact electrode disposed on the first electrode, and a second contact electrode disposed on the second electrode. The second area of the binder may expose end portions of the light-emitting elements, the first contact electrode may contact the first end portion, and the second contact electrode may contact the second end portion.

The details of other embodiments are included in the detailed description and the accompanying drawings.

In a display device according to an embodiment, a binder of an element part can be formed using a semiconductor protective layer including an insulating material. A semiconductor layer of each light-emitting element can be prevented from being damaged by integrating and separating the light-emitting elements using the binder instead of separating the light-emitting elements individually.

In addition, in a display device according to an embodiment, an ink forming process can be omitted by disposing light-emitting elements fixed by a binder, so that efficiency of the manufacturing process can be increased.

The effects according to the embodiments are not limited by the contents described above, and other various effects are included in this disclosure.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. It will be understood that the terms "contact," "connected to," and "coupled to" may include a physical and/or electrical contact, connection, or coupling.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the accompanying drawings.

Figure 1:
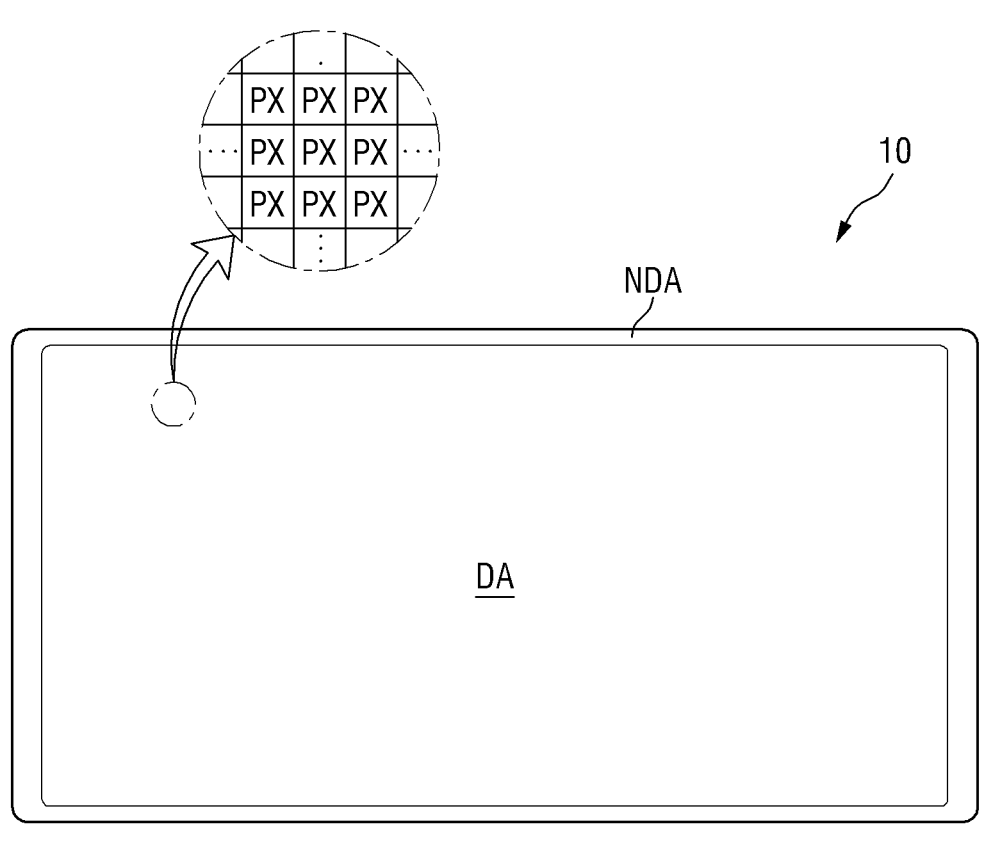
FIG. 1 is a schematic plan view of a display device according to an embodiment.
Figure 1:
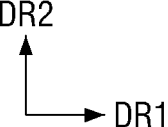

FIG. 1 is a schematic plan view of a display device according to an embodiment.

Referring to FIG. 1, a display device 10 displays a video or a still image. The display device 10 may refer to all electronic devices that provide a display screen. For example, the display device 10 may include a television, a notebook, a monitor, an advertising board, an Internet of Things (IoT) device, a mobile phone, a smart phone, a tablet personal computer (PC), an electronic watch, a smart watch, a watch phone, a head mounted display, a mobile communication terminal, an electronic organizer, an electronic book reader, a portable multimedia player (PMP), a navigation device, a game machine, a digital camera, a camcorder, and the like, which provide display screens.

The display device 10 includes a display panel that provides a display screen.

Examples of the display panel may include a light-emitting diode (LED) display panel, an organic light-emitting display panel, a quantum dot light-emitting display panel, a plasma display panel, a field emission display panel, and the like. Hereinafter, although an example in which the LED display panel as an example of the display panel is applied is described, the disclosure is not limited thereto, and in case that the same technical spirit is applicable, it may be applied to other display panels.

The display device 10 may have a rectangular shape in a plan view (for example, when viewed in a plan view). However, the disclosure is not limited thereto, and the shape of the display device 10 may be variously modified. For example, the display device 10 may have shapes such as a rectangular shape of which lateral sides are long, a rectangular shape of which longitudinal sides are long, a square shape, a quadrangular shape of which corner portions (vertexes) are round, other polygonal shapes, a circular shape, and the like.

The display device 10 may include a display area DA and a non-display area NDA.

The display area DA is an area in which an image may be displayed, and the non-display area NDA is an area in which an image is not displayed. The display area DA may refer to an active area and the non-display area NDA may refer to an inactive area.

The display area DA may have a shape similar to the overall shape of the display device 10. The display area DA may generally occupy a center of the display device 10. In an embodiment, in case that the display device 10 has a rectangular shape, which is longer in a first direction DR1 than in a second direction DR2 in a plan view, the display area DA may have a rectangular shape that is longer in the first direction DR1 than in the second direction DR2 in a plan view. However, the disclosure is not limited thereto, and the shape of the display area DA may be variously modified.

The display area DA may include pixels PX. The pixels PX may be disposed in a matrix direction. A shape of each of the pixels PX may be a rectangular shape or a square shape in a plan view, but the disclosure is not limited thereto, and the shape may be a rhombus shape of which each side is inclined with respect to a direction. The pixels PX may be alternately arranged in a stripe type or a PenTile® type. In addition, each of the pixels PX may include one or more light-emitting elements (or unit light-emitting elements, hereinafter "unit light-emitting elements") 300 that emit light in a specific wavelength range, thereby displaying a specific color.

The non-display area NDA may be disposed around the display area DA. The non-display area NDA may completely or partially surround the display area DA. The display area DA has a rectangular shape, and the non-display area NDA may be disposed adjacent to four sides of the display area DA. The non-display area NDA may form a bezel of the display device 10.

Figure 2:
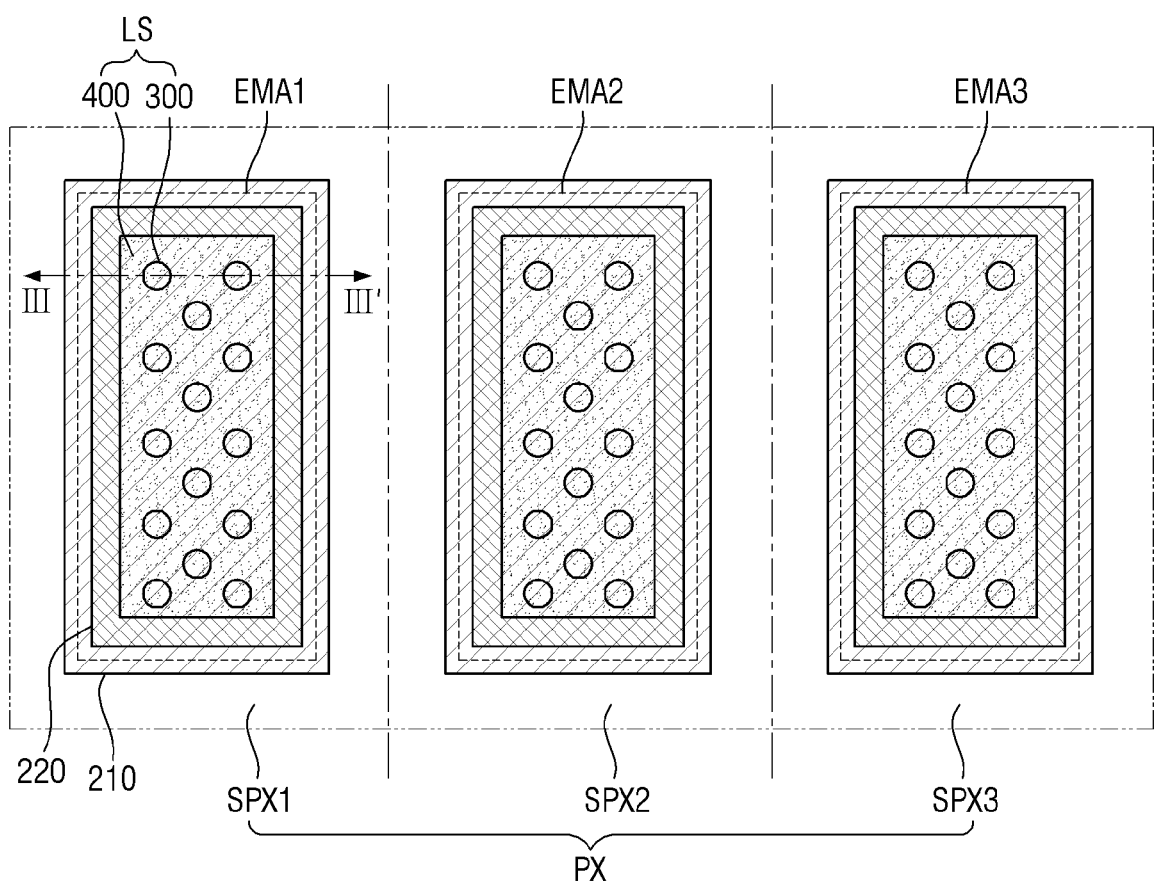
FIG. 2 is a schematic plan view illustrating a pixel of the display device according to an embodiment.
Figure 2:
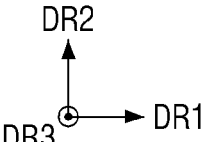
Figure 3:
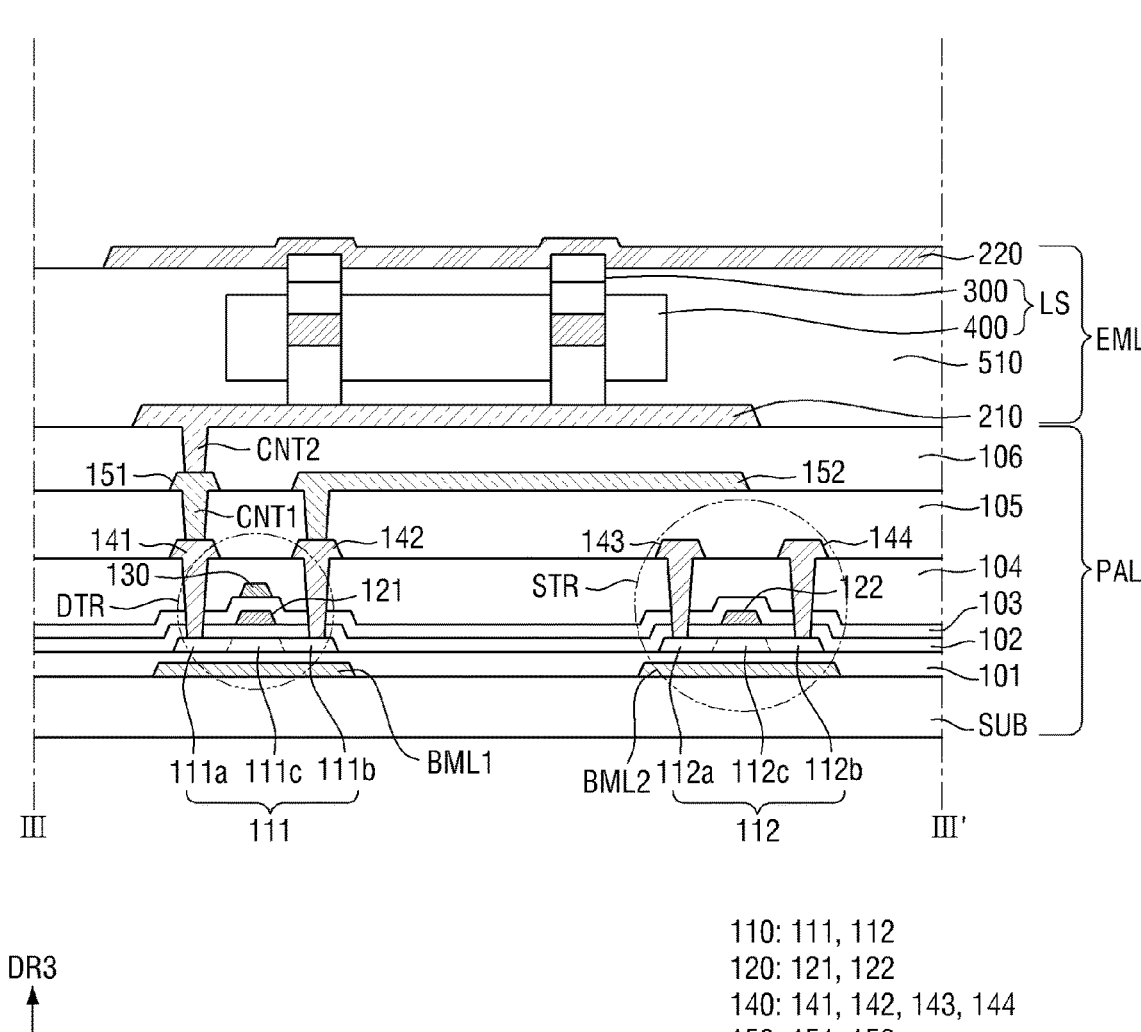
FIG. 3 is a schematic cross-sectional view taken along line III-III' of FIG. 2.
Figure 3:
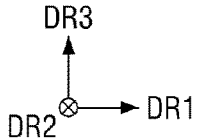
Figure 4:
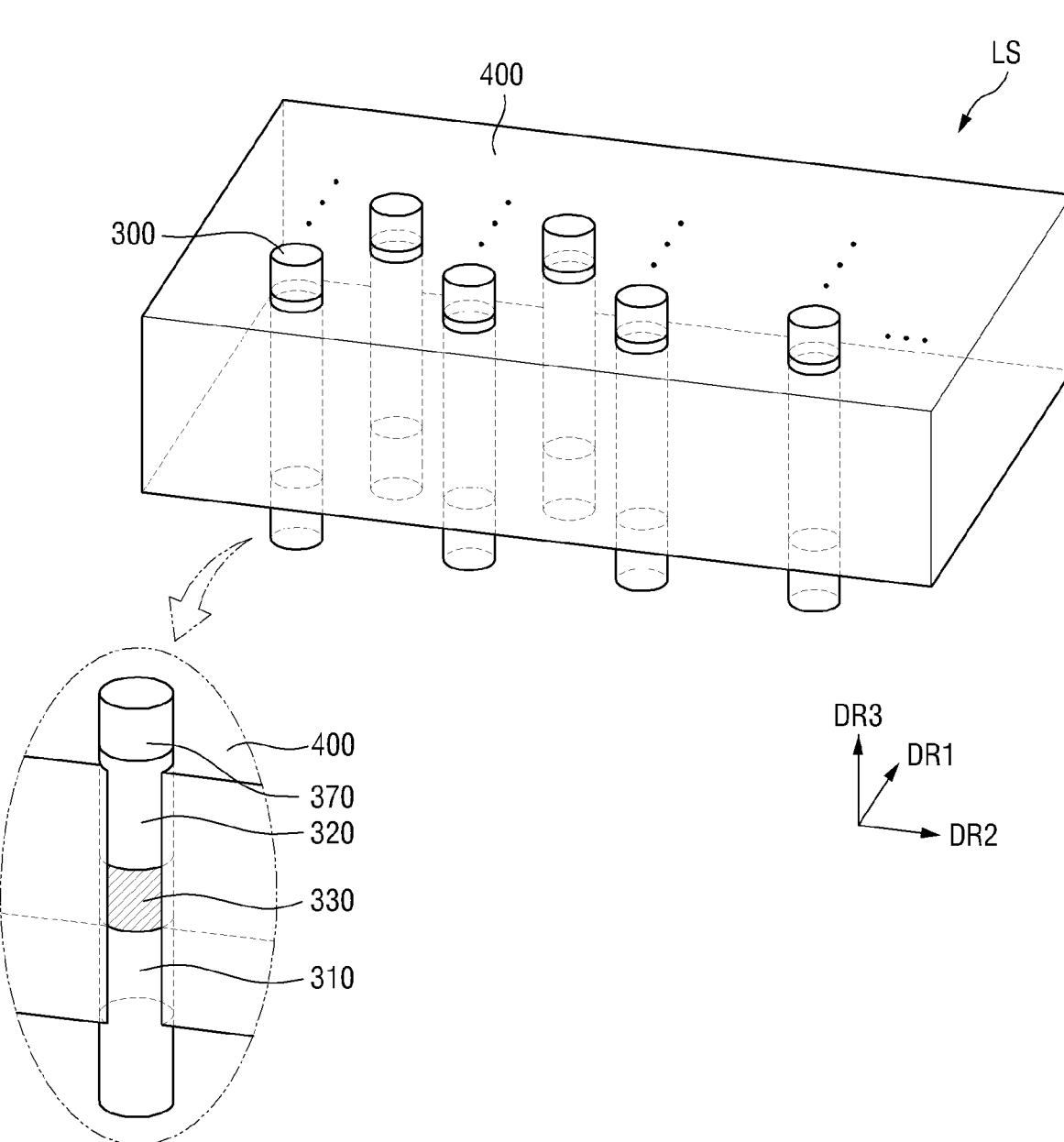
FIG. 4 is a schematic perspective view illustrating an element part according to an embodiment.

FIG. 2 is a schematic plan view illustrating a pixel of the display device according to an embodiment. FIG. 3 is a schematic cross-sectional view taken along line III-III' of FIG. 2. FIG. 4 is a schematic perspective view illustrating an element part (or element unit) according to an embodiment.

Referring to FIGS. 1 and 2, each of the pixels PX of the display device 10 may include sub-pixels SPX1, SPX2, and SPX3 (collectively referred to as "sub-pixels SPX"). Each pixel PX may include a first sub-pixel SPX1 that emits light of a first color, a second sub-pixel SPX2 that emits light of a second color, and a third sub-pixel SPX3 that emits light of a third color. The first sub-pixel SPX1, the second sub-pixel SPX2, and the third sub-pixel SPX3 may be provided for each pixel PX. In an embodiment, the light of the first color may be red light having a peak wavelength ranging from about 610 nm to about 650 nm, the light of the second color may be green light having a peak wavelength ranging from about 510 nm to about 550 nm, and the light of the third color may be blue light having a peak wavelength ranging from about 440 nm to about 480 nm. However, the disclosure is not limited thereto, and each sub-pixel SPX may emit light having a same color. FIG. 2 illustrates that each pixel PX includes three sub-pixels SPX1, SPX2, and SPX3, but the disclosure is not limited thereto, and may include a larger number of sub-pixels SPX or a smaller number of sub-pixels SPX.

Each of the sub-pixels SPX of the display device 10 may include a light-emitting area EMA. The light-emitting area EMA may be defined as an area in which the unit light-emitting elements 300 to be described below are disposed and light is emitted.

The first sub-pixel SPX1 may include a first light-emitting area EMA1, the second sub-pixel SPX2 may include a second light-emitting area EMA2, and the third sub-pixel SPX3 may include a third light-emitting area EMA3. The unit light-emitting element 300 may include an active layer, and the active layer of the unit light-emitting element 300 may emit light in a specific wavelength range without directionality. The light emitted from the active layer of the unit light-emitting element 300 may be emitted in directions toward side surfaces of the unit light-emitting element 300 as well as in directions toward end portions thereof. The light-emitting area EMA may include an area in which the unit light-emitting element 300 is disposed, and may include an area which is adjacent to the unit light-emitting element 300 and through which the light emitted from the unit light-emitting element 300 is emitted. The light-emitting area EMA may further include an area in which the light emitted from the unit light-emitting element 300 is reflected or refracted due to another member to be emitted. Unit light-emitting elements 300 may be disposed in each sub-pixel SPX, and the area in which the unit light-emitting elements 300 are disposed and an area adjacent to the area may form the light-emitting area EMA.

Each of the sub-pixels SPX of the display device 10 may include a non-light-emitting area defined as an area other than the light-emitting area EMA. The non-light-emitting area may be an area in which the unit light-emitting element 300 is not disposed and which the light emitted from the unit light-emitting element 300 does not reach so that light is not emitted.

Referring to FIG. 2, each sub-pixel SPX of the display device 10 includes an element part LS including the unit light-emitting element 300 and a binder 400, and electrodes 210 and 220. The electrodes 210 and 220 may include a first electrode 210 and a second electrode 220. The electrodes 210 and 220 and the element part LS may be disposed in the light-emitting area EMA of each sub-pixel SPX. However, the disclosure is not limited thereto, and at least some of the element part LS and the electrodes 210 and 220 may be disposed in the light-emitting area EMA, and may extend outward to be disposed in the non-light-emitting area, which is an area adjacent to the light-emitting area EMA.

The first electrode 210 may be a pixel electrode separated for each sub-pixel PXn, and the second electrode 220 may be a common electrode connected in common along each sub-pixel PXn. One of the first electrode 210 and the second electrode 220 may be an anode of the light-emitting element 300, and the other thereof may be a cathode of the light-emitting element 300. However, the disclosure is not limited thereto, and the reverse of the above description may be possible.

The first electrode 210 may be disposed to correspond to each sub-pixel SPX. The first electrode 210 may be patterned to be disposed in the light-emitting area EMA of each sub-pixel SPX. The first electrode 210 disposed in each sub-pixel SPX may be disposed to be spaced apart from the sub-pixel SPX adjacent in the first direction DR1 or the second direction DR2. Accordingly, the first electrode 210 may be disposed in an island pattern on the entire surface of the display device 10.

The first electrode 210 may have an angular shape in a plan view, in which a side extends in the first direction DR1 and another side extends in the second direction DR2 in a plan view. However, the disclosure is not limited thereto, and the first electrode 210 may have a shape inclined in the first direction DR1 or a circular shape with a curved outer surface. In addition, the size of the first electrode 210 is not particularly limited, but may vary depending on the area of each sub-pixel SPX of the display device 10. As shown in the drawing, the first electrode 210 may be disposed in the sub-pixel SPX and formed to be smaller than the sub-pixel SPX, so that the first electrode 210 may be disposed in a state of being spaced apart from a boundary of another adjacent sub-pixel SPX.

The second electrode 220 may be disposed above the first electrode 210 and may be disposed to correspond to each sub-pixel SPX. In an embodiment, the second electrode 220 may be patterned to be disposed in the light-emitting area EMA of each sub-pixel SPX. The second electrode 220 disposed in each sub-pixel SPX may be disposed to be spaced apart from the sub-pixel SPX adjacent in the first direction DR1 or the second direction DR2. Accordingly, the second electrode 210 may be disposed in an island pattern on the entire surface of the display device 10. However, the disclosure is not limited thereto, and the second electrode 220 disposed on a pixel PX may be disposed in two or more sub-pixels SPX, and the second electrodes 220 disposed in the first to third sub-pixels SPX1, SPX2, and SPX3 included in the pixel PX may extend to each other. A description thereof will be provided below with reference to other drawings.

The second electrode 220 may have an angular shape in a plan view, in which a side extends in the first direction DR1 and another side extends in the second direction DR2 in a plan view. However, the disclosure is not limited thereto, and the second electrode 220 may have a shape inclined in the first direction DR1 or a circular shape with a curved outer surface. In addition, the size of the second electrode 220 is not particularly limited, but may vary depending on an area of each sub-pixel SPX of the display device 10. As shown in the drawing, the second electrode 220 may be disposed in the sub-pixel SPX and formed to be smaller than the sub-pixel SPX, so that the second electrode 220 may be disposed in a state of being spaced apart from a boundary of another adjacent sub-pixel SPX. Accordingly, each of the patterned second electrodes 220 may be disposed in each sub-pixel SPX, and the unit light-emitting elements 300 disposed in sub-pixels SPX included in a pixel PX may be electrically connected to each of the second electrodes 220 disposed to be spaced apart from each other.

The second electrode 220 and the first electrode 210 may be disposed to at least partially overlap each other in a third direction DR3. The second electrode 220 and the first electrode 210 may have different widths or areas. In an embodiment, the second electrode 220 may be formed to have a larger area than the first electrode 210. That is, the width of the second electrode 220 measured in a direction, for example, the first direction DR1 or the second direction DR2, may be greater than the width of the first electrode 210 measured in the first direction DR1 or the second direction DR2. However, the disclosure is not limited thereto, and the second electrode 220 may have a shape having a smaller width than the first electrode 210 and extending in a direction. In some embodiments, a second electrode 220 may be disposed in two or more sub-pixels SPX, and the unit light-emitting elements 300 disposed in the sub-pixels SPX included in a pixel PX may be electrically connected to a same second electrode 220. A description thereof will be provided below with reference to other drawings.

A pixel PX may include element parts LS. Each of the element parts LS includes unit light-emitting elements 300, and the binder 400 through which each unit light-emitting element 300 passes in the third direction DR3, and the binder 400 fixes the unit light-emitting elements 300.

The element part LS included in a pixel PX may be disposed to correspond to each sub-pixel SPX. The element part LS disposed in each sub-pixel SPX may be disposed in the light-emitting area EMA. Although FIG. 2 illustrates that an element part LS is disposed in a sub-pixel SPX, the disclosure is not limited thereto. Elements parts LS may be disposed in a sub-pixel SPX.

The element part LS may have an angular shape in a plan view, in which a side extends in the first direction DR1 and another side extends in the second direction DR2 in a plan view. The element part LS may have a shape that is substantially similar to the planar shape of the first electrode 210. A planar shape of the element part LS may be substantially the same as a shape of the binder 400 that fixes the unit light-emitting elements 300 included in an element part LS. The element part LS and the first and second electrodes 210 and 220 may be disposed to at least partially overlap each other in the third direction DR3. Since the element part LS is disposed to overlap the first and second electrodes 210 and 220 in the third direction DR3, an end portion of the unit light-emitting element 300 and another end portion thereof, which is opposite to the end portion, may be electrically connected to the first electrode 210 and the second electrode 220, respectively, as will be described below.

Referring to FIGS. 2 and 4, the unit light-emitting elements 300 included in the element part LS may be arranged in a matrix form. The unit light-emitting elements 300 may be spaced apart from each other in the first direction DR1 and the second direction DR2, and may be disposed at an interval in a plan view. The unit light-emitting elements 300 may be arranged in a matrix form, and may be disposed to be staggered for adjacent rows or columns. For example, in odd columns, each unit light-emitting element 300 may be disposed in odd rows in the second direction DR2, and in even columns, each unit light-emitting element 300 may be disposed in even rows in the second direction DR2. Even in this case, the arrangement of the unit light-emitting elements 300 disposed in a same row or column may extend in a straight line shape. FIG. 2 illustrates that two unit light-emitting elements 300 are disposed to be spaced apart from each other in odd rows and a unit light-emitting element 300 is disposed in the even rows, but the number and/or arrangement of the unit light-emitting elements 300 are not limited thereto.

In the unit light-emitting element 300 arranged to extend in a direction, a separation distance between the unit light-emitting element 300 and another unit light-emitting element 300 disposed adjacent in the first direction DR1 and a separation distance between the light-emitting element 300 and still another unit light-emitting element 300 disposed adjacent in the second direction DR2 may be the same as shown in FIG. 2. However, the disclosure is not limited thereto, and the separation distance between the unit light-emitting elements 300 adjacent in the first direction DR1 and the separation distance between the unit light-emitting elements 300 adjacent in the second direction DR2 may be different from each other. However, even in this case, separation distances between adjacent unit light-emitting elements 300, which are arranged extending in a direction in a straight line shape, may be the same. Similarly, separation distances between adjacent unit light-emitting elements 300, which are arranged extending in the second direction DR2 in a straight line shape, may be the same.

The binder 400 may be disposed to surround an outer surface of each of the unit light-emitting elements 300 included in the element part LS. The binder 400 is formed to surround at least a portion of the outer surface of the unit light-emitting element 300. The binder 400 may be formed such that the unit light-emitting elements 300 are disposed in the binder 400.

Referring to FIG. 3, the display device 10 according to an embodiment includes a circuit element layer PAL and a display element layer EML. The circuit element layer PAL may include circuit elements and lines for driving the unit light-emitting element 300, such as a driving transistor DTR, a switching transistor STR, and a first power line 152, and the display element layer EML may include the electrodes 210 and 220 and the unit light-emitting elements 300.

Specifically, the circuit element layer PAL of the display device 10 may include a substrate SUB, a semiconductor layer disposed on the substrate SUB, conductive layers, and insulating layers, and the display element layer EML may include the first electrode 210, the second electrode 220, and the element part LS including the unit light-emitting element 300, which are disposed in each sub-pixel SPX. End portions of the unit light-emitting element 300 may be electrically connected to the first electrode 210 and the second electrode 220, respectively, and receive an electrical signal from the first electrode 210 and the second electrode 220 to emit light in a specific wavelength range.

Hereinafter, the circuit element layer PAL of the display device 10 will be described in detail with reference to FIG. 3.

The circuit element layer PAL includes a semiconductor layer 110, conductive layers 120, 130, 140, and 150, and insulating layers 101, 102, 103, 104, 105, and 106 disposed on the substrate SUB. The conductive layers may include a gate conductive layer 120, a first conductive layer 130, a second conductive layer 140, and a third conductive layer 150. The insulating layers may include a buffer layer 101, a gate insulating layer 102, a protective layer 103, a first interlayer insulating layer 104, a second interlayer insulating layer 105, and a planarization layer 106. The circuit element layer PAL may further include light-blocking layers BML1 and BML2.

The substrate SUB may be an insulating substrate. The substrate SUB may be made of an insulating material such as glass, quartz, or a polymer resin. In addition, the substrate SUB may be a rigid substrate but may also be a flexible substrate that is bendable, foldable, rollable, or the like.

The light-blocking layers BML1 and BML2 may be disposed on the substrate SUB. The light-blocking layers BML1 and BML2 may include a first light-blocking layer BML1 and a second light-blocking layer BML2. The first light-blocking layer BML1 and the second light-blocking layer BML2 may be disposed on the substrate SUB, and may be disposed to be spaced apart from each other. The light-blocking layers BML1 and BML2 may include a light-blocking material and may serve to prevent external light from being incident on the semiconductor layer 110 to be described below. The first and second light-blocking layers BML1 and BML2 may be disposed below the semiconductor layer 110 to cover at least a channel area of the semiconductor layer 110 thereabove, and furthermore, may be disposed to cover the entire semiconductor layer 110. As an example, the first and second light-blocking layers BML1 and BML2 may be formed of an opaque metal material. However, the disclosure is not limited thereto, and the light-blocking layers BML1 and BML2 may be omitted.

The buffer layer 101 may be entirely disposed on the light-blocking layers BML1 and BML2 and the substrate SUB exposed by the light-blocking layers BML1 and BML2. The buffer layer 101 may be formed on the substrate SUB to protect transistors DTR and STR of the pixel PX from moisture permeating through the substrate SUB, and may perform a surface planarization function. The buffer layer 101 may be formed as inorganic layers that are alternately stacked. For example, the buffer layer 101 may be formed as multiple layers in which inorganic layers including at least one of silicon oxide ($SiO_x$), silicon nitride ($SiN_x$), and silicon oxynitride ($SiON$) are alternately stacked.

The semiconductor layer 110 is disposed on the buffer layer 101. The semiconductor layer 110 may include a first active layer (or first active material layer) 111 and a second active layer (or second active material layer) 112. The first active layer 111 may be an active layer of the driving transistor DTR, and the second active layer 112 may be an active layer of the switching transistor STR.

In an embodiment, the semiconductor layer 110 may include polycrystalline silicon, single-crystalline silicon, an oxide semiconductor, and the like. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced lateral crystallization (MILC) method, and a sequential lateral solidification (SLS) method, and the like, but the disclosure is not limited thereto. In case that the semiconductor layer 110 includes polycrystalline silicon, the first active layer 111 may include a first doped area 111$a$, a second doped area 111$b$, and a first channel area 111$c$. The first channel area 111$c$ may be disposed between the first doped area 111$a$ and the second doped area 111$b$. The second active layer 112 may include a third doped area 112$a$, a fourth doped area 112$b$, and a second channel area 112$c$. The second channel area 112$c$ may be disposed between the third doped area 112$a$ and the fourth doped area 112$b$. The first doped area 111$a$, the second doped area 111$b$, the third doped area 112$a$, and the fourth doped area 112$b$ may be areas in which partial areas of the first active layer 111 and the second active layer 112 are doped with impurities, and may be source/drain areas of the first active layer 111 and the second active layer 112.

In an embodiment, the first active layer 111 and the second active layer 112 may include an oxide semiconductor. In this case, the doped area of each of the first active layer 111 and the second active layer 112 may be an area that has become conductive. The oxide semiconductor may be an oxide semiconductor including indium (In). In some embodiments, the oxide semiconductor may include indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IG-ZTO), or the like. However, the disclosure is not limited thereto.

The gate insulating layer 102 is disposed on the semiconductor layer 110 and the buffer layer 101 exposed by the semiconductor layer 110. The gate insulating layer 102 may be entirely disposed on the semiconductor layer 110 and the buffer layer 101. The gate insulating layer 102 may serve as gate insulating films of the driving transistor DTR and the switching transistor STR. The gate insulating layer 102 may be formed as an inorganic layer including an inorganic material such as silicon oxide (SiOx), silicon nitride (SiNx), and silicon oxynitride (SiON), or in a stacked structure thereof.

The gate conductive layer 120 is disposed on the gate insulating layer 102. The gate conductive layer 120 may include a first gate electrode 121 and a second gate electrode 122. The first gate electrode 121 may be a gate electrode of the driving transistor DTR, and the second gate electrode 122 may be a gate electrode of the switching transistor STR.

The first gate electrode 121 may be disposed to overlap at least a partial area of the first active layer 111 of the driving transistor DTR. Specifically, the first gate electrode 121 may be disposed to overlap the first channel area 111$c$ of the first active layer 111 in a thickness direction.

The second gate electrode 122 may be disposed to overlap at least a partial area of the second active layer 112 of the switching transistor STR. Specifically, the second gate electrode 122 may be disposed to overlap the second channel area 112$c$ of the second active layer 112 in the thickness direction.

The gate conductive layer 120 may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The protective layer 103 is disposed on the gate conductive layer 120. The protective layer 103 may be disposed to cover the gate conductive layer 120 and may perform a function of protecting the gate conductive layer 120. The protective layer 103 may be formed as an inorganic layer including an inorganic material such as silicon oxide (SiOx), silicon nitride (SiNx), and silicon oxynitride (SiON), or in a stacked structure thereof.

The first conductive layer 130 is disposed on the protective layer 103. At least a partial area of the first conductive layer 130 may be disposed to overlap the first gate electrode 121 in the thickness direction. A storage capacitor may be formed between the first conductive layer 130 and the first gate electrode 121 disposed below the first conductive layer 130 with the protective layer 103 therebetween. The first conductive layer may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The first interlayer insulating layer 104 is disposed on the first conductive layer 130 and the protective layer 103 exposed by the first conductive layer 130. The first interlayer insulating layer 104 may serve as an insulation layer between the first conductive layer 130 and other layers disposed thereon. The first interlayer insulating layer 104 may be formed as an inorganic layer including an inorganic material such as silicon oxide (SiOx), silicon nitride (SiNx), and silicon oxynitride (SiON), or in a stacked structure thereof.

The second conductive layer 140 is disposed on the first interlayer insulating layer 104. The second conductive layer 140 may include a first source/drain electrode 141 and a second source/drain electrode 142 of the driving transistor DTR, and a first source/drain electrode 143 and a second source/drain electrode 144 of the switching transistor STR.

The first source/drain electrode 141 and the second source/drain electrode 142 of the driving transistor DTR may be connected to the first doped area 111$a$ and the second doped area 111$b$ of the first active layer 111, respectively, through contact holes passing through the first interlayer insulating layer 104, the protective layer 103, and the gate insulating layer 102. Similarly, the first source/drain electrode 143 and the second source/drain electrode 144 of the switching transistor STR may be connected to the third doped area 112$a$ and the fourth doped area 112$b$ of the second active layer 112, respectively, through contact holes passing through the first interlayer insulating layer 104, the protective layer 103, and the gate insulating layer 102.

In the driving transistor DTR and the switching transistor STR, each of the first source/drain electrodes 141 and 143 may be a source electrode, and each of the second source/drain electrodes 142 and 144 may be a drain electrode, but the disclosure is not limited thereto, and the reverse of the above description may be possible.

The second conductive layer 140 may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The second interlayer insulating layer 105 may be disposed on the second conductive layer 140 and the first interlayer insulating layer 104 exposed by the second conductive layer 140. The second interlayer insulating layer 105 may be entirely disposed on the first interlayer insulating layer 104 while covering the second conductive layer 140 and may sever to protect the second conductive layer 140. The second interlayer insulating layer 105 may be formed as an inorganic layer including an inorganic material such as silicon oxide (SiOx), silicon nitride (SiNx), and silicon oxynitride (SiON), or in a stacked structure thereof.

The third conductive layer 150 is disposed on the second interlayer insulating layer 105. The third conductive layer 150 may include a connection pattern 151 and the first power line 152. A high potential voltage (a first power voltage) supplied to the driving transistor DTR may be applied to the first power line 152.

The connection pattern 151 may be electrically connected to the first source/drain electrode 141 of the driving transistor DTR through a contact hole CNT1 formed in the second interlayer insulating layer 105. The connection pattern 151 may be interposed between the first electrode 210 of the display element layer EML and the first source/drain electrode 141, which will be described below, to electrically connect the first source/drain electrode 141 and the first electrode 210 to each other.

Specifically, the driving transistor DTR may transmit the first power voltage, applied from the first power line 152, to the first electrode 210 through the first source/drain electrode 141 and the connection pattern 151.

The third conductive layer 150 may be formed as a single layer or a multi-layer that is made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

The planarization layer 106 is disposed on the third conductive layer 150 and the second interlayer insulating layer 105 exposed by the third conductive layer 150. The planarization layer 106 may include an organic insulating material, for example, an organic material such as polyimide (PI), and may perform a surface planarization function.

As the display element layer EML, the first electrode 210, the element part LS including the unit light-emitting elements 300, and the second electrode 220 are disposed on the planarization layer 106. A first insulating layer 510 may be further disposed on the planarization layer 106. However, the disclosure is not limited thereto, and the display element layer EML may further include other members, and thus other members may be further disposed on the planarization layer 106.

Hereinafter, the display element layer EML of the display device 10 will be described in detail with reference to FIGS. 2 to 4.

The first electrode 210 may be disposed on the planarization layer 106. For example, the first electrode 210 may be disposed directly on the planarization layer 106. The first electrode 210 may contact the connection pattern 151 through a contact hole CNT2 that exposes a portion of an upper surface of the connection pattern 151 through the planarization layer 106. The first electrode 210 may be electrically connected to the first source/drain electrode 141 of the driving transistor DTR through the connection pattern 151, and may receive the first power voltage applied through the first power line 152. The first electrode 210 may be electrically connected to different driving transistors DTR disposed in each sub-pixel SPX, and may receive the first power voltage independently from each of the driving transistors DTR.

The element part LS including the unit light-emitting elements 300 may be disposed on the first electrode 210 so that the first electrode 210 may contact at least one end portion of each of the unit light-emitting elements 300. Accordingly, each of the unit light-emitting elements 300 disposed on the first electrode 210 may be electrically connected to the first electrode 210 through an end portion thereof.

The element part LS including the unit light-emitting elements 300 and the binder 400 formed to surround each of the unit light-emitting elements 300 may be disposed between the first electrode 210 and the second electrode 220, and a separation space between the first electrode 210 and the second electrode 220 may be filled with the first insulating layer 510.

The binder 400 may be disposed between the unit light-emitting elements 300 disposed on the first electrode 210 and on an outer side of the unit light-emitting element 300 disposed at an outermost side. The binder 400 may contact at least a portion of a side surface of the unit light-emitting element 300. The binder 400 may be formed on the side surface of the unit light-emitting element 300 so that at least portions of an end portion of the unit light-emitting element 300 and another end portion thereof opposite to the end portion are exposed. The binder 400 may be disposed on the first electrode 210 to overlap the first electrode 210 in the third direction DR3, and may be disposed to be spaced apart from the first electrode 210 in the third direction DR3. In addition, the binder 400 may be disposed to overlap the second electrode 220 in the third direction DR3 and to be spaced apart from the second electrode 220 in the third direction DR3. The binder 400 may include an inorganic insulating material.

The second electrode 220 may be disposed above the first electrode 210. The second electrode 220 may be disposed to be spaced apart from the first electrode 210 in the third direction DR3. The second electrode 220 may be disposed to be spaced apart from the first electrode 210 in the third direction DR3, and may be disposed directly on the first insulating layer 510 disposed therebetween.

The first insulating layer 510 may be entirely disposed on the planarization layer 106. The first insulating layer 510 may be disposed to surround the binder 400 and the outer surface of the unit light-emitting element 300, which is exposed by the binder 400, disposed on the first electrode 210. The outer surface of the unit light-emitting element 300 and an outer surface of the binder 400 may directly contact the first insulating layer 510.

The first insulating layer 510 may be formed to be lower than a height from the planarization layer 106 to an end of the unit light-emitting element 300 so that at least one end portion of the unit light-emitting element 300 is exposed. Accordingly, an end portion of the unit light-emitting element 300 may protrude from an upper surface of the first insulating layer 510, and the outer surface thereof may not directly contact the first insulating layer 510. The outer surface of the protruding portion of the light-emitting element 300 may contact the second electrode 220 disposed on the first insulating layer 510. That is, according to an embodiment, a thickness of the first insulating layer 510 may be less than the sum of a thickness of the first electrode 210 and a height of the unit light-emitting element 300. The first insulating layer 510 may include an inorganic insulating material or an organic insulating material.

The second electrode 220 may be disposed on the first insulating layer 510 and may contact at least one end portion of the unit light-emitting element 300 protruding from the upper surface of the first insulating layer 510. For example, the second electrode 220 may be disposed to surround an end portion of the unit light-emitting element 300. The first electrode 210 may contact an end portion of the unit light-emitting element 300, and the second electrode 220 may contact another end portion of the unit light-emitting element 300, which is opposite to the end portion. Accordingly, each of the unit light-emitting elements 300 may be electrically connected to the second electrode 220 disposed on the unit light-emitting elements 300 through the another end portion thereof.

Although not shown in the drawing, the second electrode 220 may be electrically connected to a second power line. The second electrode 220 may receive a second power voltage applied through the second power line. The second electrode 220 may be electrically connected to a same second power line disposed in the sub-pixels SPX, and may receive a same second power voltage from the second power line. In addition, in some embodiments, in case that a second electrode 220 is disposed over the sub-pixels SPX, the sub-pixels SPX may receive a same electrical signal, which is applied to the second power line, through an integrated second electrode 220.

In an embodiment, the first electrode 210 may be a pixel electrode separated for each sub-pixel PXn, and the second electrode 220 may be a common electrode connected in common along each sub-pixel SPX. One of the first electrode 210 and the second electrode 220 may be an anode of the unit light-emitting element 300, and the other thereof may be a cathode of the unit light-emitting element 300. However, the disclosure is not limited thereto, and the reverse of the above description may be possible.

Each of the electrodes 210 and 220 may include a transparent conductive material. As an example, each of the electrodes 210 and 220 may include materials such as indium tin oxide (ITO), indium zinc oxide (IZO), indium tin-zinc oxide (ITZO), and the like, but the disclosure is not limited thereto. The unit light-emitting element 300 may emit light in directions toward end portions thereof, and may emit light in the third direction DR3 directed to an upper surface of the first electrode 210. In some embodiments, the first electrode 210 may include a conductive material having a high reflectance and thus may reflect light emitted from the unit light-emitting element 300 and traveling toward the upper surface of the first electrode 210. A portion of the light emitted from the unit light-emitting element 300 is transmitted through the second electrode 220 including a transparent material to be emitted from each of the sub-pixels PXn, and another portion of the light emitted from the unit light-emitting element 300 may be reflected by the first electrode 210 including a material having a high reflectance to be emitted from each of the sub-pixels PXn. In an embodiment, the first electrode 210 may include a metal such as silver (Ag), copper (Cu), aluminum (Al), or the like as the material having a high reflectance.

The unit light-emitting elements 300 according to an embodiment may include active layers 330 having different materials to emit light in different wavelength ranges to the outside. The display device 10 may include other types of unit light-emitting elements that emit light in different wavelength ranges. This will be described below with reference to FIG. 22.

The unit light-emitting elements 300 may be disposed to be spaced apart from each other on the first electrode 210. The separation distances between the unit light-emitting elements 300 arranged to extend in a direction in a same row or column may be substantially the same. In addition, the unit light-emitting elements 300 may be disposed to be spaced apart from each other and to be substantially parallel to each other. This may be a structure formed by patterning the unit light-emitting elements 300 at regular intervals through an etching process and fixing the unit light-emitting elements 300 in the binder 400 by using a material included in the binder 400, during a manufacturing process of the element part LS.

The unit light-emitting element 300 may include semiconductor layers 310 and 320 and an active layer 330, and may have a structure in which the semiconductor layers 310 and 320 and the active layer 330 are sequentially stacked. According to an embodiment, the unit light-emitting element 300 of the display device 10 may be disposed such that a direction in which the semiconductor layers are stacked is directed in a direction perpendicular to an upper surface of the substrate SUB. That is, the direction in which the semiconductor layers of the unit light-emitting element 300 are stacked may be parallel to a direction in which the first electrode 210 and the second electrode 220 are spaced apart from each other.

Light generated by the active layer 330 of the unit light-emitting element 300 may be emitted from end portions of the unit light-emitting element 300 facing a direction in which the semiconductor layers of the unit light-emitting element 300 are stacked. Accordingly, the light emitted from the unit light-emitting element 300 may be emitted in upward and downward directions of the substrate SUB.

The unit light-emitting element 300 may be a light-emitting diode, and specifically, may be an inorganic light-emitting diode having a size of a micrometer unit or a nanometer unit and may be made of (or include) an inorganic material. The inorganic light-emitting diode may be electrically connected to two electrodes facing each other and may emit light in a specific wavelength range in case that an electrical signal is applied thereto.

The unit light-emitting element 300 may include a semiconductor layer doped with an arbitrary conductive-type (for example, p-type or n-type) impurity. The semiconductor layer may receive an electrical signal applied from an external power source and emit light in a specific wavelength range.

Hereinafter, a structure of the element part LS will be described in detail with reference to FIG. 4.

The element part LS may include the unit light-emitting element 300 including a first semiconductor layer 310, a second semiconductor layer 320, the active layer 330, and an electrode layer 370, and the binder 400 configured to fix the unit light-emitting elements 300 included in an element part LS.

The first semiconductor layer 310 may be an n-type semiconductor layer. As an example, in case that the unit light-emitting element 300 emits light in a blue wavelength range, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more among AlGaInN, GaN, AlGaN, InGaN, AlN, and InN that are doped with an n-type impurity. The first semiconductor layer 310 may be doped with an n-type dopant. As an example, the n-type dopant may be Si, Ge, Sn, or the like. In an embodiment, the first semiconductor layer 310 may be n-GaN doped with n-type Si. A thickness of the first semiconductor layer 310 may range from about 0.1 μm to about 0.5 μm, but the disclosure is not limited thereto.

The second semiconductor layer 320 is disposed on the active layer 330 that will be described below. The second semiconductor layer 320 may be a p-type semiconductor. As an example, in case that the unit light-emitting element 300 emits light in a blue or green wavelength range, the second semiconductor layer 320 may include a semiconductor material having a chemical formula of AlxGayIn1-x-yN (0≤x≤1, 0≤y≤1, and 0≤x+y≤1). For example, the semiconductor material may be one or more among AlGaInN, GaN, AlGaN, InGaN, AlN, and InN that are doped with a p-type impurity. The second semiconductor layer 320 may be doped with a p-type dopant. As an example, the p-type dopant may be Mg, Zn, Ca, Se, Ba, or the like. In an embodiment, the second semiconductor layer 320 may be p-GaN doped with p-type Mg. A thickness of the second semiconductor layer 320 may range from about 0.05 μm to about 0.10 μm, but the disclosure is not limited thereto.

Each of the first semiconductor layer 310 and the second semiconductor layer 320 is illustrated in the drawing as being formed as a layer, but the disclosure is not limited thereto. According to some embodiments, each of the first semiconductor layer 310 and the second semiconductor layer 320 may further include a larger number of layers, e.g., a clad layer or a tensile strain barrier reducing (TSBR) layer according to a material of the active layer 330. A description thereof will be provided below with reference to other drawings.

The active layer 330 is disposed between the first semiconductor layer 310 and the second semiconductor layer 320. The active layer 330 may include a material having a single or multiple quantum well structure. In case that the active layer 330 includes a material having a multiple quantum well structure, the active layer 330 may have a structure in which quantum layers and well layers are alternately stacked. The active layer 330 may emit light due to a combination of electron-hole pairs in response to electrical signals applied through the first semiconductor layer 310 and the second semiconductor layer 320. As an example, in case that the active layer 330 emits light in a blue wavelength range, the active layer 330 may include a material such as AlGaN, AlGaInN, or the like. In particular, in case that the active layer 330 has a multiple quantum well structure in which quantum layers and well layers are alternately stacked, the quantum layer may include a material such as AlGaN or AlGaInN, and the well layer may include a material such as GaN or AlInN. In an embodiment, the active layer 360 includes AlGaInN as a quantum layer and AlInN as a well layer. As described above, the active layer 360 may emit blue light having a central wavelength range ranging from about 450 nm to about 495 nm.

However, the disclosure is not limited thereto, and the active layer 330 may have a structure in which a semiconductor material having large bandgap energy and a semiconductor material having small bandgap energy are alternately stacked or include other group III to V semiconductor materials according to the wavelength range of emitted light. The light emitted by the active layer 330 is not limited to light in a blue wavelength range, and the active layer 330 may also emit light in a red or green wavelength range in some embodiments. A thickness of the active layer 330 may range from about 0.05 μm to about 0.10 μm, but the disclosure is not limited thereto.

The light emitted from the active layer 330 may be emitted to not only an outer surface of the unit light-emitting element 300 in a length direction but also side surfaces of the unit light-emitting element 300. The directivity of the light emitted from the active layer 330 is not limited to a direction.

The electrode layer 370 may be an ohmic contact electrode. However, the disclosure is not limited thereto, and the electrode layer 370 may also be a Schottky contact electrode. The unit light-emitting element 300 may include at least one electrode layer 370. Although the unit light-emitting element 300 is illustrated in FIG. 4 as including a single electrode layer 370, the disclosure is not limited thereto. In some embodiments, the unit light-emitting element 300 may include a larger number of electrode layers 370, or the electrode layer 370 may be omitted. The description of the unit light-emitting element 300 may be identically applied even in case that the number of the electrode layers 370 is varied or another structure is further included.

In case that the unit light-emitting element 300 is electrically connected to the electrodes 210 and 220, the electrode layer 370 may reduce resistance between the unit light-emitting element 300 and the electrode or contact electrode. The electrode layer 370 may include a conductive metal. For example, the electrode layer 370 may include at least one among aluminum (Al), titanium (Ti), indium (In), gold (Au), silver (Ag), indium tin oxide (ITO), indium zinc oxide (IZO), and indium tin-zinc oxide (ITZO). Further, the electrode layer 370 may include a semiconductor material doped with an n-type or p-type impurity. The electrode layer 370 may include a same material or different materials, but the disclosure is not limited thereto.

The unit light-emitting element 300 may have a structure in which the first semiconductor layer 310, the active layer 330, and the second semiconductor layer 320 are sequentially stacked in a direction. For example, the unit light-emitting element 300 may include the first semiconductor layer 310, the active layer 330, and the second semiconductor layer 320 stacked in the third direction DR3, may have a height measured in the third direction DR3 and a width measured in a direction perpendicular to the third direction DR3. According to an embodiment, in the unit light-emitting element 300, the height measured in the third direction DR3 may be greater than the width measured in the direction perpendicular to the third direction DR3.

As shown in FIG. 4, the unit light-emitting element 300 may have a cylindrical or rod shape having a height greater than a width. However, the disclosure is not limited thereto and the unit light-emitting element 300 may have various shapes, such as a shape of a wire, a tube, or the like, a shape of a cube, a rectangular parallelepiped, a polygonal pillar such as a hexagonal pillar or the like, or a shape that extends in a direction and has a partially inclined outer surface.

The binder 400 may be disposed to surround the side surface of the unit light-emitting element 300 but to expose a portion of each of an end portion and another end portion, which is opposite to the end portion, of the unit light-emitting element 300. The binder 400 may be disposed to completely surround an outer surface (or a side surface) of the active layer 330 of the unit light-emitting element 300, and may be disposed to surround at least a portion of an outer surface (or a side surface) of each of the first semiconductor layer 310 and the second semiconductor layer 320. Although the binder 400 is illustrated in the drawing as completely exposing the electrode layer 370, the disclosure is not limited thereto, and the binder 400 may be formed to cover at least a portion of the electrode layer 370.

FIGS. 5 to 11 are schematic cross-sectional views illustrating a manufacturing process of the element part of FIG. 4.

Figure 5:
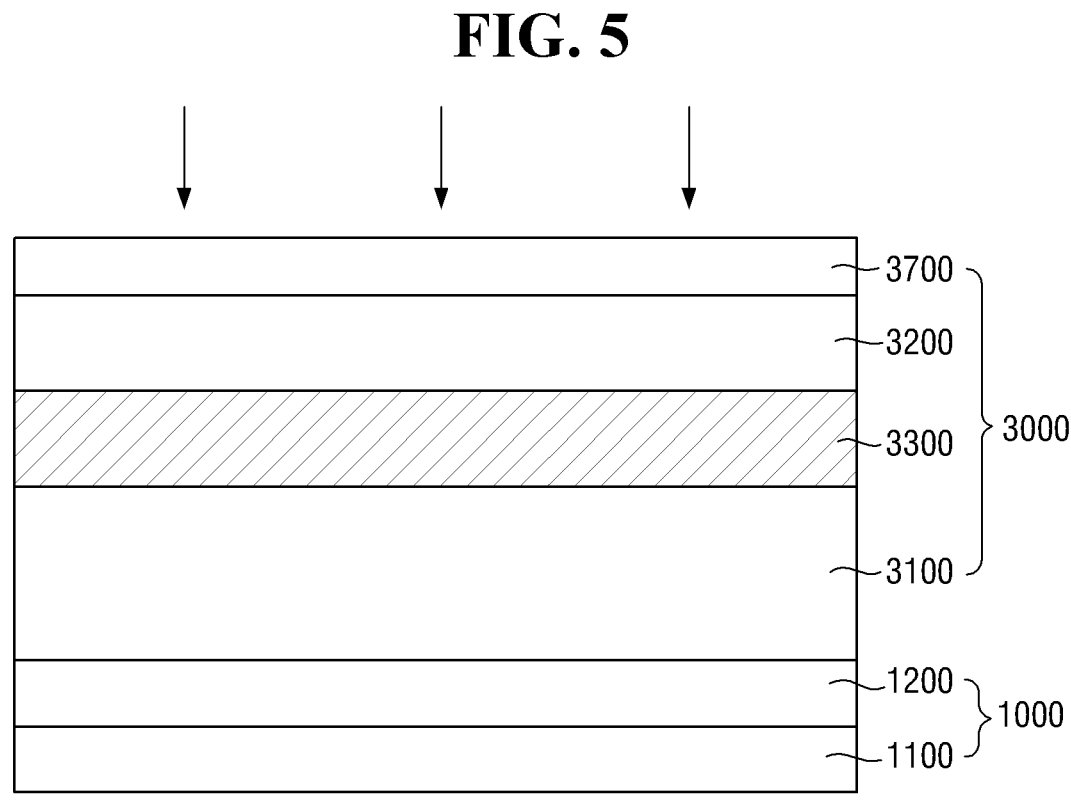
FIGS. 5 to 11 are schematic cross-sectional views illustrating a manufacturing process of the element part of FIG. 4.
Figure 6:
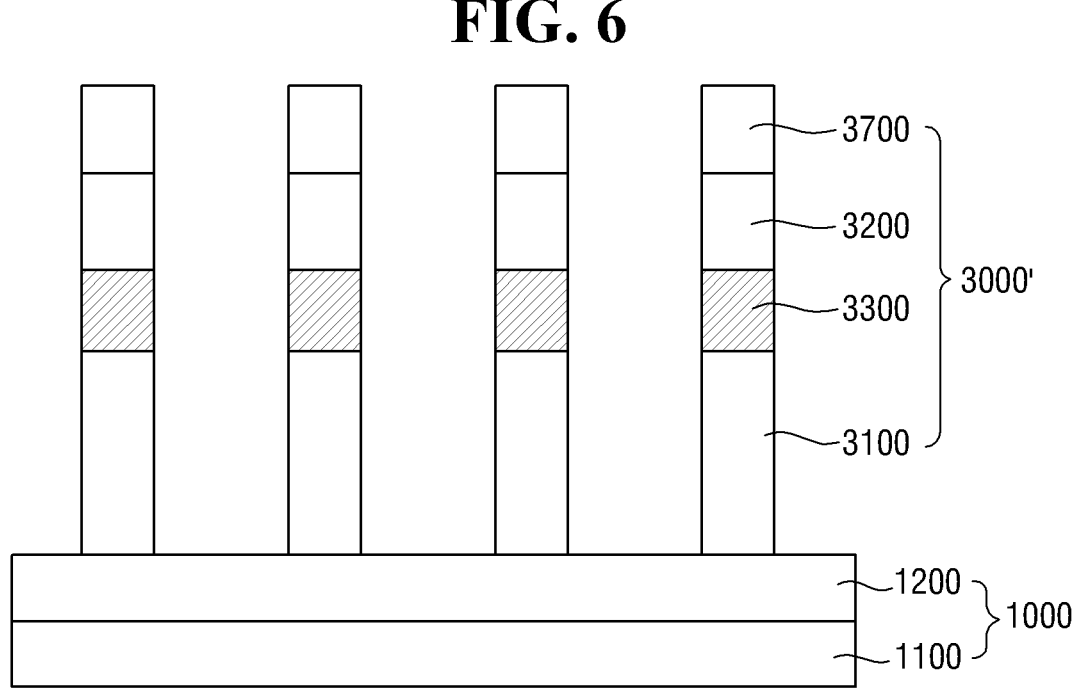

First, referring to FIGS. 5 and 6, a semiconductor structure 3000 formed on a lower substrate 1000 is prepared, and the semiconductor structure 3000 is etched to form semiconductor cores 3000' disposed to be spaced apart from each other on the lower substrate 1000 shown in FIG. 6.

The lower substrate 1000 includes a base substrate 1100 and a buffer layer (or buffer material layer) 1200 formed on the base substrate 1100.

The base substrate 1100 may include a sapphire (Al$_2$O$_3$) substrate and a transparent substrate such as glass. However, the disclosure is not limited thereto, and the base substrate 1100 may be formed as a conductive substrate such as a GaN, SiC, ZnO, Si, GaP, or GaAs substrate. Hereinafter, a case in which the base substrate 1100 is a sapphire (Al$_2$O$_3$) substrate will be described as an example.

Semiconductor layers are formed on the base substrate 1100. The semiconductor layers grown by an epitaxial method may be formed by growing a seed crystal. Here, the method of forming the semiconductor layers may include an electron beam deposition method, a physical vapor deposition (PVD) method, a chemical vapor deposition (CVD) method, a plasma laser deposition (PLD) method, a dual-type thermal evaporation method, a sputtering method, a metal-organic chemical vapor deposition method (MOCVD), or the like, and preferably, the MOCVD method. However, the disclosure is not limited thereto.

A precursor material for forming the semiconductor layers is not particularly limited within a range that can be normally selected to form a target material. As an example, the precursor material may be a metal precursor including an alkyl group such as a methyl group or an ethyl group. For example, the precursor material may be a compound such as trimethyl gallium (Ga(CH$_3$)$_3$), trimethyl aluminum (Al(CH$_3$)$_3$), or triethyl phosphate ((C$_2$H$_5$)$_3$PO$_4$), but the disclosure is not limited thereto. Hereinafter, the method of forming the semiconductor layers, process conditions, and the like will be omitted in the description, and a sequence of the manufacturing method and a stacked structure of the element part LS will be described in detail.

The buffer layer 1200 may be formed on the base substrate 1100. In the drawing, one buffer layer 1200 is illustrated as being stacked, but the disclosure is not limited thereto, and buffer layers may be formed. The buffer layer 1200 may be disposed to reduce a lattice constant difference between a first semiconductor 3100 to be described below and the base substrate 1100.

As an example, the buffer layer 1200 may include an undoped semiconductor, the buffer layer 1200 and the first semiconductor 3100 may include substantially a same material, but the buffer layer 1200 may include a material that is not doped with an n-type or p-type dopant. In an embodiment, the buffer layer 1200 may include at least one selected from among undoped InAlGaN, GaN, AlGaN, InGaN, AlN, and InN, but the disclosure is not limited thereto. In addition, the buffer layer 1200 may be omitted depending on the base substrate 1100. Hereinafter, a case in which the buffer layer 1200 including an undoped semiconductor is formed on the base substrate 1100 will be described as an example.

The semiconductor structure 3000 may include the first semiconductor 3100, an active layer 3300, a second semiconductor 3200, and an electrode layer 3700. The material layers included in the semiconductor structure 3000 may be formed by performing typical processes as described above, and the material layers included in the semiconductor structure 3000 may correspond to the respective layers included in the unit light-emitting element 300 according to an embodiment. That is, the semiconductor layers and the first semiconductor layer 310, the active layer 330, the second semiconductor layer 320, and the electrode layer 370 of the unit light-emitting element 300 may include a same material (s).

The semiconductor structure 3000 is etched to form the semiconductor cores 3000' (see FIG. 6), which are spaced apart from each other, of FIG. 6. The semiconductor structure 3000 may be etched by a typical method. For example, the semiconductor structure 3000 may be etched by a method of forming an etch mask layer thereon, and etching the semiconductor structure 3000 in a direction perpendicular to the lower substrate 1000 along the etch mask layer.

For example, the process of etching the semiconductor structure 3000 may be performed through a dry etching method, a wet etching method, a reactive ion etching (RIE) method, an inductively coupled plasma reactive ion etching (ICP-RIE) method, or the like. Anisotropic etching may be performed through the dry etching method, and thus, the dry etching method may be suitable for vertical etching. In case that the etching method of the above-described method is used, an etchant may include Cl$_2$, O$_2$, or the like. However, the disclosure is not limited thereto.

In some embodiments, the semiconductor structure 3000 may be etched through a combination of a dry etching method and a wet etching method. For example, first, etching in a depth direction may be performed by the dry etching method, and a sidewall etched through the wet etching method, which is an isotropic etching method, may be disposed on a plane perpendicular to the surface.

Figure 7:
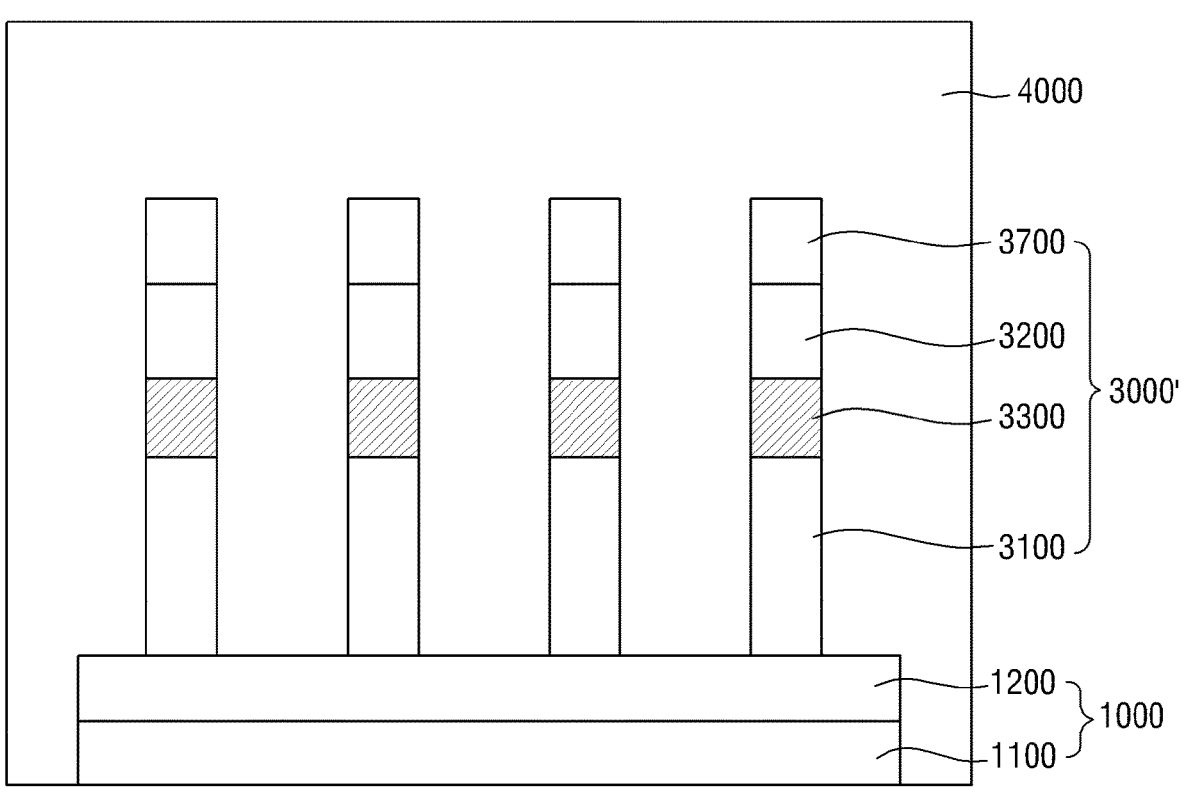
Figure 8:
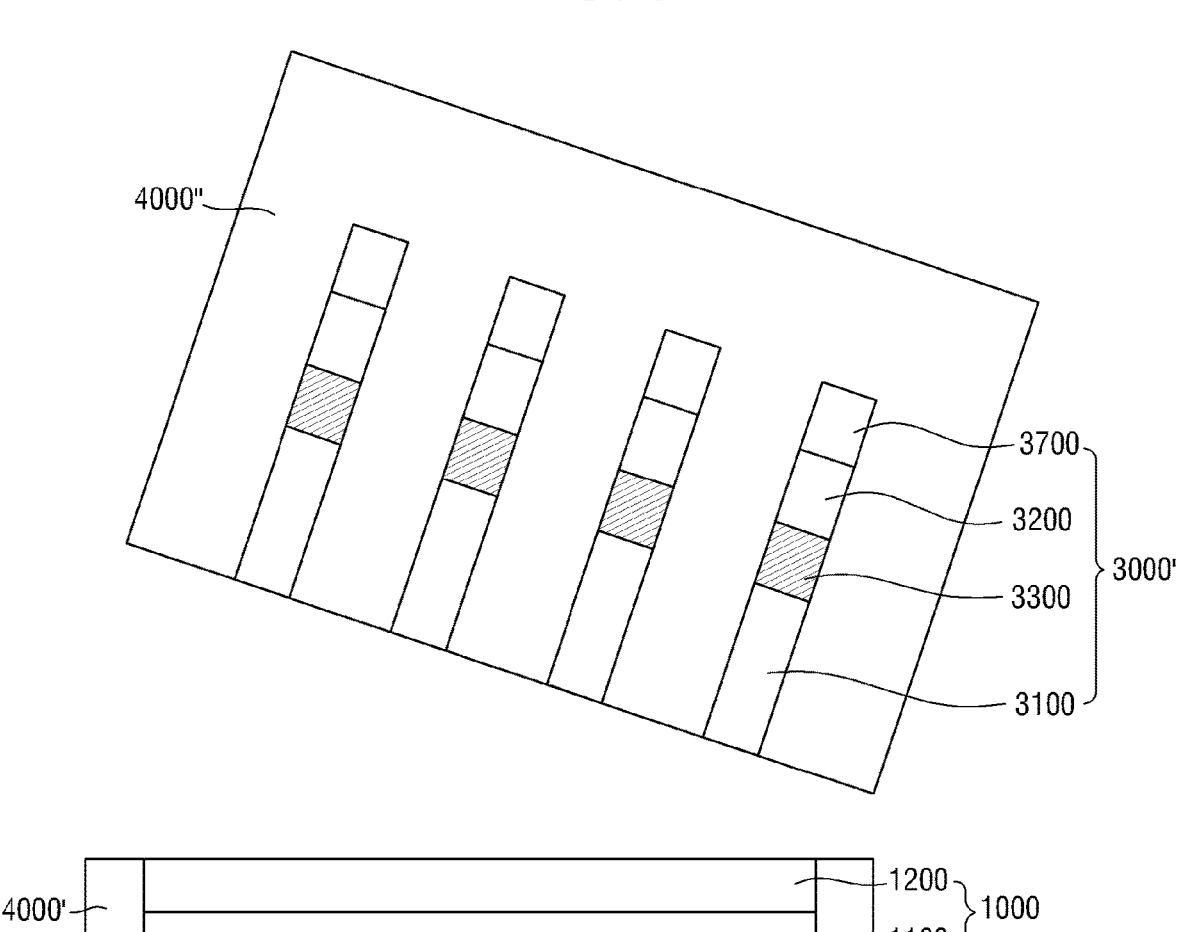
Figure 8:
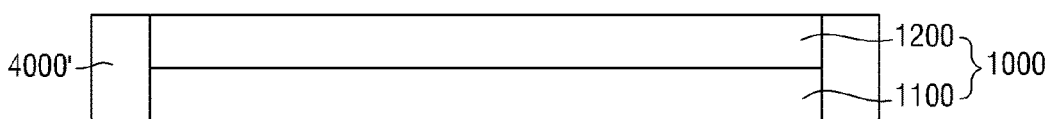

Referring to FIG. 7, a semiconductor protective layer 4000 surrounding an outer surface of the semiconductor core 3000' is formed on the lower substrate 1000.

The semiconductor protective layer 4000 may be formed on the lower substrate 1000 to surround the semiconductor core 3000'. The semiconductor protective layer 4000 may have a thickness greater than a length of a long axis of the semiconductor core 3000' to cover up to an upper surface of the semiconductor core 3000', for example, up to an upper surface of the conductive electrode layer (or electrode material layer) 3700. That is, the semiconductor protective layer 4000 may be formed such that the semiconductor core 3000' is disposed in the semiconductor protective layer 4000. As an example, in case that the length of the long axis of the semiconductor core 3000' is about 4 μm to about 7 μm, the thickness of the semiconductor protective layer 4000 may be about 6 μm to about 10 μm. However, the disclosure is not limited thereto.

An upper surface of the semiconductor protective layer 4000 may be formed substantially flat to form a plane parallel to the lower substrate 1000. A lower surface of the semiconductor protective layer 4000 may be formed to contact the buffer layer 1200 of the lower substrate 1000. In an embodiment, the lower surface of the semiconductor protective layer 4000 may contact an upper surface of the buffer layer 1200 and may be disposed to completely cover a side surface of the lower substrate 1000. However, the disclosure is not limited thereto, and the semiconductor protective layer 4000 may be disposed only on the upper surface of the buffer layer 1200.

The semiconductor protective layer 4000 is formed to surround an upper surface and side surfaces of the semiconductor core 3000' to protect the semiconductor core 3000'. That is, the semiconductor protective layer 4000 may be formed to completely fill a space between semiconductor cores 3000' formed on the lower substrate 1000.

The semiconductor protective layer 4000 may be formed by coating or spraying a material, constituting the semiconductor protective layer 4000, on the semiconductor cores 3000'. In an embodiment, the semiconductor protective layer 4000 may be formed on the lower substrate 1000 through an inkjet printing method, a spin coating method, a die-slot coating method, a slit coating method, or the like. However, the disclosure is not limited thereto.

The semiconductor protective layer 4000 may be formed, including an insulating material. In an embodiment, the semiconductor protective layer 4000 may include an inorganic insulating material including a nitride-based inorganic material or a polymer. For example, the semiconductor protective layer 4000 may include an inorganic insulating material such as silicon nitride (SiNx), aluminum nitride (AlN), or the like. In addition, the polymer may be a photosensitive polymer such as poly(methyl methacrylate) (PMMA), poly(methyl glutarimide) (PMGI), or the like, but the disclosure is not limited thereto.

Figure 9:
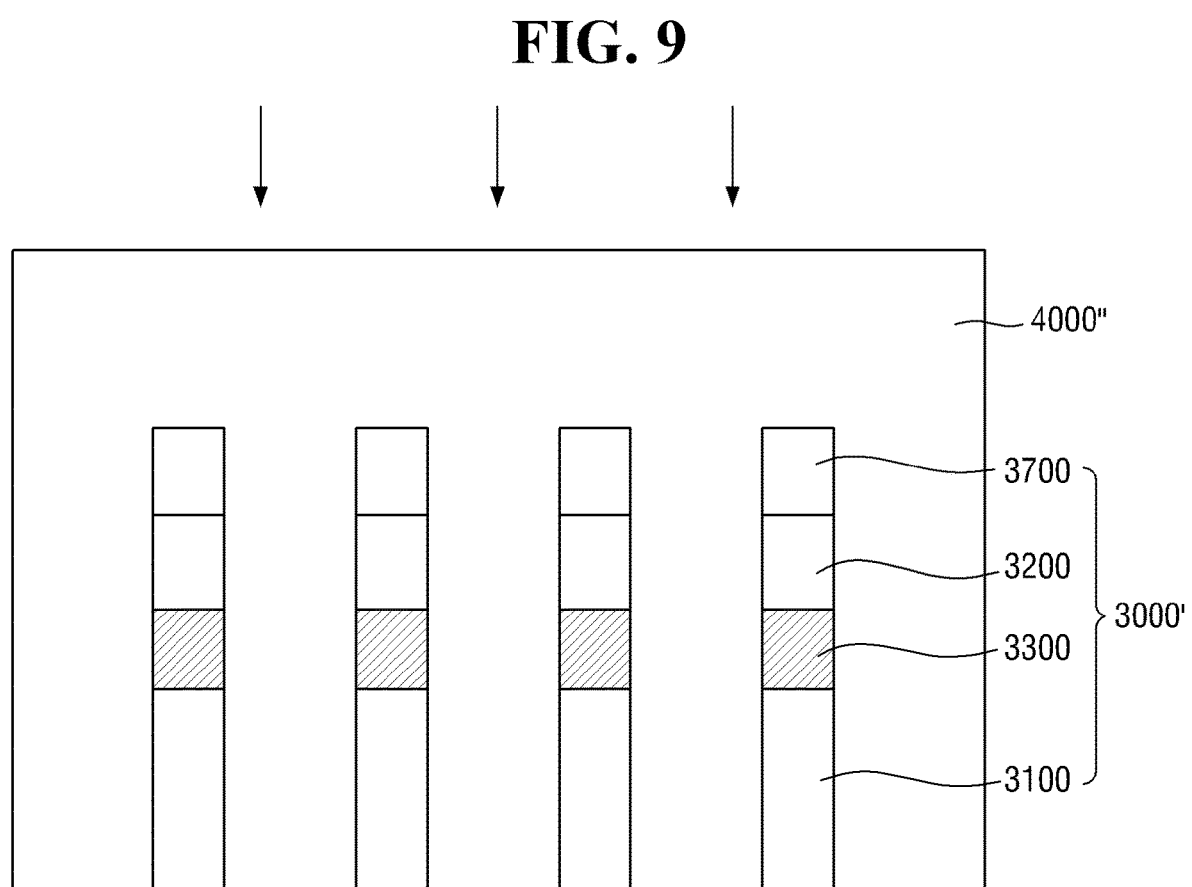

Referring to FIG. 9, the semiconductor protective layer 4000 and the semiconductor cores 3000' disposed in the semiconductor protective layer 4000 and fixed by the semiconductor protective layer 4000 are separated from the lower substrate 1000. The process of separating the semiconductor cores 3000' from the lower substrate 1000 is not particularly limited. Although not shown in the drawing, the process of separating the semiconductor cores 3000' from the lower substrate 1000 may be performed by a physical separation method, a chemical separation method, or the like. The semiconductor protective layer 4000 may be separated into a first area 4000' disposed on the side surface of the lower substrate 1000 and a second area 4000" entirely surrounding the outer surfaces of the semiconductor cores 3000' by the above-described separation process.

Figure 10:
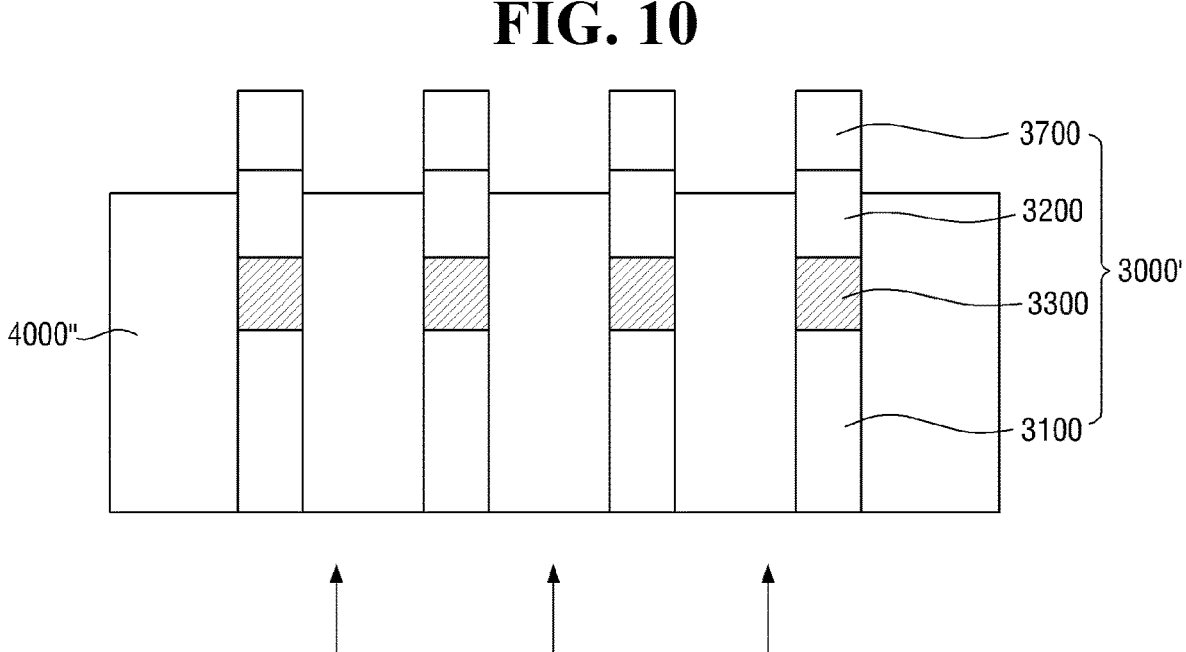
Figure 11:
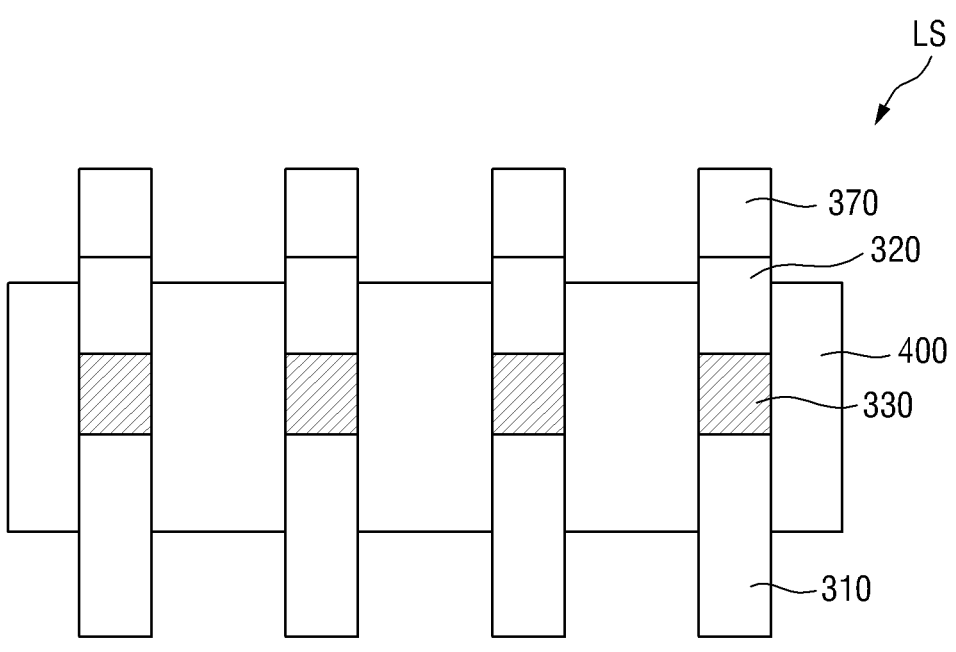

Referring to FIG. 9, the second area 4000" of the semiconductor protective layer disposed on a side of the electrode layer 3700 is etched to expose the electrode layer 3700 and at least a portion of the second semiconductor 3200 as shown in FIG. 10. An etching process may be performed on the second area 4000" of the semiconductor protective layer disposed on the side of the electrode layer 3700 to etch at least a portion of the second area 4000" of the semiconductor protective layer including the insulating material. Referring to FIG. 10, the second area 4000" of the semiconductor protective layer disposed on a side of the first semiconductor 3700 is etched to expose at least a portion of the first semiconductor 3100 as shown in FIG. 11. An etching process may be performed on the second area 4000" of the semiconductor protective layer disposed on the side of the first semiconductor 3700 to etch at least a portion of the second area 4000" of the semiconductor protective layer including the insulating material, thereby forming the element part LS of FIG. 11.

As described above, the binder 400 of the element part LS may be formed using the semiconductor protective layer 4000, which includes the insulating material, used in the process of separating the unit light-emitting elements 300 from the lower substrate SUB in a manufacturing process of the element part LS. The first semiconductor layer 310 of each of the unit light-emitting elements 300 may be prevented from being damaged by integrating and separating the unit light-emitting elements 300 by using the semiconductor protective layer 4000 instead of separating the unit light-emitting elements 300 individually. In addition, since an ink forming process may be omitted by disposing the unit light-emitting elements 300, fixed by the binder 400, on the planarization layer 106, the efficiency of the manufacturing process may be increased.

Hereinafter, other embodiments will be described. In the following embodiments, descriptions of components which are the same as those described above may be omitted or simplified, and differences therebetween will be mainly described. In addition, in describing other embodiments below, for convenience of description, other embodiments will be described by partially illustrating the display element layer EML disposed on the planarization layer 106.

Figure 12:
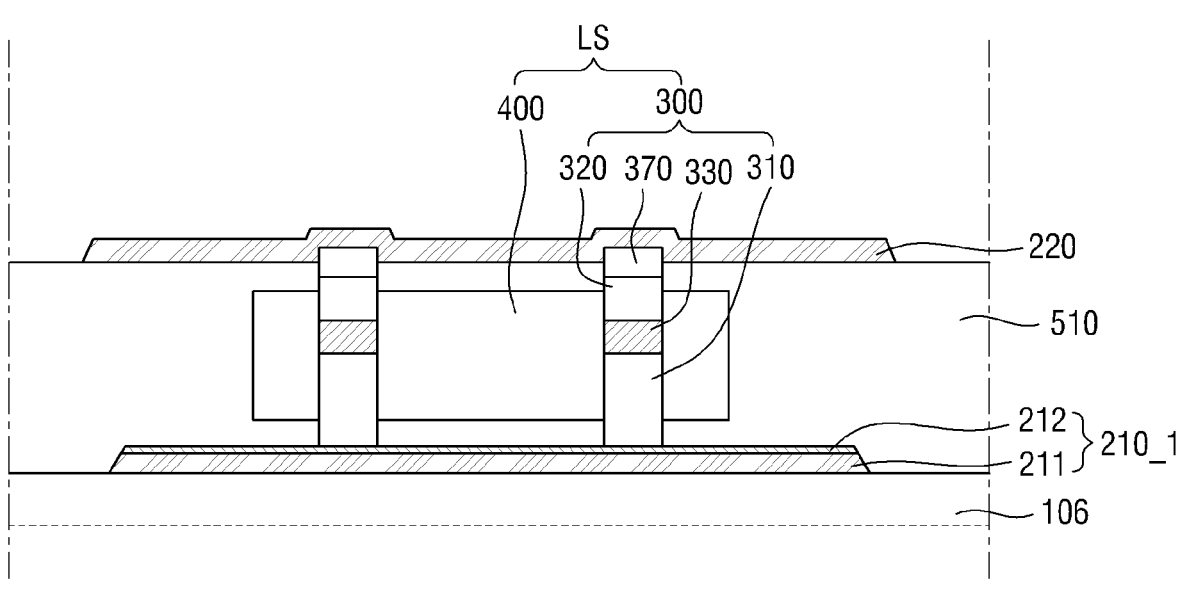
FIG. 12 is a schematic cross-sectional view of a sub-pixel of a display device according to another embodiment.

FIG. 12 is a schematic cross-sectional view of a sub-pixel of a display device according to another embodiment. Referring to FIG. 12, the display device according to the embodiment is different from that of the embodiment of FIG. 3 in that a first electrode is formed as layers.

Referring to FIG. 12, in the display device according to an embodiment, a first electrode 210_1 may include layers. The first electrode 210_1 may include a layer including a transparent material and a layer including a material having a high reflectance. Accordingly, at least a portion of light emitted from a unit light-emitting element 300 and incident toward the first electrode 210_1 may be reflected in an upward direction with respect to a substrate SUB from an upper surface of the layer including the material having a high reflectance among the layers constituting the first electrode 210_1.

Specifically, in a stacked structure, the first electrode 210_1 may include a first electrode base layer 211 and a first electrode upper layer 212 disposed on the first electrode base layer 211. The first electrode base layer 211 may be disposed on a planarization layer 106, and the first electrode upper layer 212 may be disposed to cover an upper surface of the first base layer 211. The first electrode base layer 211 and the first electrode upper layer 212 may be patterned by a mask process. In an embodiment, sidewalls of the first electrode base layer 211 and the first electrode upper layer 212 may be aligned to be coplanar with each other.

The first electrode base layer 211 and the first electrode upper layer 212 may all include a conductive material to constitute a first electrode 210_1. The first electrode base layer 211 includes a conductive material having a high reflectance, and the first electrode upper layer 212 may include a transparent conductive material. Of the light emitted from the unit light-emitting element 300, the light traveling toward the first electrode 210_1 may pass through the first electrode upper layer 212 including a transparent material to travel to the upper surface of the first electrode base layer 211. At least a portion of the light incident toward the first electrode base layer 211 may be reflected in the upward direction with respect to the substrate SUB from the upper surface of the first electrode base layer 211.

In the embodiment, light emitted from an end portion of the unit light-emitting element 300, which is disposed on a side of a second electrode 220, of end portions of the unit light-emitting element 300 may be emitted to the outside through the second electrode 220 as described above, and light emitted from another end portion of the unit light-emitting element 300, which is disposed on a side of the first electrode 210_1, of the end portions of the unit light-emitting element 300 may travel toward the first electrode 210_1. Accordingly, by forming the electrode base layer 211 to include a reflective material, at least a portion of the light emitted from the unit light-emitting element 300 and traveling toward the first electrode 210_1 may be reflected from the upper surface of the electrode base layer 211 to travel in the upward direction with respect to the substrate SUB, thereby improving the light efficiency of the display device 10.

Figure 13:
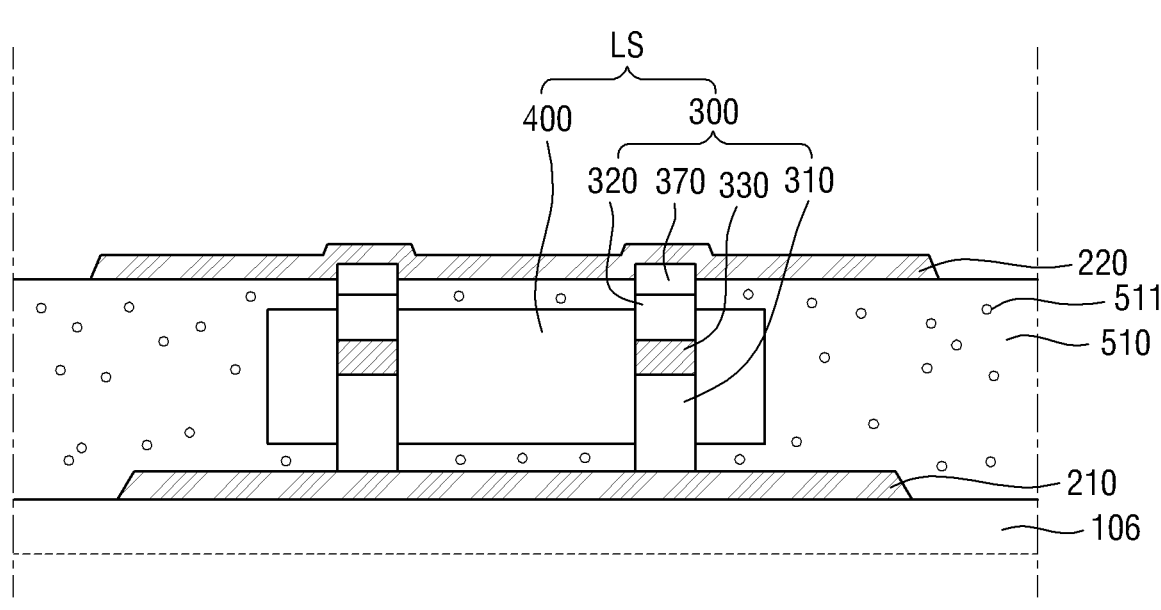
FIG. 13 is a schematic cross-sectional view of a sub-pixel of a display device according to still another embodiment.

FIG. 13 is a schematic cross-sectional view of a sub-pixel of a display device according to still another embodiment. Referring to FIG. 13, the display device according to the embodiment is different from that of the embodiment of FIG. 3 in that a first insulating layer further includes scatterers 511.

Referring to FIG. 13, a first insulating layer 510 may further include the scatterers 511 disposed therein. The scatterers 511 may be included in the first insulating layer 510 in a state of being dispersed in the first insulating layer 510, and may have a refractive index different from that of the first insulating layer 510 and form an optical interface with the first insulating layer 510. For example, the scatterers 511 may be light scattering particles. A material of the scatterer 511 is not particularly limited as long as the material may scatter at least a portion of transmitted light, and, for example, the scatterer 511 may be a metal oxide particle or organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particle may include an acrylic-based resin, a urethane-based resin, and the like. The scatterer 511 may scatter light in a random direction irrespective of an incidence direction of incident light without substantially changing a wavelength of light passing through the first insulating layer 510.

In the embodiment, some of light emitted from a unit light-emitting element 300 may be incident on the scatterer 511 included in the first insulating layer 510 and may be scattered by the scatterer 511. The scatterers 511 may scatter light emitted from unit light-emitting elements 300 arranged in parallel in a direction so that the light emitted from the unit light-emitting elements 300 does not travel only in a specific direction, and accordingly, a display device 10 may emit light having a uniform density by including the scatterers 511.

Figure 14:
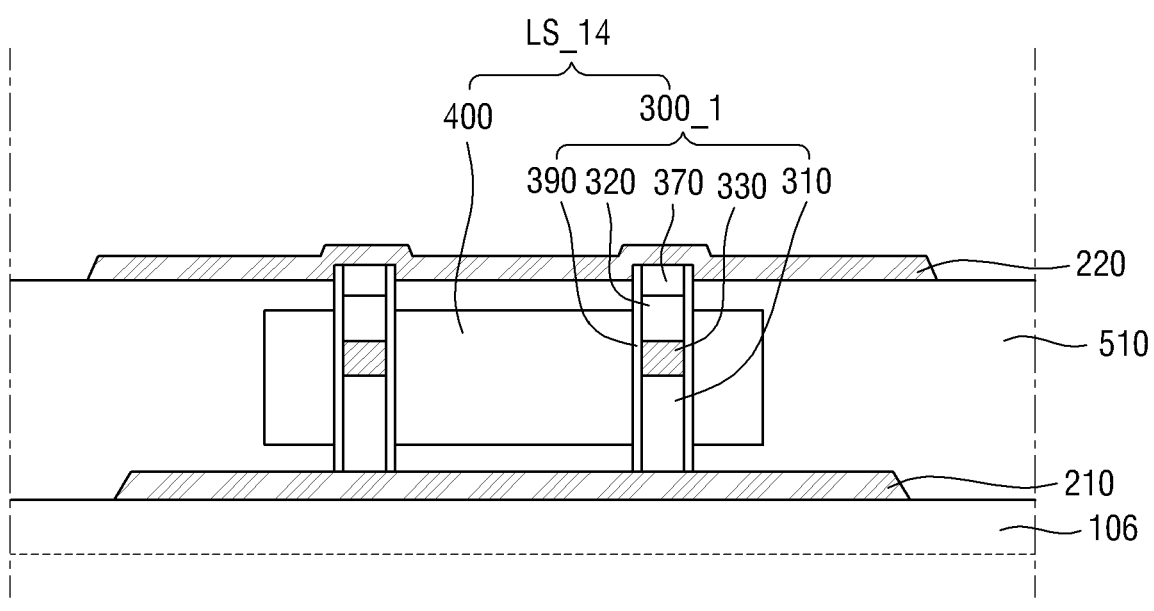
FIG. 14 is a schematic cross-sectional view of a sub-pixel of a display device according to yet another embodiment.

FIG. 14 is a schematic cross-sectional view of a sub-pixel of a display device according to yet another embodiment. Referring to FIG. 14, the display device according to the embodiment is different from that of the embodiment of FIG. 3 in that a unit light-emitting element further includes an insulating film 390 surrounding an outer surface of the unit light-emitting element.

Referring to FIG. 14, an element part LS_14 includes a binder 400 and unit light-emitting elements 300_1 each further including the insulating film 390. Each of the unit light-emitting elements 300_1 may further include the insulating film 390 that surrounds semiconductor layers 310 and 320 and an active layer 330 of each of the unit light-emitting elements 300_1. The insulating film 390 is disposed to surround an outer surface of each of the semiconductor layers 310 and 320, the active layer 330, and an electrode layer 370. The insulating film 390 may be disposed to surround at least the outer surface of the active layer 360, and may extend in a direction in which the unit light-emitting element 300 extends. The insulating film 390 may serve to protect the members.

At least a portion of the outer surface of the insulating film 390 may contact the binder 400. The insulating film 390 may be interposed between the first semiconductor layer 310, the second semiconductor layer 320, and the active layer 330 of the unit light-emitting element 300_1 and the binder 400. In the embodiment, the first semiconductor layer 310, the second semiconductor layer 320, and the active layer 330 may be located to be spaced apart from the binder 400. However, even in this case, since the binder 400 is disposed to contact and surround the outer surface of the insulating film 390, the unit light-emitting element 300_1 may be fixed by the binder 400.

FIG. 14 illustrates that the insulating film 390 is formed to extend in a length direction of the unit light-emitting element 300 to cover from the first semiconductor layer 310 to a side surface of the electrode layer 370, but the disclosure is not limited thereto. For example, the insulating film 390 may be formed to surround side surface portions of the members and expose end portions of the unit light-emitting element 300 in the length direction. In addition, since the insulating film 390 covers only the outer surfaces of some semiconductor layers 310 and 320, including the active layer 360 or covers only a portion of the outer surface of the electrode layer 370, the outer surface of the electrode layer 370 may be partially exposed. An upper surface of the insulating film 390 may be formed to be rounded in a cross-sectional view in an area adjacent to at least one end portion of the unit light-emitting element 300_1.

The insulating film 390 may include a material having insulating properties, for example, silicon oxide (SiOx), silicon nitride (SiNx), silicon oxynitride (SiOxNs), aluminum nitride (AlN), aluminum oxide ($Al_2O_3$), or the like. Accordingly, it is possible to prevent an electrical short circuit that may occur in case that the active layer 330 directly contact an electrode through which an electrical signal is transmitted to the unit light-emitting element 300_1. Further, since the insulating film 390 protects the outer surface of the unit light-emitting element 300_1, including the active layer 330, it is possible to prevent degradation in light-emitting efficiency.

The insulating film 390 may include a material having a refractive index different from that of the binder 400 among the materials having insulating properties. The insulating film 390 may include a material having a refractive index higher than that of the binder 400. In an embodiment, the binder 400 may include a material having a refractive index in a range of about 1.0 to about 1.7, and the insulating film 390 may include a material having a refractive index in a range of about 1.2 to about 2.0. However, the disclosure is not limited thereto, and the binder 400 and the insulating film 390 may include a material having a refractive index different from the above-described refractive index.

The insulating film 390 includes a material having a higher refractive index than the binder 400 so that it is possible to prevent the light from not being emitted to the outside of the unit light-emitting element 300_1 due to total reflection of light emitted from the outer surface of the unit light-emitting element 300_1 and traveling toward the binder 400. That is, by disposing a material, which has a refractive index in a range between the refractive index of the unit light-emitting element 300_1 and the refractive index of the binder 400, between the unit light-emitting element 300_1 and the binder 400, the light emitted toward the binder 400 from the outer surface of the unit light-emitting element 300_1 may be smoothly emitted without being totally reflected.

In the embodiment, the insulating film 390 may be formed on the outer surface of the unit light-emitting element 300_1 to serve to protect the members of the unit light-emitting element 300_1. Accordingly, since the insulating film 390 protects the outer surfaces of the members of the unit light-emitting element 300_1, degradation in light-emitting efficiency may be prevented. In addition, since the insulating film 390 is formed of a material having a refractive index higher than that of the binder 400 and lower than those of other members included in the unit light-emitting element 300_1, total reflection may be prevented, thereby preventing degradation in light-emitting efficiency of a display device 10.

Figure 15:
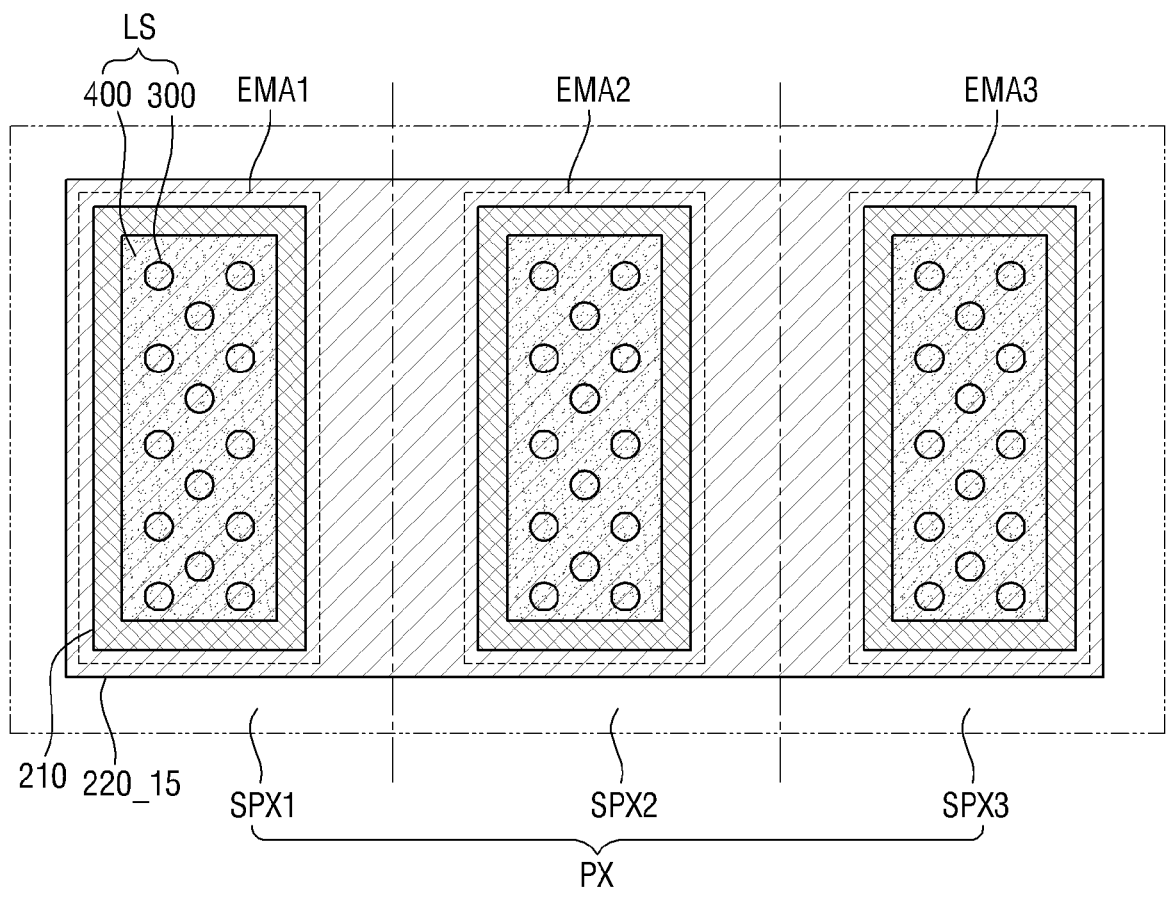
FIG. 15 is a schematic plan view illustrating a pixel of a display device according to yet another embodiment.
Figure 15:
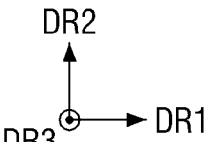

FIG. 15 is a schematic plan view illustrating a pixel of a display device according to yet another embodiment. Referring to FIG. 15, a display device 10 according to the embodiment is different from that of the embodiment of FIG. 3 in that a second electrode is disposed to cover a light-emitting area EMA of sub-pixels SPX included in a pixel PX.

Referring to FIG. 15, a second electrode 220_15 of the display device 10 according to the embodiment may be disposed to extend to neighboring sub-pixels SPX adjacent in the first direction DR1 in a pixel PX. That is, the second electrode 220_15 may be disposed to cover all of light-emitting areas EMA included in each sub-pixel SPX. An area of the second electrode 220_15 may be formed to be greater than the sum of areas of first to third light-emitting areas EMA1, EMA2, and EMA3. However, the disclosure is not limited thereto, and the second electrode may be formed to extend to the adjacent pixels to be integrated.

The second electrode disposed in the pixel PX may be electrically connected to a second power line, and may receive a same electrical signal. In the embodiment, since the second electrode 220_15 in an integrated shape is disposed in the sub-pixels SPX, the sub-pixels SPX may receive a same electrical signal through the second electrode 220_15 electrically connected to the second power line.

Further, since the second electrode 220_15 is disposed to cover the sub-pixels SPX, the second power line may be disposed only in some pixels PX or sub-pixels SPX, and may not be disposed in some sub-pixels SPX. Although not shown, the second power line may be electrically connected to a partial area of the second electrode 220_15 in an area of the first to third sub-pixels SPX1, SPX2, and SPX3 included in a pixel PX.

Figure 16:
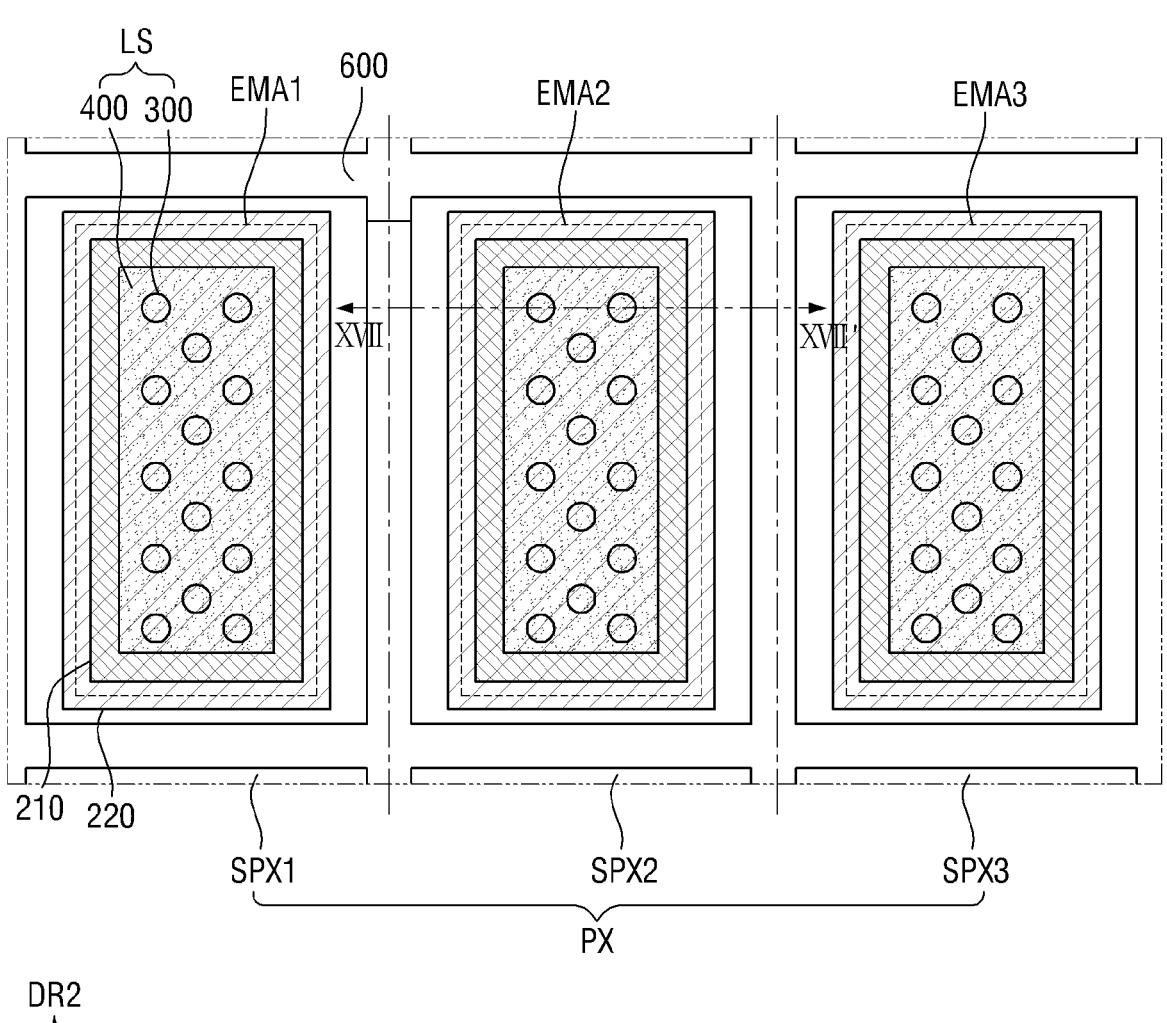
FIG. 16 is a schematic plan view illustrating a pixel of a display device according to yet another embodiment.
Figure 16:
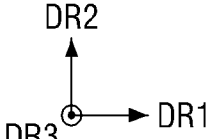
Figure 17:
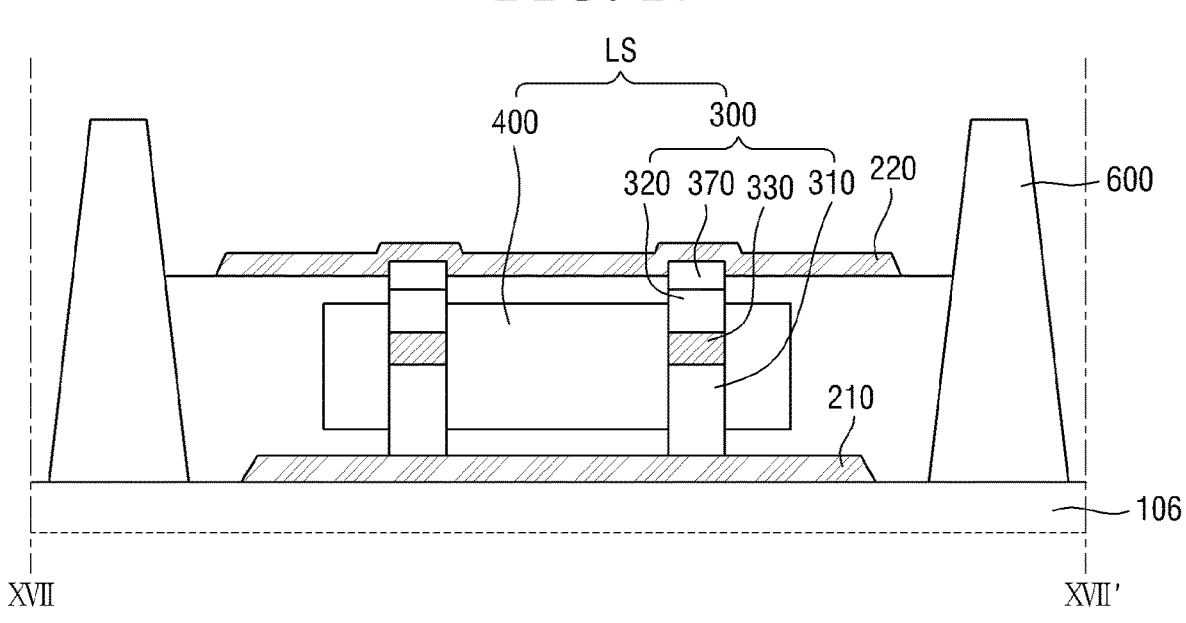
FIG. 17 is a schematic cross-sectional view illustrating an example taken along line XVII-XVII' of FIG. 16.
Figure 17:
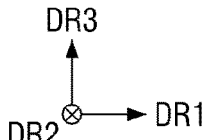

FIG. 16 is a schematic plan view illustrating a pixel of a display device according to yet another embodiment. FIG. 17 is a schematic cross-sectional view illustrating an example taken along line XVII-XVII' of FIG. 16. Referring to FIGS. 16 and 17, a display device 10 according to the embodiment is different from that of the embodiment of FIG. 3 in that a reflective partition wall 600 is further included at a boundary of each sub-pixel SPX.

Referring to FIGS. 16 and 17, the reflective partition wall 600 may be disposed at a boundary of each sub-pixel SPX. The reflective partition wall 600 may be disposed to extend in the first direction DR1 and the second direction DR2 in a plan view. The reflective partition wall 600 may be disposed to surround a first electrode 210 and a portion of a first insulating layer 510, including an area in which the first electrode 210, an element part LS, and a second electrode 220 are disposed. That is, the reflective partition wall 600 may be disposed to surround each sub-pixel SPX, and the reflective partition wall 600 may form a grid pattern on the entire surface of a display area DA of the display device 10. The reflective partition wall 600 may include a reflective material.

The reflective partition wall 600 may be disposed on a planarization layer 106. The reflective partition wall 600 may have a structure in which at least a portion of the planarization layer 106 protrudes.

The reflective partition wall 600 may include an upper surface, a lower surface, and a side surface. The upper surface and the lower surface of the reflective partition wall 600 may be opposite to each other. Each of the upper surface and the lower surface of the reflective partition wall 600 may be located in a plane. The plane on which the upper surface is located and the plane on which the lower surface is located may be substantially parallel to each other and thus the reflective partition wall may have an overall uniform thickness. The lower surface of the reflective partition wall 600 is disposed on a surface of the planarization layer 106.

In some embodiments, a width of the upper surface of the reflective partition wall 600 and a width of the lower surface of the reflective partition wall 600 may be different. For example, the plane on which the side surface of the reflective partition wall 600 is located may be inclined to form an acute angle in a clockwise direction with respect to a surface of the planarization layer 106, and in this case, the width of the upper surface of the reflective partition wall 600 may be less than the width of the lower surface of the reflective partition wall 600. Since the reflective partition wall 600 protrudes and has an inclined side surface with respect to the planarization layer 106, of light emitted from a unit light-emitting element 300, the light traveling to the inclined side surface of the reflective partition wall 600 may be reflected from the inclined side surface of the reflective partition wall 600.

Based on an upper surface of the planarization layer 106, a height of the reflective partition wall 600 may be greater than a height of the first insulating layer 510. In addition, the height of the reflective partition wall 600 based on the upper surface of the planarization layer 106 may be greater than the sum of a length of the unit light-emitting element 300 and a thickness of the first electrode 210.

In the embodiment, since the reflective partition wall 600 has a protruding structure having a height greater than the length of the unit light-emitting element 300 in each sub-pixel SPX, the light emitted from the light-emitting element 300 and traveling toward the side surface of the reflective partition wall 600 may be reflected to travel in an upward direction with respect to the planarization layer 106 or toward a light-emitting area EMA from an upper portion of the second electrode 220. That is, the reflective partition wall 600 may divide the neighboring sub-pixels SPX, and simultaneously, serve as a reflective partition wall that reflects light emitted from the unit light-emitting element 300. Accordingly, the display device 10 may further include the reflective partition wall 600 so that the light emitted from the unit light-emitting element 300 may travel in an upward direction with respect to the substrate SUB, thereby improving the light efficiency of the display device 10.

Figure 18:
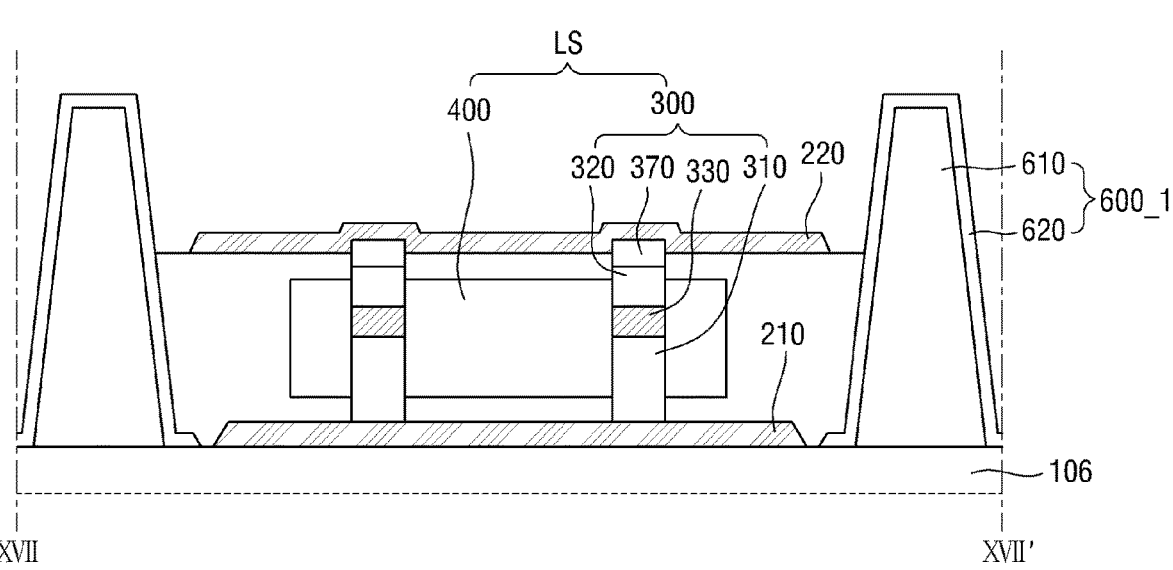
FIG. 18 is a schematic cross-sectional view illustrating another example taken along line XVII-XVII' of FIG. 16.
Figure 18:
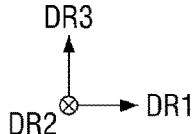

FIG. 18 is a schematic cross-sectional view illustrating another example taken along line XVII-XVII' of FIG. 16. The embodiment of FIG. 18 illustrates that the reflective partition wall may include a partition wall and a reflective coating layer. That is, referring to FIG. 18, a display device according to the embodiment is different from that of the embodiment of FIG. 17 in that the reflective partition wall further includes a reflective coating layer.

Referring to FIG. 18, a reflective partition wall 600_1 includes a partition wall 610 and a reflective coating layer 620 disposed on the partition wall 610. The partition wall 610 and the reflective partition wall 600 of FIG. 17 have substantially a same shape. The reflective coating layer 620 is disposed on an upper surface and side surfaces of the partition wall 610. The reflective coating layer 620 may cover both the upper surface and the side surfaces of the partition wall 610.

The reflective coating layer 620 may include a material having a high reflectance, such as a metal. In an embodiment, the reflective coating layer 620 may include materials such as silver, copper, aluminum, nickel, lanthanum, or alloys thereof, indium tin oxide (ITO), indium zinc oxide (IZO), indium tin-zinc oxide (ITZO), and the like, but the disclosure is not limited thereto. The reflective coating layer 620 may be directly deposited or coated on a surface of the partition wall 610. As another example, the reflective coating layer 620 may be attached to the partition wall 610 through a separate adhesive layer.

A portion of light traveling toward the reflective partition wall 600_1 from a unit light-emitting element 300 may be reflected by the reflective coating layer 620 of the reflective partition wall 600_1 and may travel in an upward direction with respect to a substrate SUB.

In the case of the embodiment, since the reflection is made by the reflective coating layer 620, the partition wall 610 covered by the reflective coating layer 620 may include a non-reflective material or a low-reflective material. Accordingly, the partition wall 610 may be formed of a material, which is easily moldable, such as an organic material, and the reflective coating layer 620 may be formed on a surface of the partition wall 610, thereby forming the reflective partition wall 600_1. Accordingly, the manufacturing efficiency of the reflective partition wall 600_1 may be improved.

Figure 19:
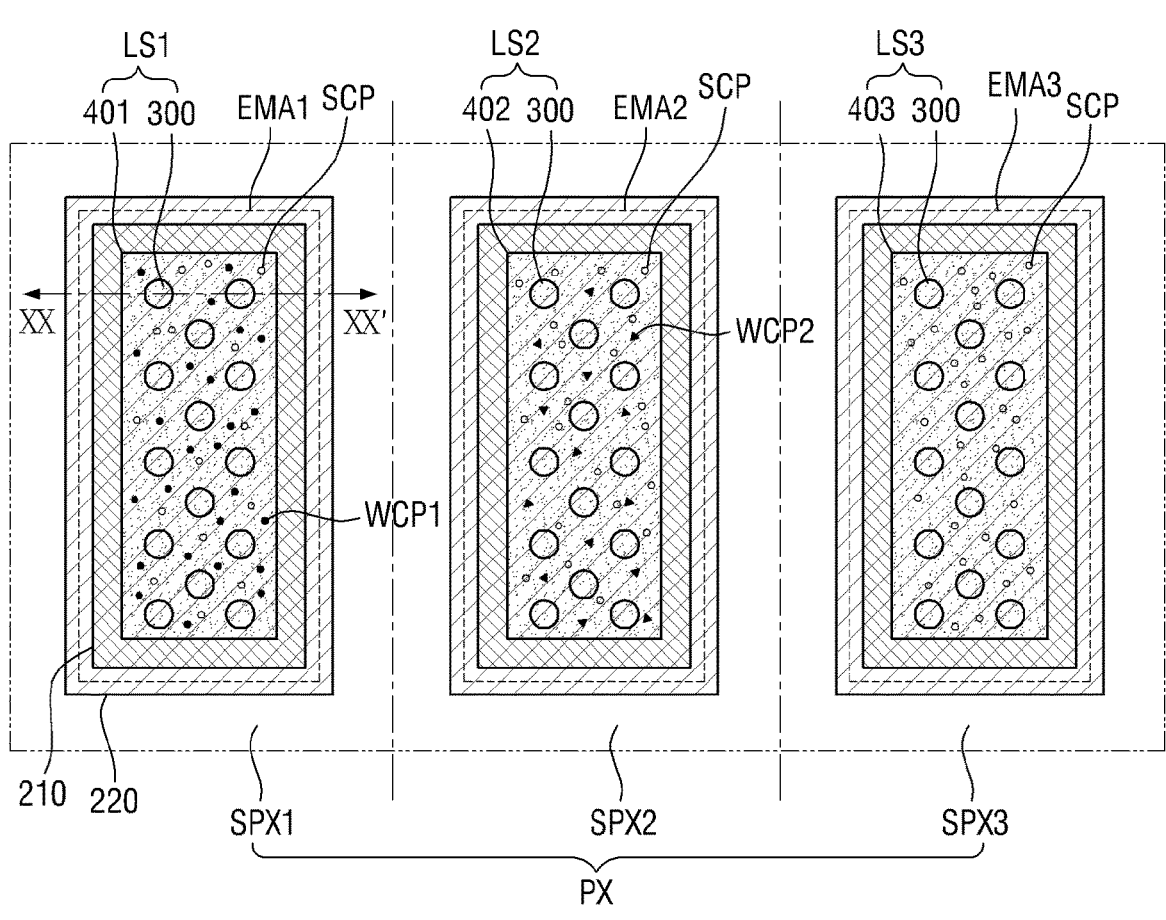
FIG. 19 is a schematic plan view illustrating a pixel of a display device according to yet another embodiment.
Figure 19:
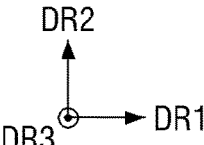
Figure 20:
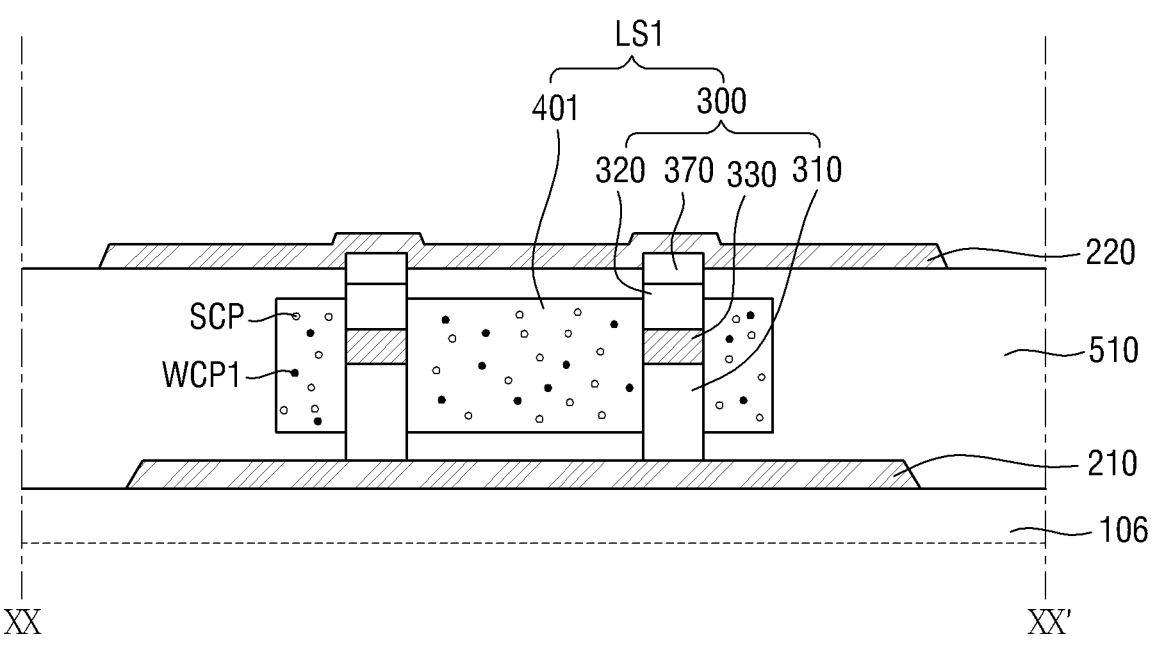
FIG. 20 is a schematic cross-sectional view illustrating an example taken along line XX-XX' of FIG. 19.

FIG. 19 is a schematic plan view illustrating a pixel of a display device according to yet another embodiment. FIG. 20 is a schematic cross-sectional view illustrating an example taken along line XX-XX' of FIG. 19. Referring to FIGS. 19 and 20, a display device 10 according to the embodiment is different from that of the embodiment of FIGS. 2 and 3 in that a binder of an element part includes scatterers SCP and wavelength conversion materials WCP1 and WCP2.

Referring to FIGS. 19 and 20, in an embodiment in which light of each of first to third colors is emitted in a light-emitting area EMA of each sub-pixel SPX, an element part LS may include a first element part LS1, a second element part LS2, and a third element part LS3 disposed to correspond to the respective sub-pixels SPX.

The first element part LS1 is disposed in a first sub-pixel SPX1 that emits the light of the first color. The first element part LS1 may include unit light-emitting elements 300 disposed to be spaced apart from each other and a first binder 401. The first binder 401 may include a material forming the above-described binder 400, and may include first wavelength conversion materials WCP1 disposed in the material. The first binder 401 may further include the scatterers SCP. However, the disclosure is not limited thereto, and the scatterers SCP may be omitted.

The second element part LS2 is disposed in a second sub-pixel SPX2 that emits the light of the second color. The second element part LS2 may include unit light-emitting elements 300 disposed to be spaced apart from each other and a second binder 402. The second binder 402 may include the material forming the above-described binder 400, and may include second wavelength conversion materials WCP2 disposed in the material. The second binder 402 may further include the scatterers SCP. However, the disclosure is not limited thereto, and the scatterers SCP may be omitted.

The third element part LS3 is disposed in a third sub-pixel SPX3 that emits the light of the third color. The third element part LS3 may include unit light-emitting elements 300 disposed to be spaced apart from each other and a third binder 403. The third binder 403 may include the material forming the binder 400 described above, and may include the scatterers SCP disposed in the material. However, the disclosure is not limited thereto, and the scatterers SCP may be omitted.

The first wavelength conversion material WCP1 may convert the light of the third color, emitted from the unit light-emitting element 300, into the light of the first color, and the second wavelength conversion material WCP2 may be a material that converts the third color into the second color. The first wavelength conversion material WCP1 and the second wavelength conversion material WCP2 may be quantum dots, quantum rods, fluorescent materials, or the like. The quantum dots may include group IV-based nanocrystals, group II-VI-based compound nanocrystals, group III-V-based compound nanocrystals, group IV-VI-based nanocrystals, or combinations thereof.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particle may include an acrylic-based resin, a urethane-based resin, and the like.

The first binder 401 disposed in the first sub-pixel SPX1 may include the first wavelength conversion material WCP1 so that at least a portion of the light of the third color emitted from the unit light-emitting element 300 and incident on the first binder 401 may be converted into the light of the first color. Similarly, the second binder 402 disposed in the second sub-pixel SPX2 may include the second wavelength conversion material WCP2 so that at least a portion of the light of the third color emitted from the unit light-emitting element 300 and incident on the second binder 402 may be converted into the light of the second color.

The third binder 403 disposed in the third sub-pixel SPX3 transmits the light of the third color emitted from the unit light-emitting element 300 and incident on the third binder 403 while maintaining a wavelength thereof. The scatterers SCP included in the third binder 403 may serve to adjust an exit path of the light emitted through the third binder 403. The third binder 403 may not include a wavelength conversion material.

In the embodiment, although only the unit light-emitting element 300 emitting the light of the third color is included in each sub-pixel SPX, since the first to third binders 401, 402, and 403, which are disposed to correspond to the respective first to third sub-pixels SPX1, SPX2, and SPX3, further include the scatterers SCP and the wavelength conversion materials WCP1 and WCP2, the first to third sub-pixels SPX1, SPX2, and SPX3 may each emit light of each of the first to third colors.

Figure 21:
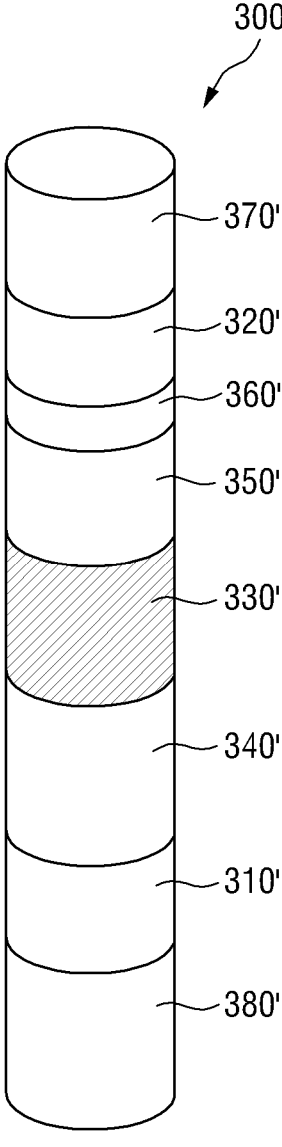
FIG. 21 is a schematic cross-sectional view of a light-emitting element according to another embodiment.

FIG. 21 is a schematic cross-sectional view of a unit light-emitting element according to another embodiment.

Referring to FIG. 21, a unit light-emitting element 300' according to the embodiment may further include a third semiconductor layer 340' disposed between a first semiconductor layer 310' and an active layer 330', a fourth semiconductor layer 350' and a fifth semiconductor layer 360' disposed between the active layer 330' and a second semiconductor layer 320', and a second electrode layer 380'. The unit light-emitting element 300' of FIG. 21 is different from the unit light-emitting element 300 shown in FIG. 4 in that semiconductor layers 340', 350', and 360' are further disposed, and the active layer 330' includes another element. In addition, the arrangement and structure of a first electrode layer 370' and of the electrode layer 370 of FIG. 4 are substantially the same. Hereinafter, repeated descriptions will be omitted, and descriptions will be provided based on differences from the above-described contents.

In the unit light-emitting element 300 shown in FIG. 4, the active layer 330 may include nitrogen (N) to emit blue light or green light. On the other hand, the unit light-emitting element 300' of FIG. 21 may be a semiconductor in which each of the active layer 330' and other semiconductor layers includes at least a portion of phosphorus (P). The unit light-emitting element 300' according to an embodiment may be a unit light-emitting element that emits red light having a central wavelength range ranging from about 620 nm to about 750 nm. However, the central wavelength range of the red light is not limited to the above-described range, and it should be understood that the central wavelength range includes all wavelength ranges that can be recognized as red in the art.

Specifically, in case that the first semiconductor layer 310' is an n-type semiconductor layer, and the unit light-emitting element 300' emits light of red, the first semiconductor layer 310' may include a semiconductor material having a chemical formula of $InxAlyGal-x-yP$ ($0 \leq x \leq 1$, $0 \leq y \leq 1$, and $0 \leq x+y \leq 1$). For example, the first semiconductor layer 310' may include at least one selected from among InAlGaP, GaP, AlGaP, InGaP, AlP, and InP that are doped with an n-type impurity. The first semiconductor layer 310' may be doped with a first conductive dopant, and as an example, the first conductive dopant may include Si, Ge, Sn, or the like. In an embodiment, the first semiconductor layer 310' may be n-AlGaInP doped with n-type Si. A thickness of the first semiconductor layer 310' may range from about 0.1 μm to about 0.5 μm, but the disclosure is not limited thereto.

The second semiconductor layer 320' may be a p-type semiconductor layer, and the second semiconductor layer 320' may include a semiconductor material having a chemical formula of $InxAlyGal-x-yP$ ($0 \leq x \leq 1$, $0 \leq y \leq 1$, and $0 \leq x+y \leq 1$) in case that the unit light-emitting element 300' emits light of red. For example, the second semiconductor layer 320' may include at least one selected from among InAlGaP, GaP, AlGaNP, InGaP, AlP, and InP that are doped with a p-type impurity. The second semiconductor layer 320' may be doped with a second conductive dopant, and as an example, the second conductive dopant may include Mg, Zn, Ca, Se, Ba, or the like. In an embodiment, the second semiconductor layer 320' may be p-GaN doped with p-type Mg. A thickness of the second semiconductor layer 320' may range from about 0.08 μm to about 0.25 μm, but the disclosure is not limited thereto.

The active layer 330' may be disposed between the first semiconductor layer 310' and the second semiconductor layer 320'. Similar to the active layer 330 of FIG. 4, the active layer 330' of FIG. 21 may also include a material having a single or multiple quantum well structure to emit light in a specific wavelength range. As an example, in case that the active layer 330' emits light in a red wavelength range, the active layer 330' may include a material such as AlGaP or AlInGaP. In particular, in case that the active layer 330' has a multiple quantum well structure in which quantum layers and well layers are alternately stacked, the quantum layer may contain a material such as AlGaP or AlInGaP, and the well layer may contain a material such as GaP or AlInP. In an embodiment, the active layer 330' may include AlGaInP as the quantum layer and AlInP as the well layer so that the active layer 330' emits red light having a central wavelength range of about 620 nm to about 750 nm.

The light-emitting element 300' may include a clad layer disposed adjacent to the active layer 330'. As shown in the drawing, the third semiconductor layer 340' disposed below the active layer 330' and between the active layer 330' and the first semiconductor layer 310' and the fourth semiconductor layer 350' disposed above the active layer 330' and between the active layer 330' and the second semiconductor layer 320' may be clad layers.

The third semiconductor layer 340' may be an n-type semiconductor, similar to the first semiconductor layer 310', and, as an example, the third semiconductor layer 340' may include a semiconductor material having a chemical formula of $InxAlyGal-x-yP$ ($0 \leq x \leq 1$, $0 \leq y \leq 1$, and $0 \leq x+y \leq 1$). In an embodiment, the first semiconductor layer 310' may be n-AlGaInP, and the third semiconductor layer 340' may be n-AlInP. However, the disclosure is not limited thereto.

The fourth semiconductor layer 350' may be an n-type semiconductor, similar to the second semiconductor layer 320', and, as an example, the fourth semiconductor layer 350' may include a semiconductor material having a chemical formula of $InxAlyGal-x-yP$ ($0 \leq x \leq 1$, $0 \leq y \leq 1$, and $0 \leq x+y \leq 1$). In an embodiment, the second semiconductor layer 320' may be p-GaP, and the fourth semiconductor layer 350' may be p-AlInP.

The fifth semiconductor layer 360' may be disposed between the fourth semiconductor layer 350' and the second semiconductor layer 320'. The fifth semiconductor layer 360' may include a p-type semiconductor similar to the second semiconductor layer 320' and the fourth semiconductor layer 350'. In some embodiments, the fifth semiconductor layer 360' may serve to reduce a difference in a lattice constant between the fourth semiconductor layer 350' and the second semiconductor layer 320'. That is, the fifth semiconductor layer 360' may be a TSBR layer. As an example, the fifth semiconductor layer 360' may include p-GaInP, p-AlInP, p-AlGaInP, or the like, but the disclosure is not limited thereto.

The unit light-emitting element 300' according to the embodiment may include the first electrode layer 370' and the second electrode layer 380'. The first electrode layer 370' may be disposed on a surface of the second semiconductor layer 320', and the second electrode layer 380' may be disposed on a surface of the first semiconductor layer 310'. The first electrode layer 370' may be disposed on an upper surface of the second semiconductor layer 320', and the second electrode layer 380' may be disposed on a lower surface of the second semiconductor layer 310'. The element part including the unit light-emitting element 300' of FIG. 21 and the element part including the unit light-emitting element 300 of FIG. 4 may also be manufactured in substantially a same manner.

Figure 22:
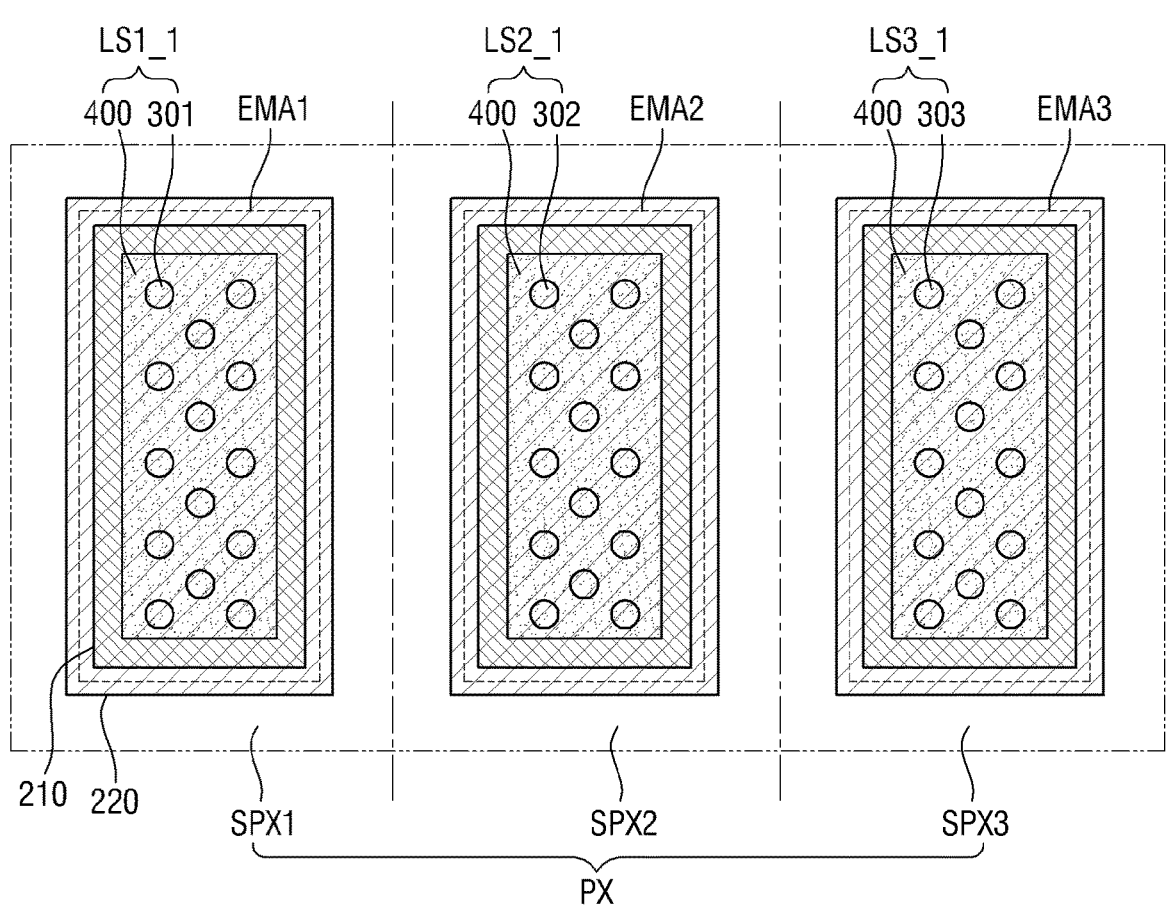
FIG. 22 is a schematic plan view illustrating a pixel of a display device according to yet another embodiment.
Figure 22:
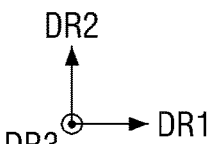

FIG. 22 is a schematic plan view illustrating a pixel of a display device according to yet another embodiment. Referring to FIG. 22, a display device 10 according to the embodiment is different from that of the embodiment of FIG. 2 in that each element part disposed to correspond to each sub-pixel includes different types of unit light-emitting elements.

Referring to FIG. 22, in an embodiment in which light of each of first to third colors is emitted in a light-emitting area EMA of each sub-pixel SPX, an element part LS may include a first element part LS1_1, a second element part LS2_1, and a third element part LS3_1 disposed to correspond to the respective sub-pixels SPX.

The first element part LS1_1 is disposed in a first sub-pixel SPX1 that emits the light of the first color. The first element part LS1 may include first unit light-emitting elements 301 disposed to be spaced apart from each other and a binder 400. The first unit light-emitting element 301 may be a unit light-emitting element that emits the light of the first color.

The second element part LS2_1 is disposed in a second sub-pixel SPX2 that emits the light of the second color. The second element part LS2_1 may include second unit light-emitting elements 302 disposed to be spaced apart from each other and the binder 400. The second unit light-emitting element 302 may be a unit light-emitting element that emits the light of the second color.

The third element part LS3_1 is disposed in a third sub-pixel SPX3 that emits the light of the third color. The third element part LS3_1 may include third unit light-emitting elements 303 disposed to be spaced apart from each other and the binder 400. The third unit light-emitting element 303 may be a unit light-emitting element that emits the light of the third color.

The first unit light-emitting element 301 and the light-emitting element 300' of FIG. 21 may have a same structure, and the first unit light-emitting element 301 emits the light of the first color. The second unit light-emitting element 302, the third unit light-emitting element 303, and the unit light-emitting element 300 of FIG. 4 may have a same structure, and the second unit light-emitting element 302 and the third unit light-emitting element 303 may emit the light of the second color and the light of the third color, respectively, as described above. In an embodiment, the first unit light-emitting element 301 may be a unit light-emitting element that emits the light of the first color that is red, the second unit light-emitting element 302 may be a unit light-emitting element that emits the light of the second color that is green, and the third unit light-emitting element 303 may be a unit light-emitting element that emits the light of third color that is blue.

As described above, the unit light-emitting element 300 or 300' may generate light of different colors depending on the composition of the active layers 330 or 330', and may include a larger number of semiconductor layers in some embodiments. Different types of unit light-emitting elements 301, 302, and 303 may be disposed in sub-pixels SPX, respectively, included in a pixel PX of the display device, and may emit light of different colors, respectively. Accordingly, even in case that the wavelength conversion material is not disposed in the binder of the element part LS, the unit light-emitting elements 301, 302, and 303 may emit light of different colors, respectively.

Figure 23:
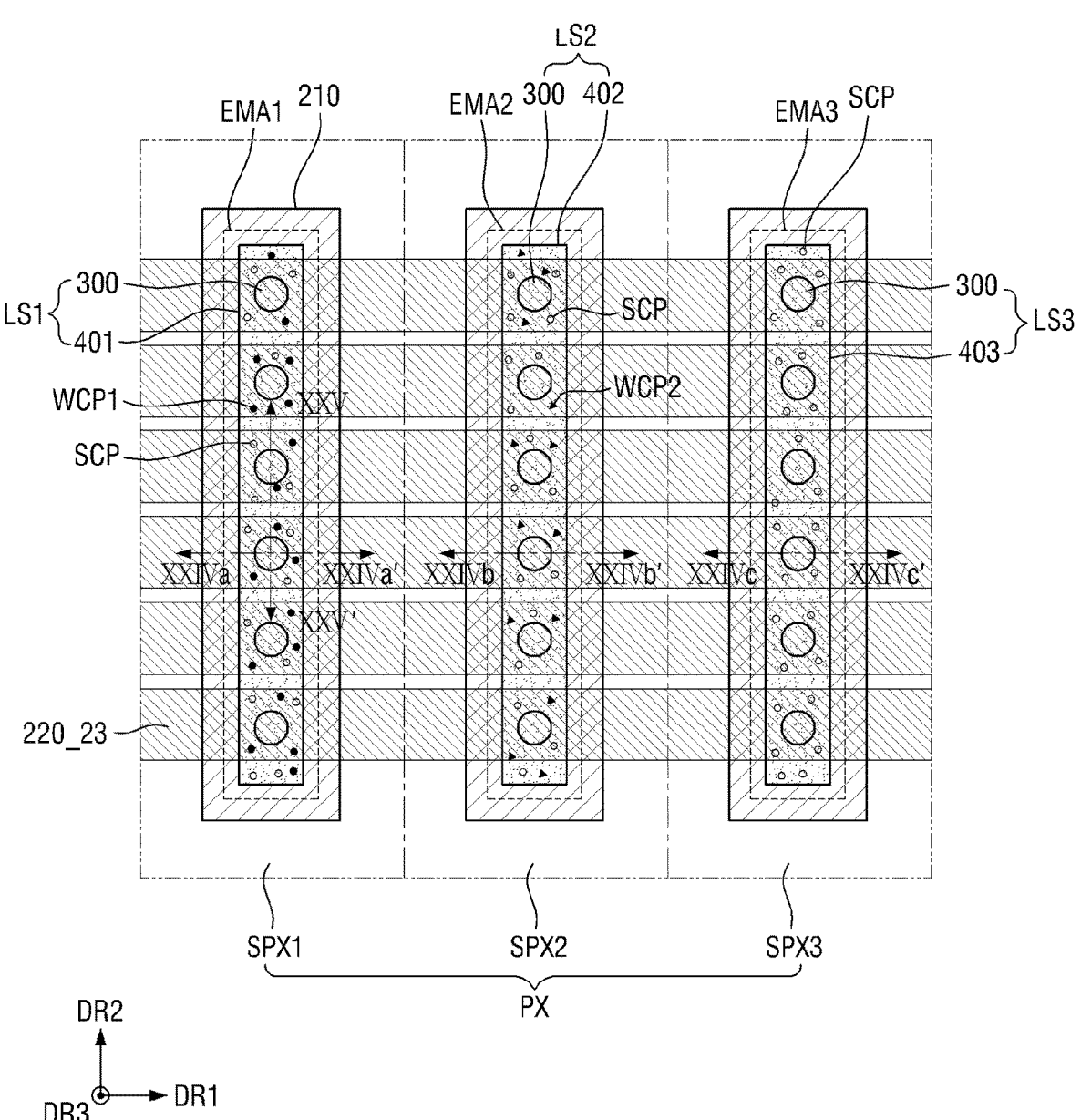
FIG. 23 is a schematic plan view illustrating a pixel of a display device according to yet another embodiment.
Figure 24:
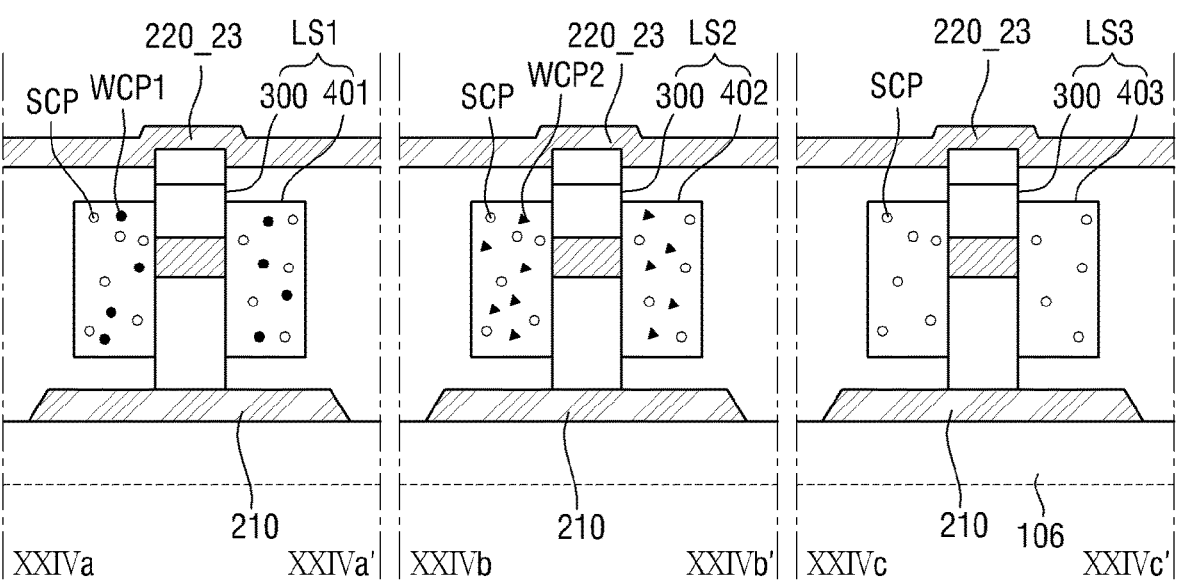
FIG. 24 is a set of schematic cross-sectional views illustrating an example taken along lines XXIVa-XXIVa', XXIVb-XXIVb', and XXIVc-XXIVc' of FIG. 23.
Figure 25:
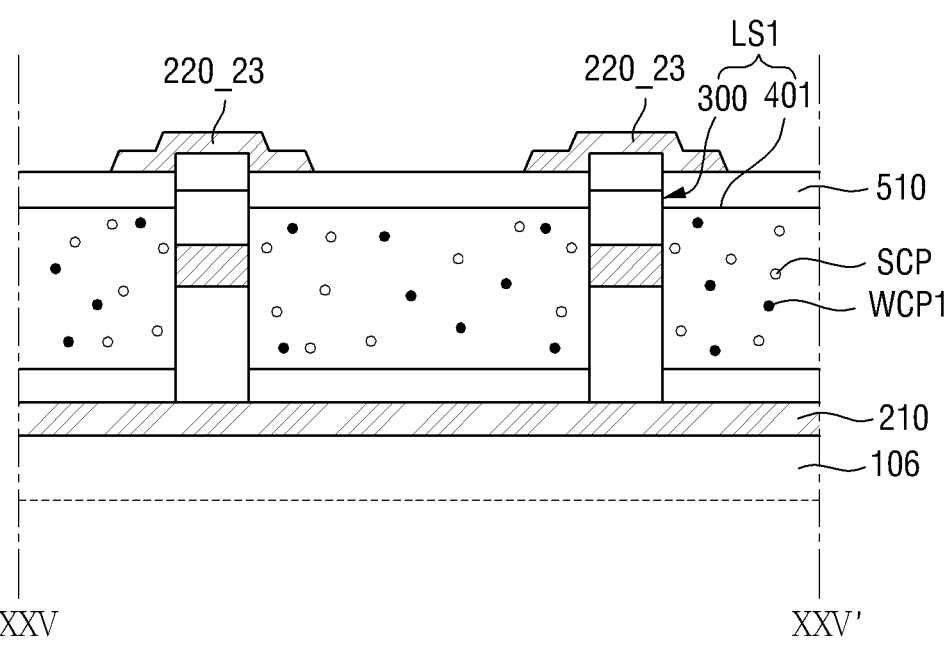
FIG. 25 is a schematic cross-sectional view illustrating an example taken along line XXV-XXV' of FIG. 23.

FIG. 23 is a schematic plan view illustrating a pixel of a display device according to yet another embodiment. FIG. 24 is a set of schematic cross-sectional views illustrating an example taken along lines XXIVa-XXIVa', XXIVb-XXIVb', and XXIVc-XXIVc' of FIG. 23. FIG. 25 is a schematic cross-sectional view illustrating an example taken along line XXV-XXV' of FIG. 23. Referring to FIGS. 23 to 25, unit light-emitting elements of an element part according to the embodiment are arranged to extend in a direction in a column. In addition, a difference from the embodiment of FIG. 19 is that a second electrode disposed in a pixel PX is disposed to extend in a direction perpendicular to a direction in which the arrangement of the unit light-emitting elements extends.

Hereinafter, a description of the configuration of first to third binders 401, 402, and 403 respectively disposed in first to third sub-pixels SPX1, SPX2, and SPX3 included in a pixel PX will be omitted, and descriptions will be provided based on differences from the above-described contents.

Referring to FIGS. 23 to 25, the first to third sub-pixels SPX1, SPX2, and SPX3 included in a pixel PX may be disposed adjacent in the first direction DR1. A first electrode 210 disposed in each sub-pixel SPX is disposed in each of first to third light-emitting areas EMA1, EMA2, and EMA3 respectively corresponding to the sub-pixels SPX1, SPX2, and SPX3 and has a rectangular shape extending substantially in the second direction DR2. As described above, the first electrode 210 disposed in a sub-pixel SPX is disposed to be spaced apart from the first electrode 210 disposed in another sub-pixel SPX disposed adjacent in the first direction DR1.

A first element part LS1 may be disposed on the first electrode 210 disposed in the first sub-pixel SPX1. The first element part LS1 may include unit light-emitting elements 300 arranged in a direction and the first binder 401. The direction in which the unit light-emitting elements 300 included in the first element part LS1 according to the embodiment are arranged may be parallel to the second direction DR2. That is, in case that each sub-pixel SPX included in a pixel PX is disposed adjacent in the first direction DR1, the arrangement direction of the unit light-emitting elements 300 may be the second direction DR2. A separation distance between two unit light-emitting elements 300 disposed adjacent in the second direction DR2 may be the same.

A second element part LS2 may be disposed on the first electrode 210 disposed in the second sub-pixel SPX2. The second element part LS2 may include unit light-emitting elements 300 arranged in a direction and the second binder 402. The direction in which the unit light-emitting elements 300 included in the second element part LS2 according to the embodiment are arranged may be parallel to the second direction DR2. A separation distance between two unit light-emitting elements 300 disposed adjacent in the second direction DR2 may be the same.

A third element part LS3 may be disposed on the first electrode 210 disposed in the third sub-pixel SPX3. The third element part LS3 may include unit light-emitting elements 300 arranged in a direction and the third binder 403. The direction in which the unit light-emitting elements 300 included in the third element part LS3 according to the embodiment are arranged may be parallel to the second direction DR2. A separation distance between two unit light-emitting elements 300 disposed adjacent in the second direction DR2 may be the same. As described above, since the separation distances between the unit light-emitting elements 300, which are included in each of the element parts LS1, LS2, and LS3, in the second direction DR2 are the same, the arrangement of the unit light-emitting elements 300 disposed in a pixel PX may have a matrix form in a plan view.

In the embodiment, a second electrode 220_23 may include second electrode patterns. Specifically, the second electrode patterns constituting the second electrode 220_23 may be formed in a shape extending in the first direction DR1, and may be disposed to be spaced apart from each other in the second direction DR2. The first direction DR1 may be a direction perpendicular to a direction in which the unit light-emitting elements 300 are arranged in a sub-pixel SPX, or may be an arrangement direction of each sub-pixel SPX included in a pixel PX.

The second electrode 220_23 may extend in the first direction DR1 and may be disposed over other sub-pixels SPX. Accordingly, the second electrode 220_23 according to the embodiment may transmit an electrical signal to the unit light-emitting element 300 disposed in the first to third sub-pixels SPX1, SPX2, and SPX3 included in a pixel PX.

Accordingly, in a cross-sectional view, the second electrode 220_23 may be disposed on the first insulating layer 510 and the unit light-emitting elements 300 and may be entirely disposed on the unit light-emitting elements 300 disposed adjacent to each other in the first direction DR1 and the first insulating layer 510. That is, the second electrode 220_23 may be integrally disposed to cover all of the unit light-emitting elements 300 disposed adjacent in the first direction DR1 in each of the first sub-pixel SPX1, the second sub-pixel SPX2, and the third sub-pixel SPX3.

On the other hand, in a cross-sectional view, the second electrodes 220_23 may be disposed on each of the unit light-emitting elements 300 disposed adjacent in the second direction DR2 in a same sub-pixel SPX and the first insulating layer 510 to be spaced apart from each other. That is, the second electrode 220_23 may be patterned and disposed to cover only an end portion of a unit light-emitting element 300 to correspond to each of the unit light-emitting elements 300 disposed adjacent in the second direction DR2 in a same sub-pixel SPX.

Figure 26:
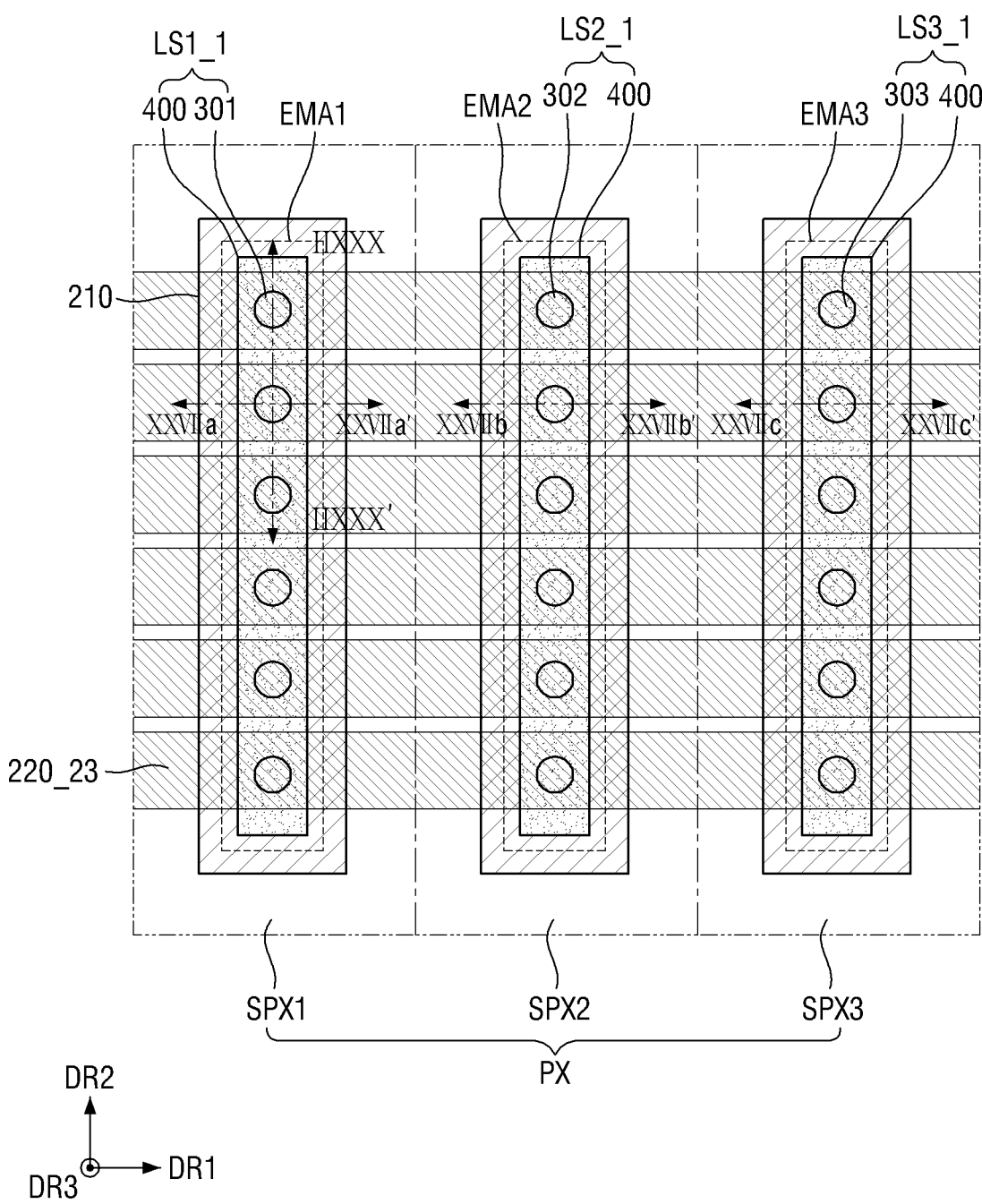
FIG. 26 is a schematic plan view illustrating a pixel of a display device according to yet another embodiment.
Figure 27:
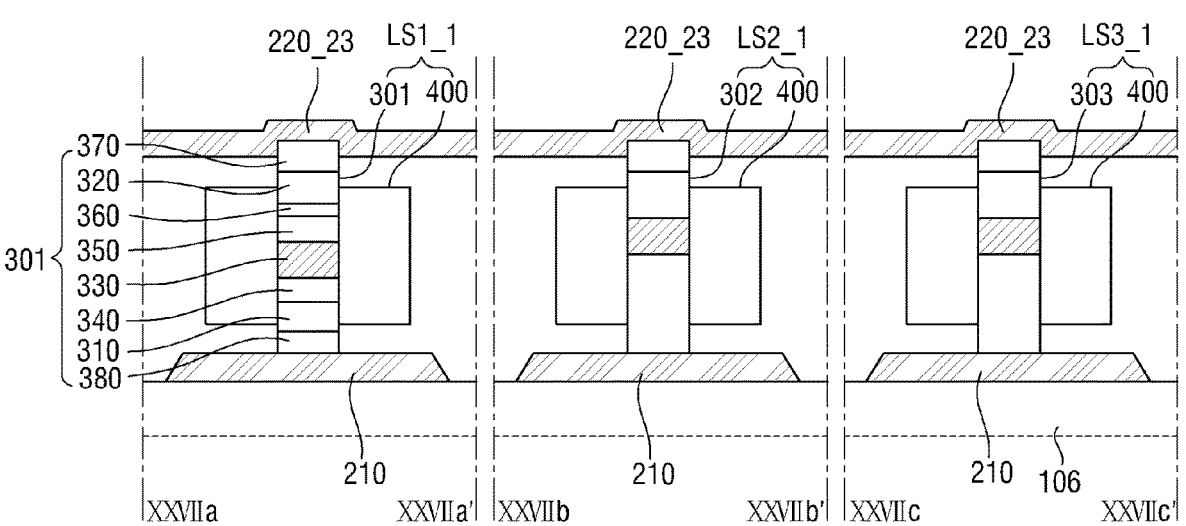
FIG. 27 is a set of schematic cross-sectional views illustrating an example taken along lines XXVIIa-XXVIIa', XXVIIb-XXVIIb', and XXVIIc-XXVIIc' of FIG. 26.
Figure 28:
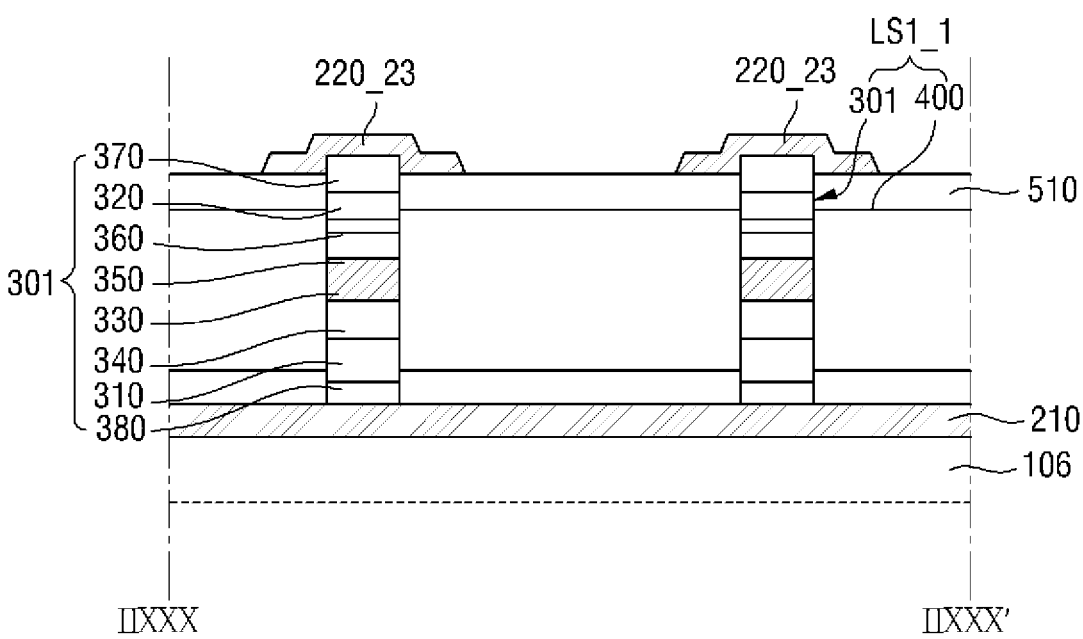
FIG. 28 is a schematic cross-sectional view illustrating an example taken along line IIXXX-IIXXX' of FIG. 26.

FIG. 26 is a schematic plan view illustrating a pixel of a display device according to yet another embodiment. FIG. 27 is a set of schematic cross-sectional views illustrating an example taken along lines XVIIa-XXVIIa', XXVIIb-XXVIIb', and XXVIIc-XXVIIc' of FIG. 26. FIG. 28 is a schematic cross-sectional view illustrating an example taken along line IIXXX-IIXXX' of FIG. 26. Referring to FIGS. 26 to 28, a difference from the embodiment of the FIGS. 23 to 25 is that first to third element parts disposed in first to third sub-pixels SPX1, SPX2, and SPX3 included in a pixel PX include first to third unit light-emitting elements 301, 302, and 303, respectively, and each binder does not include scatterers or wavelength conversion materials.

Hereinafter, descriptions of the arrangement of a first electrode, the element part, and a second electrode disposed in a pixel PX will be omitted, and descriptions will be provided based on differences from the contents described above in FIGS. 23 to 25

Referring to FIGS. 26 to 28, in the embodiment, a second electrode 220_23 may be disposed on a first insulating layer 510 and unit light-emitting elements 300, and may extend in a direction perpendicular to a direction in which the unit light-emitting elements 300 are arranged in a sub-pixel SPX.

Specifically, the second electrode 220_23 may be disposed on the first insulating layer 510 to cover all end portions of the first unit light-emitting element 301, the second unit light-emitting element 302, and the third unit light-emitting element 303 that are arranged to extend in the first direction DR1 in a same row and respectively disposed in the first sub-pixel SPX1, the second sub-pixel SPX2, and the third sub-pixel SPX3. Accordingly, the second electrode 220_23 according to the embodiment may transmit an electrical signal to each of the unit light-emitting elements 301, 302, and 303 arranged in a same row and respectively disposed in different sub-pixels SPX.

Figure 29:
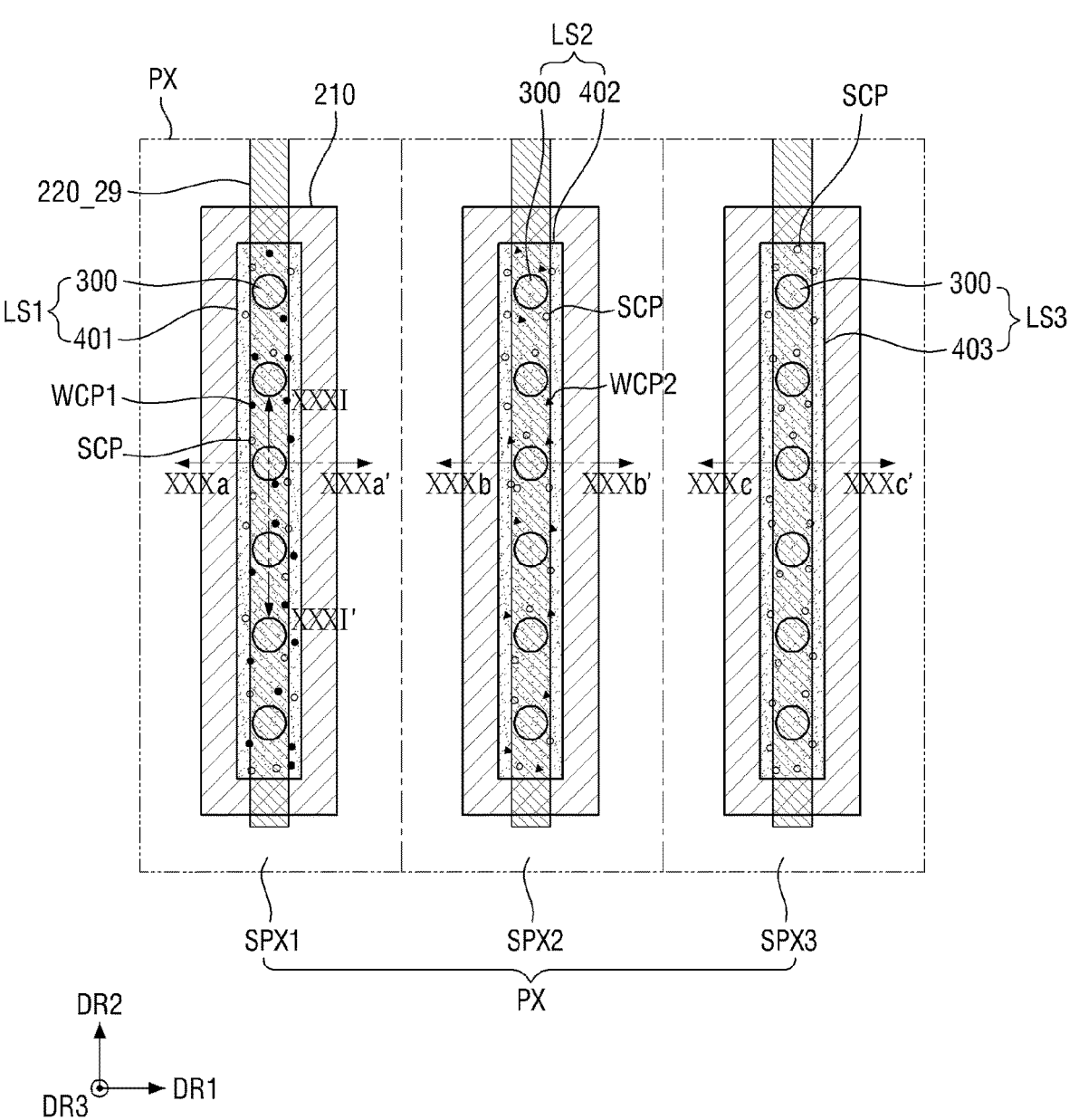
FIG. 29 is a schematic plan view illustrating a pixel of a display device according to yet another embodiment.
Figure 30:
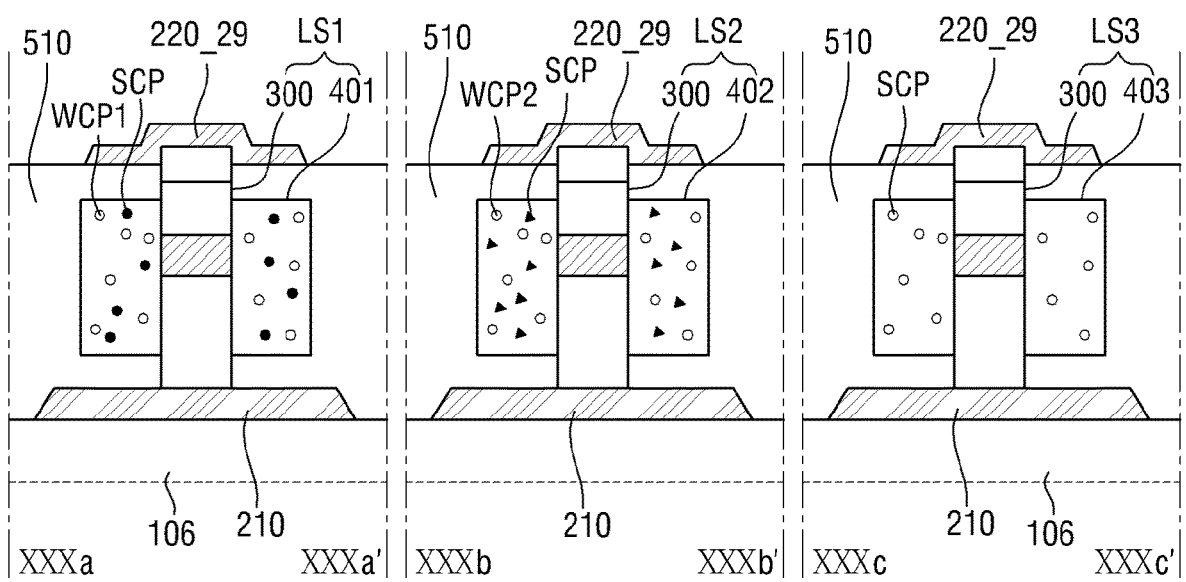
FIG. 30 is a set of schematic cross-sectional views illustrating an example taken along lines XXXa-XXXa', XXXb-XXXb', and XXXc-XXXc' of FIG. 29.
Figure 31:
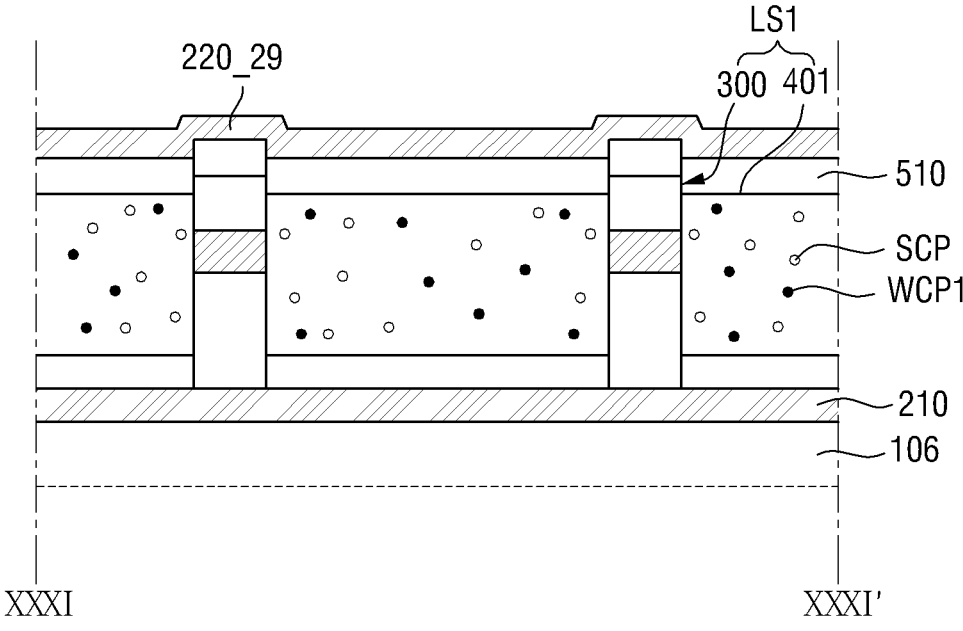
FIG. 31 is a schematic cross-sectional view illustrating an example taken along line XXXI-XXXI' of FIG. 29.

FIG. 29 is a schematic plan view illustrating a pixel of a display device according to yet another embodiment. FIG. 30 is a set of schematic cross-sectional views illustrating an example taken along lines XXXa-XXXa', XXXb-XXXb', and XXXc-XXXc' of FIG. 29. FIG. 31 is a schematic cross-sectional view illustrating an example taken along line XXXI-XXXI' of FIG. 29. Referring to FIGS. 29 to 31, a difference from the embodiment of FIGS. 23 to 25 is that second electrodes included in a pixel are disposed to be spaced apart from each other in each sub-pixel, and a direction in which the second electrode extends is parallel to an arrangement direction of unit light-emitting elements disposed in a sub-pixel.

Hereinafter, descriptions of the arrangement of a first electrode and an element part disposed in a pixel PX will be omitted, and descriptions will be provided based on differences from the contents described above in FIGS. 23 to 25

Referring to FIGS. 29 to 31, each second electrode 220_29 according to the embodiment has a shape extending in the second direction DR2. The second electrodes 220_29 disposed in a pixel PX may be disposed to be spaced apart from each other in the first direction DR1 to correspond to sub-pixels SPX, respectively. Accordingly, the second electrode 220_29 according to the embodiment may be entirely disposed on unit light-emitting elements 300 disposed in the sub-pixel SPX so as to cover all of the unit light-emitting elements 300 arranged in the second direction DR2 in each sub-pixel SPX.

Specifically, in first to third sub-pixels SPX1, SPX2, and SPX3 disposed adjacent in the first direction DR1, the second electrode 220_29 disposed on the unit light-emitting elements 300 of the first sub-pixel SPX1, the second electrode 220_29 disposed on the unit light-emitting elements 300 of the second sub-pixel SPX2, and the second electrode 220_29 disposed on the unit light-emitting elements 300 of the third sub-pixel SPX3 may be disposed to be spaced apart from each other in the first direction DR1.

In addition, in the unit light-emitting elements 300 arranged to extend in the second direction DR2 and disposed in a sub-pixel SPX to be spaced apart from each other, the second electrodes 220_29 may be entirely disposed on the unit light-emitting elements 300 disposed in a sub-pixel SPX and the first insulating layer 510. Accordingly, the second electrode 220_29 according to the embodiment may transmit an electrical signal to the unit light-emitting elements 300 disposed in a same sub-pixel SPX.

Figure 32:
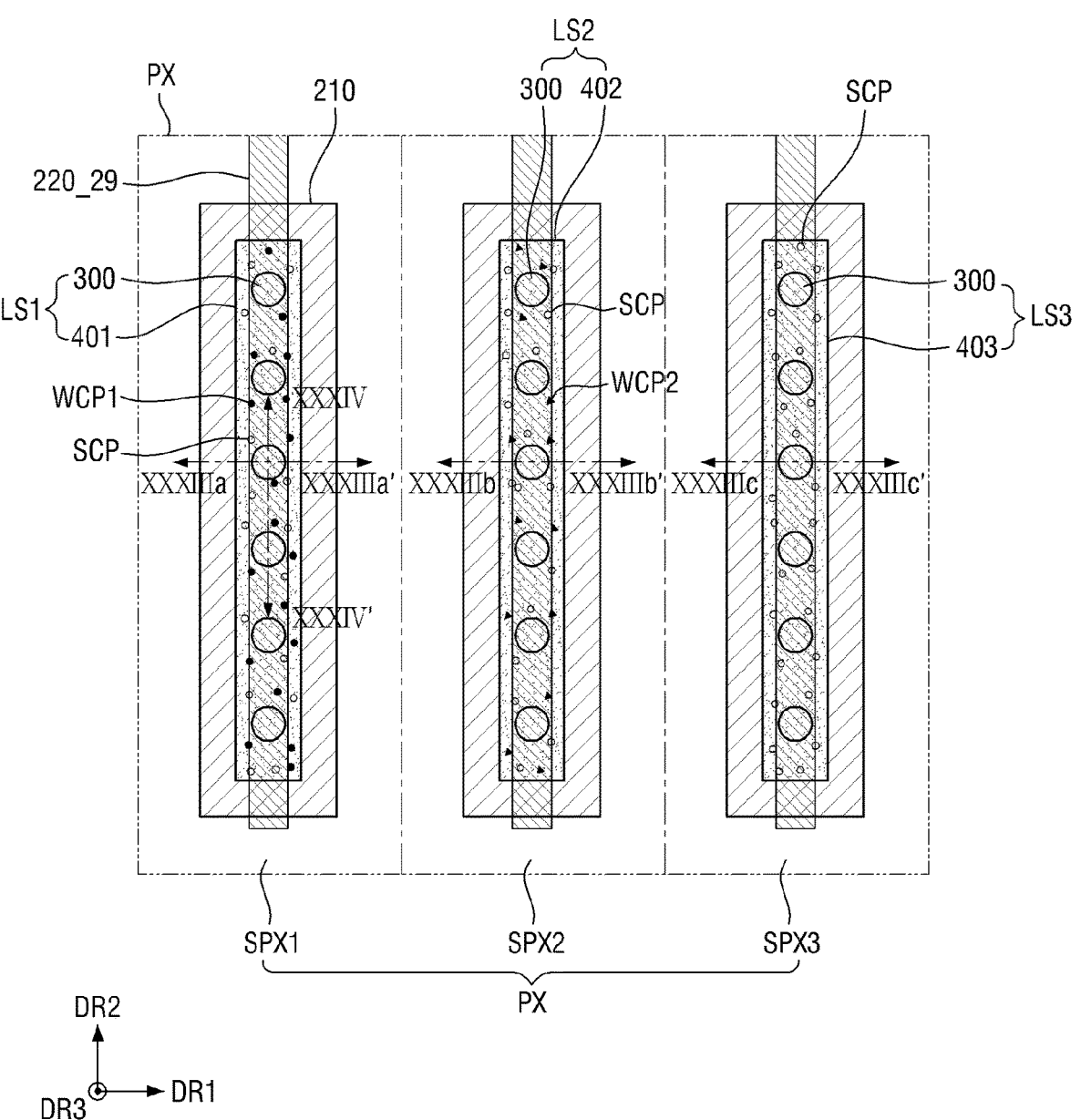
FIG. 32 is a schematic plan view illustrating a pixel of a display device according to yet another embodiment.
Figure 33:
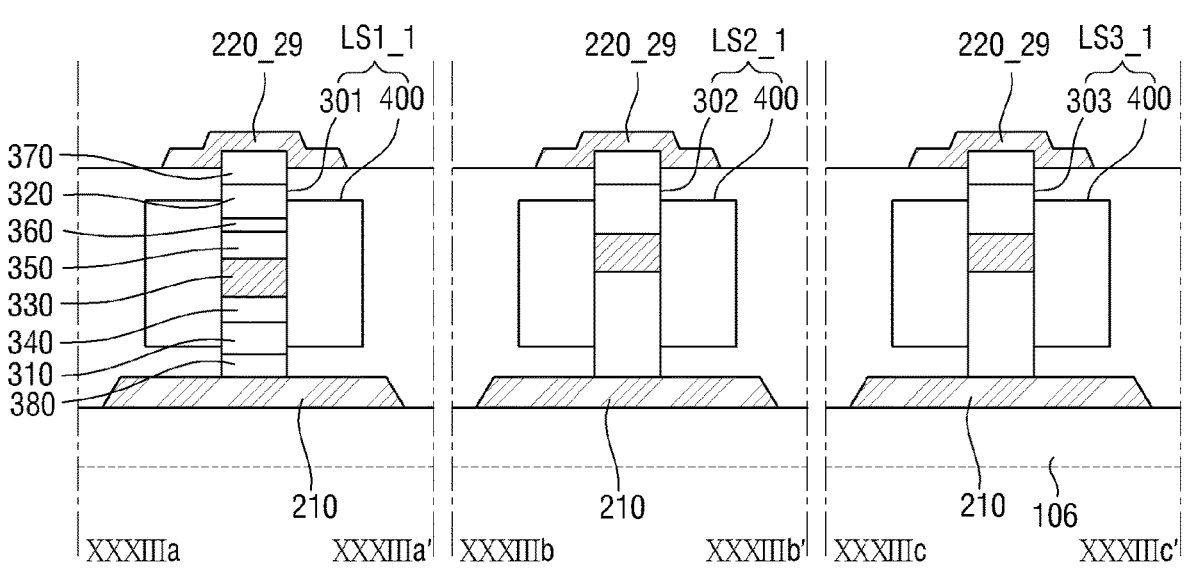
FIG. 33 is a set of schematic cross-sectional views illustrating an example taken along lines XXXIIIa-XXXIIIa', XXXIIIb-XXXIIIb', XXXIIIc-XXXIIIc' of FIG. 32.
Figure 34:
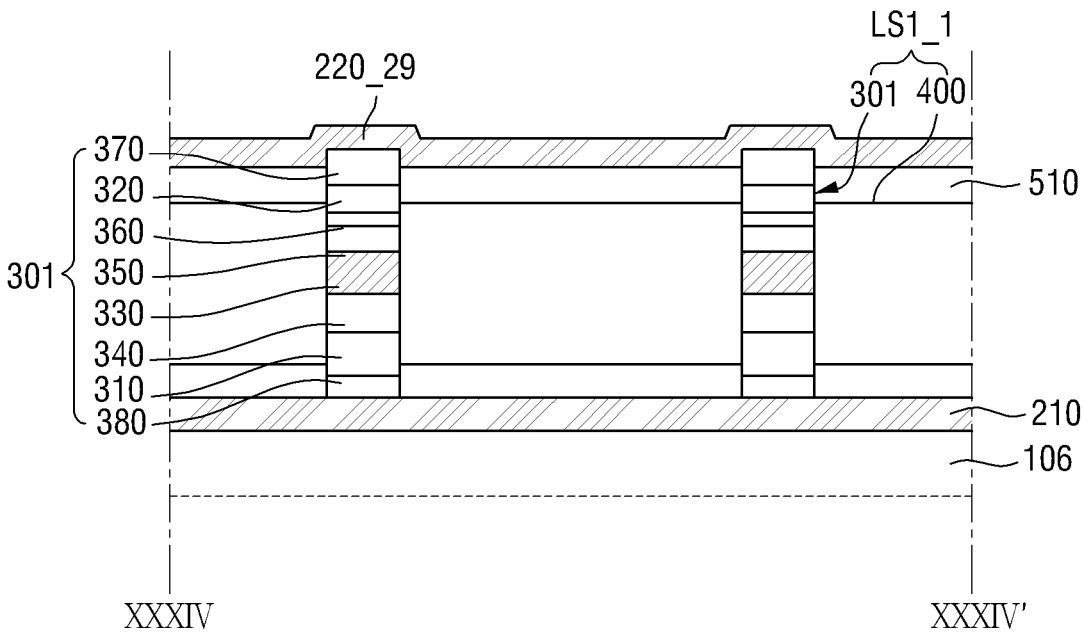
FIG. 34 is a schematic cross-sectional view illustrating an example taken along line XXXVI-XXXVI' of FIG. 32.

FIG. 32 is a schematic plan view illustrating a pixel of a display device according to yet another embodiment. FIG. 33 is a set of schematic cross-sectional views illustrating an example taken along lines XXXIIIa-XXXIIIa', XXXIIIb-XXXIIIb', XXXIIIc-XXXIIIc' of FIG. 32. FIG. 34 is a schematic cross-sectional view illustrating an example taken along line XXXIV-XXXIV' of FIG. 32. Referring to FIGS. 32 to 34, a difference from the embodiment of the FIGS. 29 to 31 is that first to third element parts disposed in first to third sub-pixels SPX1, SPX2, and SPX3 included in a pixel PX include first to third unit light-emitting elements 301, 302, and 303, respectively, and each binder does not include scatterers or wavelength conversion materials.

Referring to FIGS. 32 to 34, each second electrode 220_29 according to the embodiment has a shape extending in the second direction DR2. The second electrodes 220_29 disposed in a pixel PX may be disposed to be spaced apart from each other in the first direction DR1 to correspond to sub-pixels SPX, respectively. Accordingly, the second electrode 220_29 according to the embodiment may be entirely disposed on the unit light-emitting elements to cover all of the first to third unit light-emitting elements 301, 302, and 303 arranged in the second direction DR2 in the first to third sub-pixels SPX, respectively.

Specifically, the second electrode 220_29 disposed on the first unit light-emitting elements 301 disposed in the first sub-pixel SPX1, the second electrode 220_29 disposed on the second unit light-emitting elements 302 disposed in the second sub-pixel SPX2, and the second electrode 220_29 disposed on the third unit light-emitting elements 303 disposed in the third sub-pixel SPX3 may be disposed to be spaced apart from each other in the first direction DR1.

The second electrodes 220_29, which is disposed on the unit light-emitting elements 301 spaced apart from each other in the second direction DR2 in the first sub-pixel SPX1, may be entirely disposed on the unit light-emitting elements 301 disposed in the first sub-pixel SPX1 and a first insulating layer 510. Accordingly, the second electrode 220_29 according to the embodiment may transmit an electrical signal to the unit light-emitting elements disposed in a same sub-pixel SPX. Each of the first, second, and third sub-pixels SPX1, SPX2, and SPX3 may include contact holes CNTD and CNTS.

Figure 35:
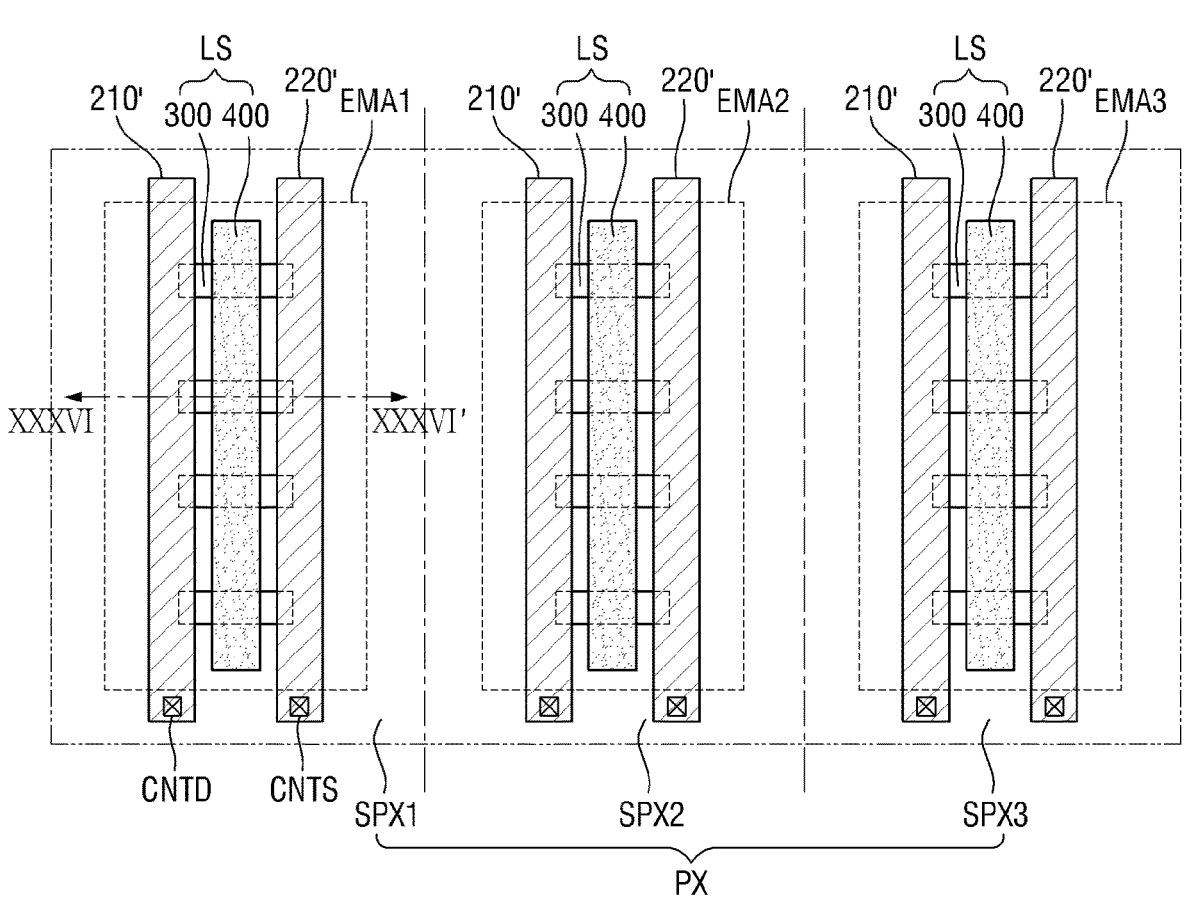
FIG. 35 is a schematic plan view illustrating a pixel of a display device according to yet another embodiment.
Figure 35:
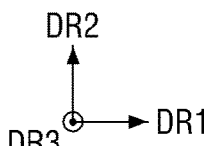
Figure 36:
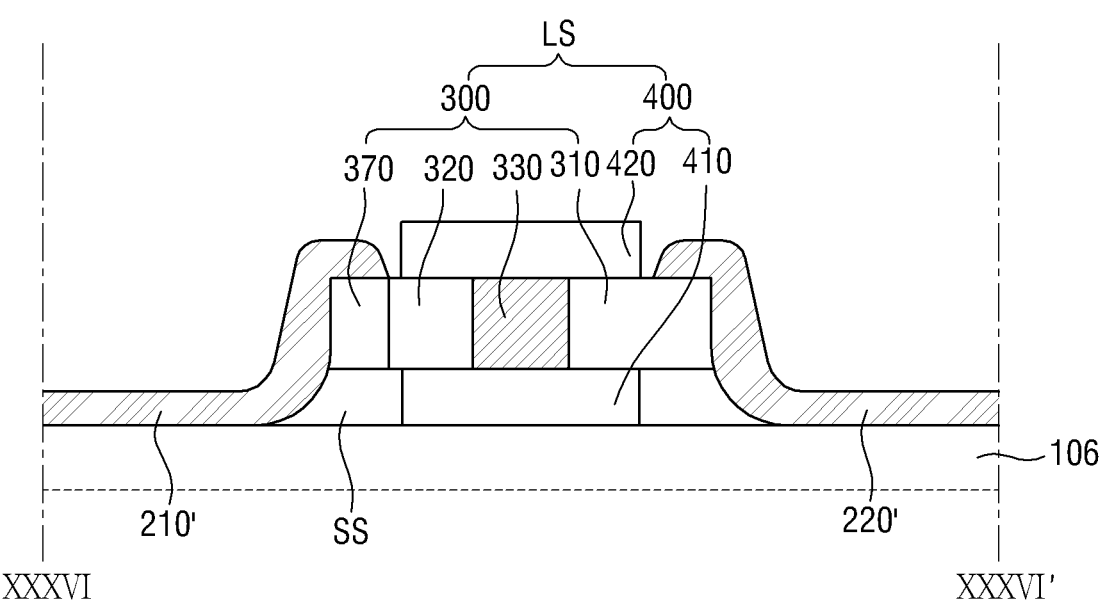
FIG. 36 is a schematic cross-sectional view illustrating an example taken along line XXXVI-XXXVI' of FIG. 35.

FIG. 35 is a schematic plan view illustrating a pixel of a display device according to yet another embodiment. FIG. 36 is a schematic cross-sectional view illustrating an example taken along line XXXVI-XXXVI' of FIG. 35. Referring to FIGS. 35 and 36, the display device according to the embodiment is different from that of the embodiment described above in that a direction in which a unit light-emitting element 300 included in an element part LS extends is substantially parallel to a plane including an upper surface of a substrate SUB.

Referring to FIG. 35, a first electrode 210' and a second electrode 220' may each be disposed adjacent to a center portion of each sub-pixel SPX in a plan view. The first electrode 210' and the second electrode 220' may each have a shape extending in the second direction DR2 in a plan view, and may be disposed to be spaced apart from each other in the first direction DR1. The first electrode 210' and the second electrode 220' may be disposed substantially in a light-emitting area EMA and extend in the second direction DR2 and a direction opposite to the second direction DR2 to be partially disposed in a non-light-emitting area.

The element part LS may be disposed between the first electrode 210' and the second electrode 220'. An end portion of the unit light-emitting element 300 disposed in the element part LS is electrically connected to the first electrode 210', and another end portion of the unit light-emitting element 300, which is opposite to the end portion, may be electrically connected to the second electrode 220'

Unit light-emitting elements 300 may be disposed to be spaced apart from each other in the second direction DR2 and aligned to be substantially parallel to each other. A separation distance between the unit light-emitting elements 300 in the second direction DR2 may be substantially constant. In addition, as described above, the light-emitting element 300 has a shape extending in a direction, and a direction in which the first electrode 210' and the second electrode 220' extend may be substantially perpendicular to a direction in which each of the unit light-emitting elements 300 included in the element part LS extends. However, the disclosure is not limited thereto, and the unit light-emitting element 300 may be diagonally disposed without being perpendicular to the direction in which the first electrode 210' and the second electrode 220' extend.

The unit light-emitting elements 300 may be disposed by being fixed by a binder 400. Accordingly, a type of a semiconductor layer located at an end portion of each of the unit light-emitting elements 300 and a type of a semiconductor layer located at another end portion thereof may be identical to each other on an element part LS. For example, in case that an end portion of the unit light-emitting element 300 on which a specific semiconductor layer is disposed is defined, an element part LS may include only the unit light-emitting elements 300 each having an end portion disposed toward the first electrode 210'.

Referring to FIGS. 35 and 36, the element part LS may be disposed on a planarization layer 106. The element part LS is disposed on the planarization layer 106 such that the extending direction of the unit light-emitting element 300 is parallel to the upper surface of the substrate SUB, and thus the binder 400 may be disposed between the planarization layer 106 and the unit light-emitting element 300.

The binder 400 is integrated and formed to surround an outer surface of the unit light-emitting element 300, but may include a first area 410 disposed below the unit light-emitting element 300 and between the unit light-emitting element 300 and the planarization layer 106 in a cross-sectional view, and a second area 420 disposed above the unit element 300, that is, on a side opposite to a side in which the planarization layer 106 is disposed. Since the second area 420 of the binder is disposed between the unit light-emitting element 300 and the planarization layer 106, the unit light-emitting elements 300 may be disposed to be spaced apart from the planarization layer 106 in the third direction DR3.

The first electrode 210' may be disposed on the planarization layer 106. The first electrode 210' may be disposed on the planarization layer 106, and at least a partial area of the first electrode 210' may contact an end portion of the unit light-emitting element 300 exposed by the binder 400. The first electrode 210' may be disposed to cover at least a portion of an end portion of the unit light-emitting element 300 exposed by the binder 400, and may extend to the outside of the unit light-emitting element 300 to be disposed on the planarization layer 106.

The second electrode 220' may be disposed on the planarization layer 106. The second electrode 220' may be disposed on the planarization layer 106, and at least a partial area of the second electrode 220' may contact the another end portion of the unit light-emitting element 300, which is opposite to the end portion, exposed by the binder 400. The second electrode 220' may be disposed to cover at least a portion of the another end portion of the unit light-emitting element 300 exposed by the binder 400, and may extend to the outside of the unit light-emitting element 300 to be disposed on the planarization layer 106. The end portion and the another end portion of the unit light-emitting element 300 may be electrically connected to the first electrode 210' and the second electrode 220', respectively, to receive an electrical signal.

In case that the first electrode 210' and the second electrode 220' are disposed at an end portion and another end portion of the unit light-emitting element 300, respectively, the second area 420 of the binder disposed above the unit light-emitting element 300 may be disposed between the first electrode 210' and the second electrode 220'. In addition, the unit light-emitting element 300 may be disposed to be spaced apart from the planarization layer 106 due to the first area 410 of the binder disposed below the unit light-emitting element 300. In addition, the unit light-emitting element 300 is formed on the first area 410 of the binder to protrude to the outside of an upper surface of the first area 410 of the binder. Accordingly, in a process of forming the first electrode 210' and the second electrode 220' on the end portion and the another end portion of the unit light-emitting element 300, a separation space SS in which the electrodes 210' and 220' are not disposed may be formed between a lower portion of the unit light-emitting element 300 protruding to the outside of the first area 410 of the binder and the planarization layer 106. That is, the separation space SS in which a member is not disposed may be formed between the first area 410 of the binder and the first and second electrodes 210' and 220'.

Each of the electrodes 210' and 220' may be formed in a structure, in which one or more layers of a transparent conductive material and a metal layer having a high reflectance are stacked, or may be formed as a single layer including the transparent conductive material and the metal layer. In an embodiment, each of the electrodes 210' and 220' may have a stacked structure of ITO/Ag/ITO/IZO or may be an alloy including Al, Ni, lanthanum (La), and the like. However, the disclosure is not limited thereto.

Figure 37:
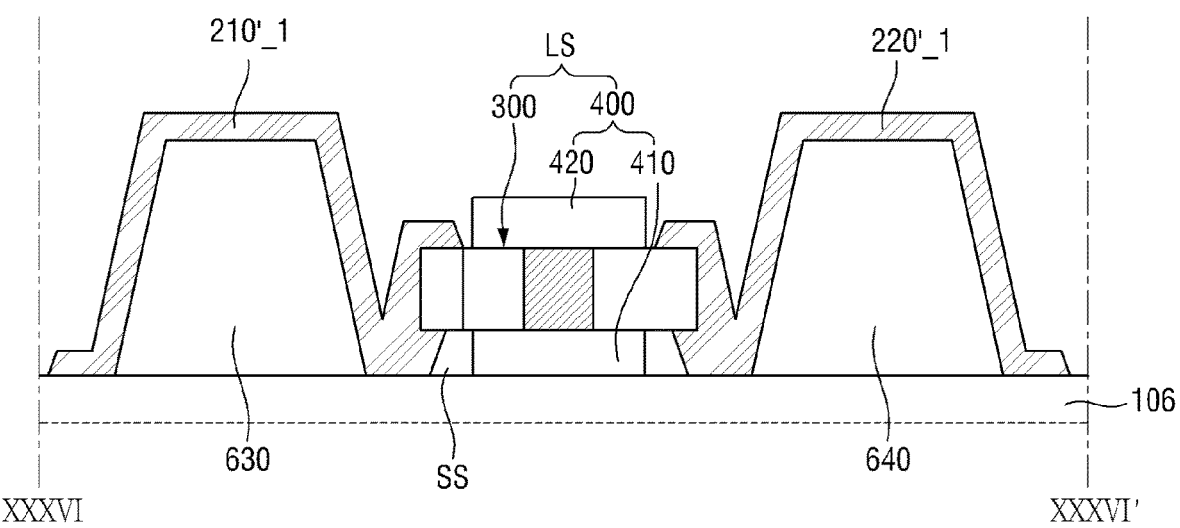
FIG. 37 is a schematic cross-sectional view illustrating another example taken along line XXXVI-XXXVI' of FIG. 35.
Figure 38:
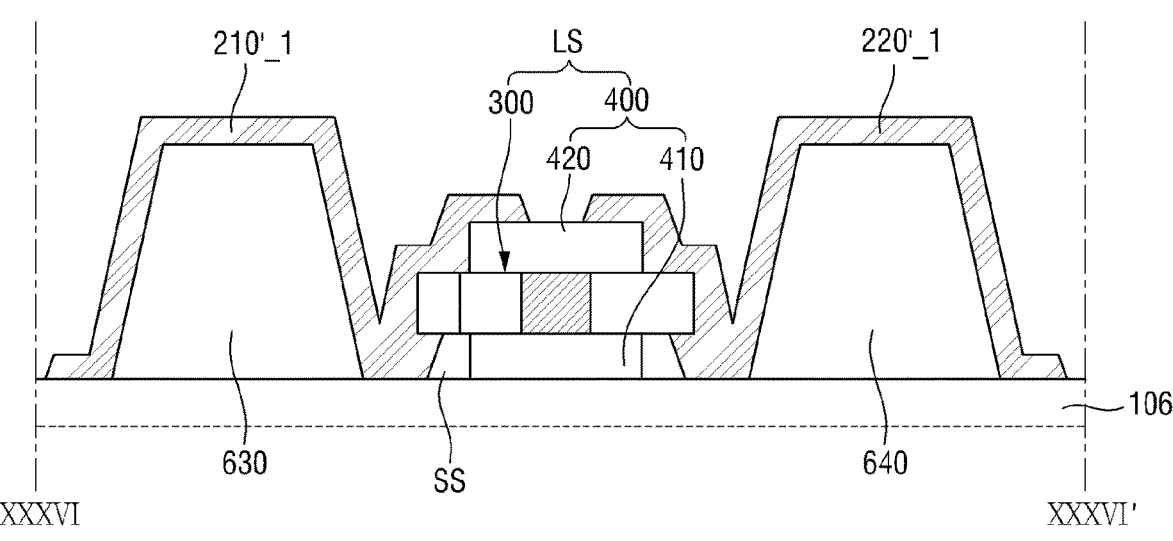
FIG. 38 is a schematic cross-sectional view illustrating still another example taken along line XXXVI-XXXVI' of FIG. 35.

FIG. 37 is a schematic cross-sectional view illustrating another example taken along line XXXVI-XXXVI' of FIG. 35. FIG. 38 is a schematic cross-sectional view illustrating still another example taken along line XXXVI-XXXVI' of FIG. 35. The embodiment of FIGS. 37 and 38 is different from the embodiment of FIG. 36 in that first and second partition walls 630 and 640 are further included on a side and another side of an element part LS, respectively.

Referring to FIG. 37, a cross-sectional structure of the first and second partition walls 630 and 640 and the cross-sectional structure of the above-described reflective partition wall 600 shown in FIG. 17 may have substantially the same cross-sectional structure. Although not shown in the drawing, the first partition wall 630 and the second partition wall 640 may be disposed adjacent to a center portion of each sub-pixel SPX in a plan view. The first partition wall 630 and the second partition wall 640 may be disposed to overlap the above-described first and second electrode 210' and 220', respectively, in a plan view. The first partition wall 630 and the second partition wall 640 are disposed to be spaced apart from each other and face each other in the first direction DR1. The first partition wall 630 and the second partition wall 640 may include polyimide (PI), but the disclosure is not limited thereto.

The electrodes 210' and 220' may be disposed on the planarization layer 106 and the first and second partition walls 630 and 640. Partial areas of the electrodes 210' and 220' may be disposed on the first and second partition walls 630 and 640, other partial areas thereof may be disposed on the planarization layer 106, and still other partial areas thereof may be disposed to surround at least a portion of an end portion of the unit light-emitting element 300.

The first and second partition walls 630 and 640 may be disposed on the planarization layer 106. The first and second partition walls 630 and 640 may have a protruding structure in each sub-pixel SPX. Since the first and second partition walls 630 and 640 have a protruding structure in each sub-pixel SPX, light emitted from the light-emitting element 300 toward a side surface of each of the first and second partition walls 630 and 640 may be allowed to travel in an upward direction with respect to the substrate SUB. That is, the first and second partition walls 630 and 640 may serve as reflective partition walls that reflect the light emitted from the light-emitting element 300.

Referring to FIG. 38, a difference from FIG. 37 is that a first electrode 210'_1 and a second electrode 220'_1 are also disposed on the binder 400 of the element part LS. Specifically, the first electrode 210' 1 and the second electrode 220'_1 may also be partially disposed on the second area 420 of the binder disposed on the unit light-emitting element 300. However, even in this case, the first electrode 210' 1 and the second electrode 220'_1 disposed on the second area 420 of the binder may be disposed to be spaced apart from each other. Accordingly, the first electrode 210'_1 and the second electrode 220'_1 may be insulated from each other.

Figure 39:
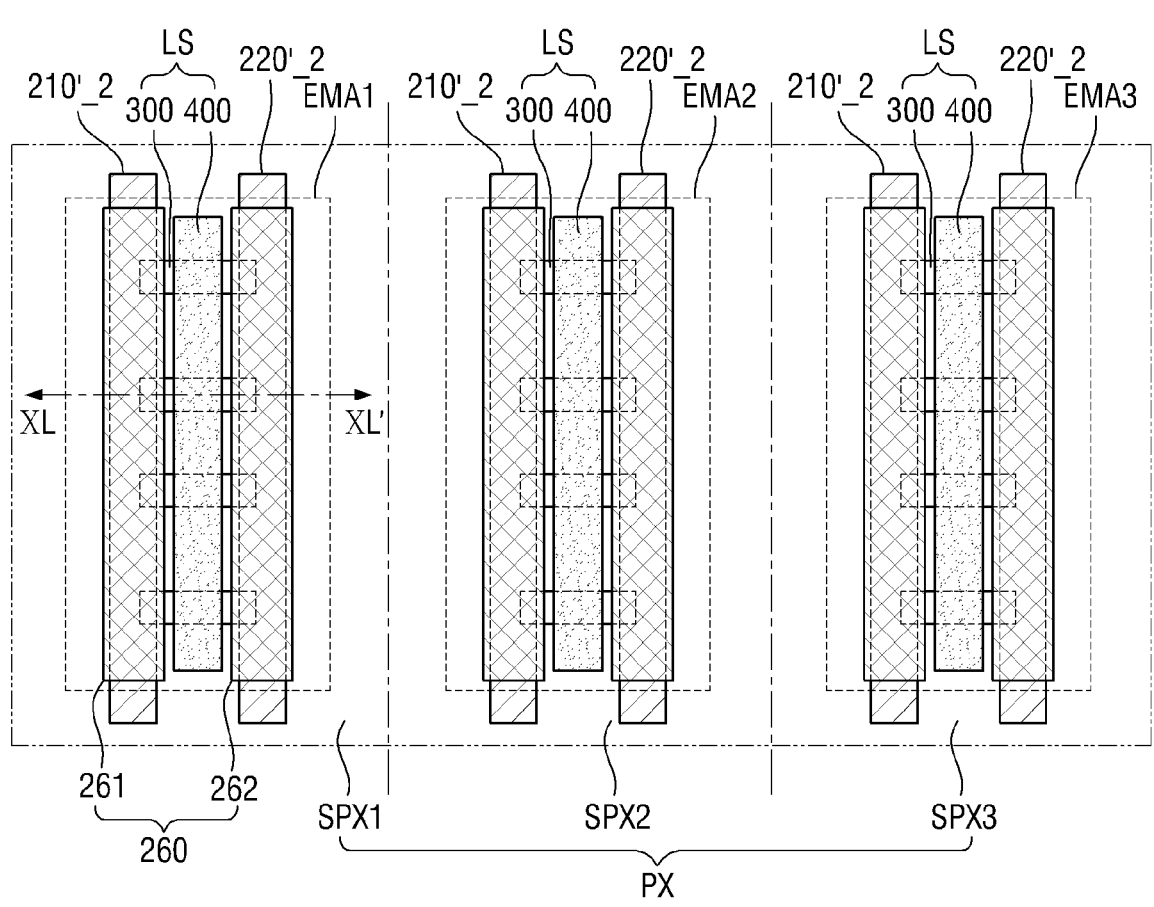
FIG. 39 is a schematic plan view illustrating a pixel of a display device according to yet another embodiment.
Figure 39:
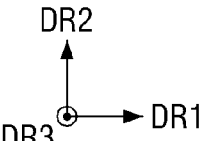
Figure 40:
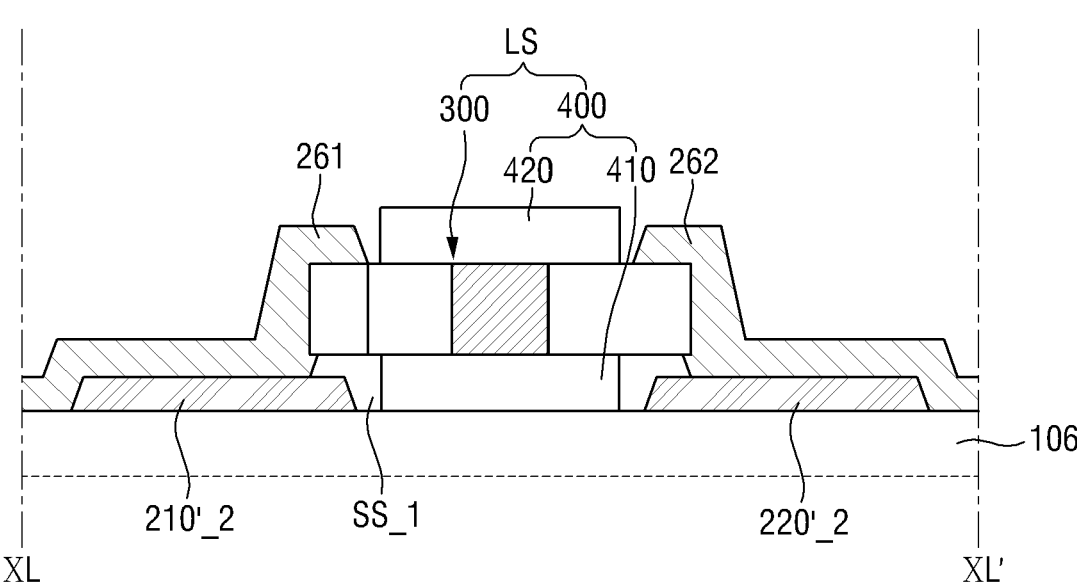
FIG. 40 is a schematic cross-sectional view illustrating an example taken along line XL-XL' of FIG. 39.

FIG. 39 is a schematic plan view illustrating a pixel of a display device according to yet another embodiment. FIG. 40 is a schematic cross-sectional view illustrating an example taken along line XL-XL' of FIG. 39. Referring to FIGS. 39 and 40, the display device according to the embodiment is different from that of the embodiment of FIG. 35 in that contact electrodes respectively disposed on a first electrode and a second electrode are further included.

Referring to FIGS. 39 and 40, a first electrode 210' 2 and a second electrode 220' 2 may be disposed on a planarization layer 106. In the embodiment, each of the first electrode 210' 2 and the second electrode 220'_2 may be formed such that an upper surface and a lower surface thereof are substantially parallel to each other. Each of the first electrode 210' 2 and the second electrode 220'_2 formed on the planarization layer 106 may be disposed to be spaced apart from a unit light-emitting element 300.

Contact electrodes 260 may be disposed on the first electrode 210' 2 and the second electrode 220' 2. The contact electrodes 260 may include a first contact electrode 261 and a second contact electrode 262. The first contact electrode 261 and the second contact electrode 262 may each have a shape extending in the second direction DR2 in a plan view, and may be disposed to be spaced apart from each other in the first direction DR1.

In a plan view, the first contact electrode 261 may be disposed on the first electrode 210' 2, and the second contact electrode 262 may be disposed on the second electrode 220' 2. The first contact electrode 261 and the second contact electrode 262 may be disposed to overlap the first electrode 210' 2 and the second electrode 220'_2, respectively, in the thickness direction.

The first contact electrode 261 may be disposed on the first electrode 210'_2 and may extend toward the unit light-emitting element 300 to contact an end portion area of the unit light-emitting element 300. The second contact electrode 262 may be disposed on the second electrode 220' 2 and extend toward the unit light-emitting element 300 to contact another end portion area of the unit light-emitting element 300. Accordingly, the unit light-emitting element 300 may be electrically connected to the first electrode 210'_2 through the first contact electrode 261, and may be electrically connected to the second electrode 220'_2 through the second contact electrode 262.

In the display device according to the embodiment, the electrodes 210' 2 and 220' 2 are first formed and the element part LS is disposed, and thus, even in case that the electrodes 210' 2 and 220'_2 are spaced apart from the unit light-emitting element 300 of the element part LS, the electrodes 210'_2 and 220'_2 may be electrically connected to the unit light-emitting element 300 by disposing the contact electrodes 261 and 262 on the electrodes 210' 2 and 220' 2.

In the case of the embodiment, the unit light-emitting element 300 is formed on a first area 410 of a binder to protrude to the outside of an upper surface of the first area 410 of the binder. Accordingly, in a process of forming the first and second contact electrodes 261 and 262 on an end portion and another end portion of the unit light-emitting element 300, respectively, a separation space SS_1 in which the first and second contact electrodes 261 and 262 and the electrodes 210'_2 and 220'_2 are not disposed may be formed between a lower portion of the unit light-emitting element 300 protruding to the outside of the first area 410 of the binder and the planarization layer 106.

Figure 41:
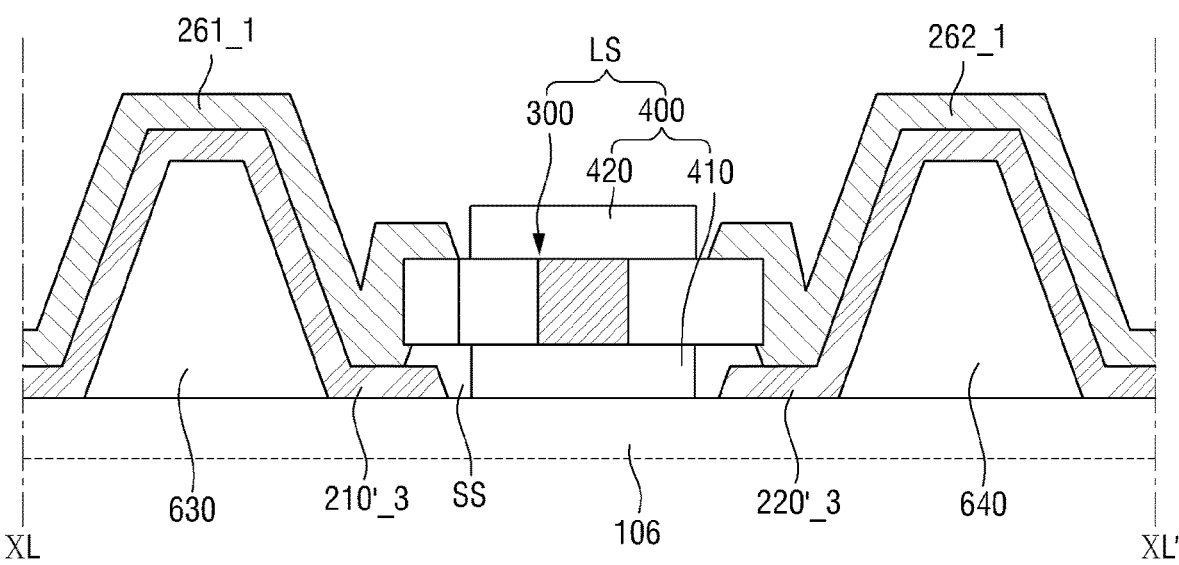
FIG. 41 is a schematic cross-sectional view illustrating another example taken along line XL-XL' of FIG. 39.

FIG. 41 is a schematic cross-sectional view illustrating another example taken along line XL-XL' of FIG. 39. Referring to FIG. 41, a difference from the embodiment of FIG. 40 is that first and second partition walls 630 and 640 are further included on a side and another side of an element part LS, respectively.

Referring to FIG. 41, a first electrode 210'_3 may be disposed on the first partition wall 630, and a second electrode 220'_3 may be disposed on the second partition wall 640. The first electrode 210'_3 and the second electrode 220'_3 disposed on the first partition wall 630 and the second partition wall 640 may entirely cover upper surfaces and side surfaces of the first partition wall 630 and the second partition wall 640, respectively, and may extend outward to cover at least a portion of a planarization layer 106.

A first contact electrode 261_1 may be disposed on the first electrode 210'_3 disposed on the first partition wall 630, and a second contact electrode 262_1 may be disposed on the second electrode 220'_3 disposed on the second partition wall 640. The first contact electrode 261_1 and the second contact electrode 262_1 may extend toward the unit light-emitting element 300, and may contact an end portion and another end portion of the unit light-emitting element 300, respectively. Accordingly, the unit light-emitting element 300 may be electrically connected to the first electrode 210'_3 and the second electrode 220'_3.

Figure 42:
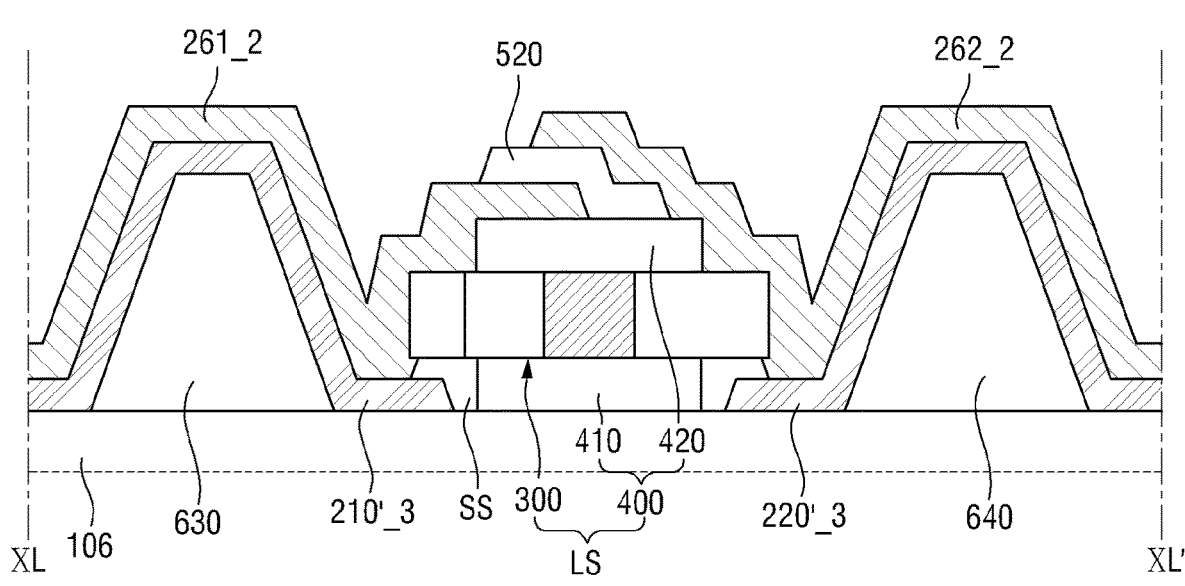
FIG. 42 is a schematic cross-sectional view illustrating still another example taken along line XL-XL' of FIG. 39.

FIG. 42 is a schematic cross-sectional view illustrating still another example taken along line XL-XL' of FIG. 39. Referring to FIG. 42, the display device according to the embodiment is different from that of the embodiment of FIG. 41 in that a second insulating layer is further disposed on a second area of the binder disposed above the unit light-emitting element.

Referring to FIG. 42, a first contact electrode 261_2 disposed on the first electrode 210'_3 disposed on the first partition wall 630 may completely cover an end portion of the unit light-emitting element 300 and extend to be disposed on a second area 420 of the binder that is located on an upper surface of the unit light-emitting element 300. The first contact electrode 261_2 may be disposed on the second area 420 of the binder to expose at least a portion of the second area 420 of the binder.

A second insulating layer 520 may be further disposed on the second area 420 of the binder. The second insulating layer 520 may be disposed to cover at least a portion of the first contact electrode 261_2 disposed on the second area 420 of the binder. The second insulating layer 520 may include an inorganic insulating material or an organic insulating material. For example, the second insulating layer 520 may include an inorganic insulating material such as silicon oxide (SiOx), silicon nitride (SiNx), silicon oxynitride (SiOxNy), aluminum oxide (Al$_2$O$_3$), aluminum nitride (AlN), or the like. As another example, the second insulating layer 520 may include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited thereto.

A second contact electrode 262_2 disposed on the second electrode 220'_3 disposed on the second partition wall 630 may completely cover an end portion of the unit light-emitting element 300 and extend to be disposed on the second area 420 of the binder, which is located on an upper surface of the unit light-emitting element 300, and the second insulating layer 520. In the embodiment, the second insulating layer 520 may be disposed between the first contact electrode 261_2 and the second contact electrode 262_2 to be insulated from each other.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first electrode on a substrate in a first direction corresponding to a thickness direction;
   a second electrode spaced apart from the first electrode in the first direction, the first electrode below the second electrode in the thickness direction; and
   an element part disposed between the first electrode and the second electrode,
   wherein the element part includes:
   a plurality of light-emitting elements each having a shape extending in one direction and spaced apart from each other in a second direction perpendicular to the first direction; and
   a binder surrounding each of the plurality of light-emitting elements and fixing the plurality of light-emitting elements, the binder spaced apart from the first electrode by an insulating layer in the thickness direction, the binder extending between and directly contacting adjacent ones of the plurality of light-emitting elements in a plan view,
   wherein the one direction in which each of the plurality of light-emitting elements extends is parallel to the first direction,
   wherein each of the plurality of light-emitting elements includes a first semiconductor layer, a second semiconductor layer, and an active layer disposed between the first semiconductor layer and the second semiconductor layer, and
   wherein the binder partially overlaps the first semiconductor layer and the second semiconductor layer in a direction perpendicular to the thickness direction.

2. The display device of claim 1, wherein the binder exposes at least one end portion of end portions of each of the plurality of light-emitting elements.

3. The display device of claim 1, wherein
   a first end portion of each of the plurality of light-emitting elements is electrically connected to the first electrode, and
   a second end portion of each of the plurality of light-emitting elements opposite to the first end portion is electrically connected to the second electrode.

4. The display device of claim 3, wherein
   in each of the plurality of light-emitting elements, the first semiconductor layer, the active layer, and the second semiconductor layer are sequentially disposed in the first direction.

5. The display device of claim 4, wherein, in each of the plurality of light-emitting elements, light generated in the active layer is emitted from the first end portion and the second end portion.

6. The display device of claim 4, wherein the binder partially surrounds an outer surface of each of the plurality of light-emitting elements, and entirely surrounds an outer surface of the active layer.

7. The display device of claim 1, wherein separation distances between the plurality of light-emitting elements in the second direction are equal to each other.

8. The display device of claim 1, wherein the first electrode extends in the second direction.

9. A display device comprising:

a first electrode on a substrate in a thickness direction and extending in a first direction perpendicular to the thickness direction;

an element part disposed on the first electrode and extending in the first direction;

a first insulating layer disposed on the first electrode and the element part; and a second electrode disposed on the first insulating layer and facing the first electrode in a second direction corresponding to the thickness direction, wherein the element part includes a plurality of light-emitting elements each having a shape extending in the second direction and disposed on the first electrode and a binder fixing the plurality of light-emitting elements, the binder spaced apart from the first electrode by the first insulating layer in the thickness direction, the binder extending between and directly contacting adjacent ones of the plurality of light-emitting elements in a plan view, wherein each of the plurality of light-emitting elements includes a first semiconductor layer, a second semiconductor layer, and an active layer disposed between the first semiconductor layer and the second semiconductor layer, and wherein the binder partially overlaps the first semiconductor layer and the second semiconductor layer in a direction perpendicular to the thickness direction.

10. The display device of claim 9, wherein the plurality of light-emitting elements are spaced apart from each other in the first direction, and separation distances between the plurality of light-emitting elements in the first direction are equal to each other.

11. The display device of claim 9, wherein the binder exposes at least one end portion of end portions of each of the plurality of light-emitting elements.

12. The display device of claim 11, wherein the first insulating layer contacts the binder and a partial area of each of the plurality of light-emitting elements exposed by the binder.

13. The display device of claim 11, wherein the binder further includes a wavelength conversion material.

14. The display device of claim 9, wherein a first end portion of each of the plurality of light-emitting elements directly contacts the first electrode, and a second end portion of the plurality of light-emitting elements opposite to the first end portion directly contacts the second electrode.

15. The display device of claim 9, wherein the first electrode includes:

a first electrode base layer; and a first electrode upper layer disposed on the first electrode base layer, and the first electrode base layer reflects light emitted from each of the plurality of light-emitting elements.

16. A display device comprising:

a first electrode disposed on a substrate;

a second electrode disposed on the substrate and spaced apart from the first electrode in a first direction; and an element part disposed on the substrate between the first electrode and the second electrode, wherein the element part includes:

a plurality of light-emitting elements each having a shape extending in the first direction and disposed on the substrate, each of the plurality of light-emitting elements comprising a semiconductor layer having a portion overlapping the second electrode in a second direction perpendicular to the first direction; and a binder surrounding each of the plurality of light-emitting elements and fixing the plurality of light-emitting elements, the binder extending between and directly contacting adjacent ones of the plurality of light-emitting elements in a plan view, wherein the binder includes:

a first area disposed on a first side in which the substrate is disposed and not overlapping in the second direction the portion of the semiconductor layer; and a second area disposed on a second side opposite the first side, and wherein the first area of the binder is spaced from the first electrode and second electrode in the first direction.

17. The display device of claim 16, wherein the plurality of light-emitting elements protrude to the first area of the binder.

18. The display device of claim 16, wherein a first end portion of each of the plurality of light-emitting elements is electrically connected to the first electrode, and a second end portion opposite to the first end portion is electrically connected to the second electrode.

19. The display device of claim 18, further comprising:

a first contact electrode disposed on the first electrode; and a second contact electrode disposed on the second electrode, wherein the second area of the binder exposing end portions of the light-emitting elements, the first contact electrode contacts the first end portion, and the second contact electrode contacts the second end portion.

* * * * *